(12) United States Patent  (10) Patent No.: US 9,267,003 B2
Yoshida et al.  (45) Date of Patent: Feb. 23, 2016

(54) POLYMER COMPOUND, COMPOSITION, AND LIGHT-EMITTING DEVICE USING THE SAME

(71) Applicant: Sumitomo Chemical Company, Limited, Tokyo (JP)

(72) Inventors: Tomoyasu Yoshida, Ibaraki (JP); Youichi Inada, Ibaraki (JP); Daisuke Fukushima, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 14/374,546

(22) PCT Filed: Jan. 18, 2013

(86) PCT No.: PCT/JP2013/050942
§ 371 (c)(1),
(2) Date: Jul. 25, 2014

(87) PCT Pub. No.: WO2013/114976
PCT Pub. Date: Aug. 8, 2013

(65) Prior Publication Data
US 2014/0367617 A1  Dec. 18, 2014

(30) Foreign Application Priority Data
Jan. 30, 2012  (JP) .................................. 2012-016241

(51) Int. Cl.
*C08G 73/00* (2006.01)
*C08G 73/02* (2006.01)
(Continued)

(52) U.S. Cl.
CPC .............. *C08G 73/026* (2013.01); *C08G 61/12* (2013.01); *C08L 79/02* (2013.01);
(Continued)

(58) Field of Classification Search
CPC ................... C08G 2261/3162; C08G 2261/76; C08G 2261/95; C08L 79/02; H01L 51/0039
USPC ......................................................... 528/422
See application file for complete search history.

(56) References Cited

U.S. PATENT DOCUMENTS 8,581,241 B2  11/2013  Iida et al.
2008/0061685 A1  3/2008  Chesterfield
(Continued)

FOREIGN PATENT DOCUMENTS

JP  2008-098615 A  4/2008
JP  2008-169367 A  7/2008
(Continued)

OTHER PUBLICATIONS

Int'l Search Report issued Apr. 16, 2013 in Int'l Application No. PCT/JP2013/050942.

*Primary Examiner* — Shane Fang
(74) *Attorney, Agent, or Firm* — Panitch Schwarze Belisario & Nadel LLP

(57) ABSTRACT

Provided are a useful polymer compound excellent in hole transportability, and a composition, an organic film, an insolubilized organic film, a light-emitting device, a planar light source, and a display device including the polymer compound. The polymer compound comprises a constitutional unit represented by Formula (1) in an amount of 51% by mol or more with respect to the total amount of all constitutional units and at least one of a constitutional unit represented by Formula (2) and a constitutional unit represented by Formula (3):

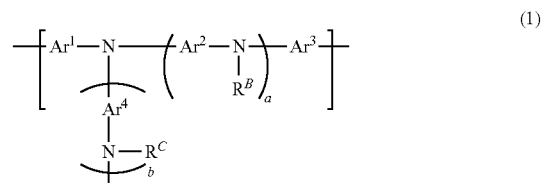

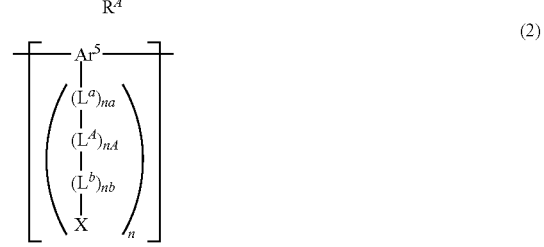

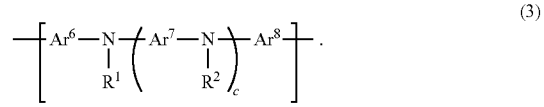

17 Claims, 3 Drawing Sheets

(51) Int. Cl.
*C08G 61/12* (2006.01)
*H01L 51/00* (2006.01)
*C08L 79/02* (2006.01)
*H01L 51/50* (2006.01)

(52) U.S. Cl.
CPC ....... *H01L 51/0035* (2013.01); *H01L 51/0039* (2013.01); *H01L 51/0043* (2013.01); *C08G 2261/124* (2013.01); *C08G 2261/135* (2013.01); *C08G 2261/148* (2013.01); *C08G 2261/1412* (2013.01); *C08G 2261/1414* (2013.01); *C08G 2261/3142* (2013.01); *C08G 2261/3162* (2013.01); *C08G 2261/411* (2013.01); *C08G 2261/512* (2013.01); *C08G 2261/76* (2013.01); *C08G 2261/95* (2013.01); *H01L 51/5056* (2013.01)

(56) References Cited

U.S. PATENT DOCUMENTS

| | | |
|---|---|---|
| 2008/0097076 A1 | 4/2008 | Radu et al. |
| 2011/0114926 A1 | 5/2011 | Okabe et al. |
| 2012/0256537 A1 | 10/2012 | Nakatani et al. |

FOREIGN PATENT DOCUMENTS

| | | |
|---|---|---|
| JP | 2009-043896 A | 2/2009 |
| JP | 2009-074074 A | 4/2009 |
| JP | 2010-239125 A | 10/2010 |
| JP | 2011-052229 A | 3/2011 |
| WO | 2005053056 A1 | 6/2005 |
| WO | 2009067419 A1 | 5/2009 |
| WO | 2010018851 A1 | 2/2010 |
| WO | 2010065700 A2 | 6/2010 |
| WO | 2011078387 A1 | 6/2011 |

POLYMER COMPOUND, COMPOSITION, AND LIGHT-EMITTING DEVICE USING THE SAME

CROSS-REFERENCE TO RELATED APPLICATION

This application is a Section 371 of International Application No. PCT/JP2013/050942, filed Jan. 18, 2013, which was published in the Japanese language on Aug. 8, 2013, under International Publication No. WO 2013/114976 A1, and the disclosure of which is incorporated herein by reference.

TECHNICAL FIELD

The present invention relates to a polymer compound, a composition, and a light-emitting device using the same.

BACKGROUND ART

Various materials for use in the manufacture of organic electroluminescent devices (hereinafter may be referred to as "light-emitting devices") have been recently studied. Among such materials, a polymer compound comprising an aromatic amine residue as a constitutional unit is known as a material for use in the manufacture of stacked type light-emitting devices (Patent Documents 1 and 2).

RELATED ART DOCUMENTS

Patent Document

Patent Document 1: WO 2005/053056
Patent Document 2: JP 2011-052229 A

DISCLOSURE OF INVENTION

Problem to be Solved by the Invention

However, the light-emitting devices manufactured using the polymer compounds disclosed in the above patent document may be insufficient in hole transportability.

An object of the present invention is to provide a polymer compound useful for the manufacture of a light-emitting device that is excellent in hole transportability. Also, an object of the present invention is to provide a composition, an organic film, an insolubilized organic film, a light-emitting device, a planar light source, and a display device comprising the polymer compound. Further, an object of the present invention is to provide a raw material compound of the polymer compound and a method for manufacturing the polymer compound.

Means for Solving Problem

The present invention provides the following polymer compound, the composition comprising the polymer compound, the organic film, the insolubilized organic film, the light-emitting device, the planar light source, and the display device. The present invention also provides the following raw material compound of the polymer compound and the method for manufacturing the polymer compound.

[1] A polymer compound comprising:
a constitutional unit represented by Formula (1) in an amount of 51% by mol or more with respect to the total amount of all constitutional units; and
at least one of a constitutional unit represented by Formula (2) and a constitutional unit represented by Formula (3):

[Chemical Formula 1]

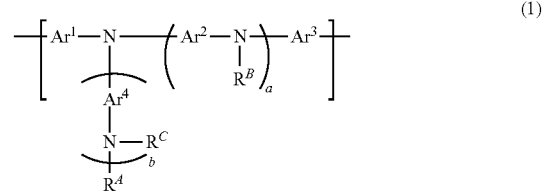

(1)

wherein in Formula (1),
a represents an integer of from 1 to 3, b represents 0 or 1,
$Ar^1$ and $Ar^3$ each independently represent an arylene group optionally having a substituent or a divalent heterocyclic group optionally having a substituent; $Ar^2$ and $Ar^4$ each independently represent an arylene group optionally having a substituent, a divalent heterocyclic group optionally having a substituent, or a divalent group made by linking two or more groups that are selected from the group consisting of an arylene group optionally having a substituent and a divalent heterocyclic group optionally having a substituent and may be the same as or different from each other; each of $Ar^1$, $Ar^2$, $Ar^3$, and $Ar^4$ may be linked to another group bonding to a nitrogen atom to which the each group is bonded, thereby forming a ring structure; when $Ar^2$ is plurally present, they may be the same as or different from each other, and
$R^A$, $R^B$, and $R^C$ each independently represent a hydrogen atom, an alkyl group optionally having a substituent, an aryl group optionally having a substituent, or a monovalent heterocyclic group optionally having a substituent; when $R^B$ is plurally present, they may be the same as or different from each other,

[Chemical Formula 2]

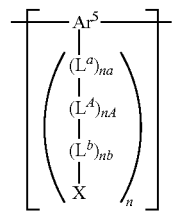

(2)

wherein in Formula (2),
na represents an integer of from 0 to 3, nb represents an integer of from 0 to 12, nA represents 0 or 1, n represents an integer of from 0 to 4,
$Ar^5$ represents a (2+n)-valent aromatic hydrocarbon group optionally having a substituent or a (2+n)-valent heterocyclic group optionally having a substituent,
$L^a$ and $L^b$ each independently represent an alkylene group, or a phenylene group optionally having a substituent; when $L^a$ is plurally present, they may be the same as or different from each other, when $L^b$ is plurally present, they may be the same as or different from each other,
$L^A$ represents an oxygen atom or a sulfur atom; when $L^A$ is plurally present, they may be the same as or different from each other, and
X represents a monovalent crosslinking group; when X is plurally present, they may be the same as or different from each other,

[Chemical Formula 3]

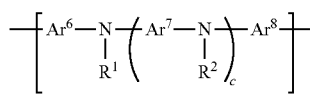

(3)

wherein in Formula (3), c represents 0 or 1, $Ar^6$ and $Ar^8$ each independently represent an arylene group optionally having a substituent or a divalent heterocyclic group optionally having a substituent, $Ar^7$ represents an arylene group optionally having a substituent, a divalent heterocyclic group optionally having a substituent, or a divalent group made by linking two or more groups that are selected from the group consisting of an arylene group optionally having a substituent and a divalent heterocyclic group optionally having a substituent and may be the same as or different from each other, $R^1$ represents a monovalent crosslinking group, and $R^2$ represents a monovalent crosslinking group, an alkyl group optionally having a substituent, an aryl group optionally having a substituent, or a monovalent heterocyclic group optionally having a substituent.

[2] The polymer compound according to above [1], wherein the constitutional unit represented by Formula (2) is a constitutional unit represented by Formula (4):

[Chemical Formula 4]

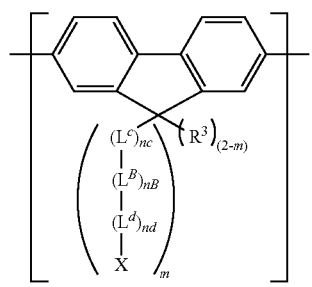

(4)

wherein in Formula (4), nc represents an integer of from 0 to 3, nd represents an integer of from 0 to 12, nB represents 0 or 1, m represents an integer of from 0 to 2, $L^c$ and $L^d$ each independently represent an alkylene group optionally having a substituent, or a phenylene group optionally having a substituent; when $L^c$ is plurally present, they may be the same as or different from each other; when $L^d$ is plurally present, they may be the same as or different from each other, $L^B$ represents an oxygen atom or a sulfur atom; when $L^B$ is plurally present, they may be the same as or different from each other, X represent a monovalent crosslinking group; when X is plurally present, they may be the same as or different from each other, and $R^3$ represents a hydrogen atom, an alkyl group optionally having a substituent, an alkoxy group optionally having a substituent, an aryl group optionally having a substituent, an aryloxy group optionally having a substituent, a monovalent heterocyclic group optionally having a substituent, or a monovalent heterocyclic oxy group; when $R^3$ is plurally present, they may be the same as or different from each other.

[3] The polymer compound according to above [1] or [2], wherein X is a monovalent crosslinking group optionally having a substituent represented by Formula (X-1).

[Chemical Formula 5]

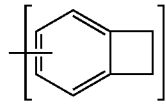

(X-1)

[4] The polymer compound according to above [1] or [2], wherein X is a monovalent crosslinking group represented by Formula (X-2):

[Chemical Formula 6]

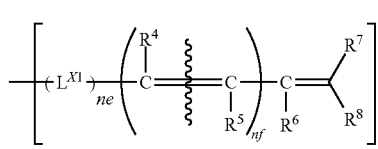

(X-2)

wherein in Formula (X-2), ne and of each independently represent 0 or 1, $L^{X1}$ represents an oxygen atom, a sulfur atom, a carbonyl group, or a group represented by —O—CO—, and $R^4$, $R^5$, $R^6$, $R^7$, and $R^8$ each independently represent a hydrogen atom, an alkyl group optionally having a substituent, an alkoxy group optionally having a substituent, an alkylthio group optionally having a substituent, an aryl group optionally having a substituent, an aryloxy group optionally having a substituent, an arylthio group optionally having a substituent, an monovalent heterocyclic group optionally having a substituent, an amino group optionally having a substituent, a silyl group optionally having a substituent, an acyl group optionally having a substituent, an acyloxy group optionally having a substituent, a halogen atom, a cyano group, or a nitro group.

[5] The polymer compound according to above [1] or [2], wherein when X is plurally present, they comprise at least one type of a monovalent crosslinking group represented by Formula (X-1) and at least one type of the monovalent crosslinking group represented by Formula (X-2):

[Chemical Formula 7]

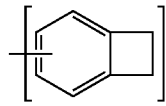

(X-1)

[Chemical Formula 8]

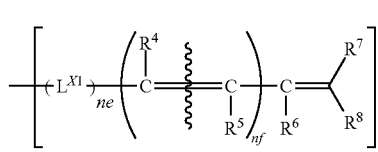

(X-2)

wherein in Formula (X-2), ne and of each independently represent 0 or 1, $L^{X1}$ represents an oxygen atom, a sulfur atom, a carbonyl group, or a group represented by —O—CO—, and $R^4$, $R^5$, $R^6$, $R^7$, and $R^8$ each independently represent a hydrogen atom, an alkyl group optionally having a substituent, an alkoxy group optionally having a substituent, an alkylthio group optionally having a substituent, an aryl group optionally having a substituent, an aryloxy group optionally having a substituent, an arylthio group optionally having a substituent, an monovalent heterocyclic group optionally having a substituent, an amino group optionally having a substituent, a silyl group optionally having a substituent, an acyl group optionally having a substituent, an acyloxy group optionally having a substituent, a halogen atom, a cyano group, or a nitro group.

[6] The polymer compound according to any one of above [1] to [5], wherein $Ar^2$ represents a 2,7-fluorenediyl group optionally having a substituent, a naphthalenediyl group optionally having a substituent, a phenanthrenediyl group optionally having a substituent, a dihydrophenanthrenediyl group optionally having a substituent, an anthracenediyl group optionally having a substituent, a pyrenediyl group optionally having a substituent, or a perylenediyl group optionally having a substituent.

[7] A method for producing the polymer compound according to any one of above [1] to [6], the method comprising:
performing a polymerization reaction of a monomer composition comprising a first monomer represented by Formula (5) and a second monomer represented by Formula (6), thereby obtaining the polymer compound:

[Chemical Formula 9]

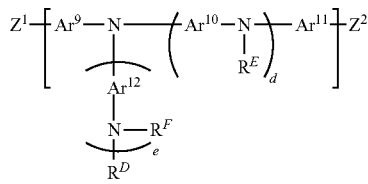

(5)

wherein in Formula (5),
d represents an integer of 1 to 3, e represents 0 or 1,
$Ar^9$ and $Ar^{11}$ each independently represent an arylene group optionally having a substituent or a divalent heterocyclic group optionally having a substituent, $Ar^{10}$ and $Ar^{12}$ each independently represent an arylene group optionally having a substituent, a divalent heterocyclic group optionally having a substituent, or a divalent group made by linking two or more groups that are selected from the group consisting of arylene groups optionally having a substituent and divalent heterocyclic groups optionally having a substituent and may be the same as or different from each other; each of $Ar^9$, $Ar^{10}$, $Ar^{11}$, and $Ar^{12}$ may be linked to another group bonding to a nitrogen atom to which the each group is bonded, thereby forming a ring structure; when $Ar^{10}$ is plurally present, they may be the same as or different from each other,
$R^D$, $R^E$, and $R^F$ each independently represent a hydrogen atom, an alkyl group optionally having a substituent, an aryl group optionally having a substituent, or a monovalent heterocyclic group optionally having a substituent; when $R^E$ is a plurally present, they may be the same as or different from each other, and
$Z^1$ and $Z^2$ each independently represent a group selected from a substituent group A:
<Substituent Group A>
a group represented by —B(OR$^{101}$)$_2$ wherein $R^{101}$ represents a hydrogen atom or an alkyl group optionally having a substituent, $R^{101}$ may form a ring by bonding to each other together with an oxygen atom bonded to $R^{101}$, and a plurality of $R^{101}$ may be the same as or different from each other,
a group represented by —BF$_4$Q$^1$ wherein Q$^1$ represents a monovalent cation selected from the group consisting of Li$^+$, Na$^+$, K$^+$, Rb$^+$, and Cs$^+$,
a group represented by —MgY$^1$ wherein $Y^1$ represents a chlorine atom, a bromine atom, or an iodine atom,
a group represented by —ZnY$^2$ wherein $Y^2$ represents a chlorine atom, a bromine atom, or an iodine atom, and
a group represented by —Sn(R$^{102}$)$_3$ wherein $R^{102}$ represents a hydrogen atom or an alkyl group, $R^{102}$ may form a ring by bonding to each other together with a tin atom bonded to $R^{102}$, a plurality of $R^{102}$ may be the same as or different from each other,

[Chemical Formula 10]

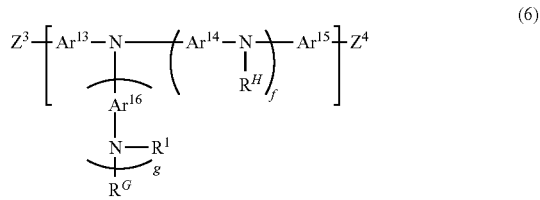

(6)

wherein in Formula (6)
f represents an integer of from 0 to 3, g represents 0 or 1,
$Ar^{13}$ and $Ar^{15}$ each independently represent an arylene group optionally having a substituent or a divalent heterocyclic group optionally having a substituent, $Ar^{14}$ and $Ar^{16}$ each independently represent an arylene group optionally having a substituent, a divalent heterocyclic group optionally having a substituent, or
a divalent group made by linking two or more groups that are selected from the group consisting of arylene groups optionally having a substituent and divalent heterocyclic groups optionally having a substituent and may be the same as or different from each other; each of $Ar^{13}$, $Ar^{14}$, $Ar^{15}$, and $Ar^{16}$ may be linked to another group bonding to a nitrogen atom to which the each group is bonded, thereby forming a ring structure; when $Ar^{14}$ is plurally present, they may be the same as or different from each other,
$R^G$, $R^H$, and $R^I$ each independently represent a hydrogen atom, an alkyl group optionally having a substituent, an aryl group optionally having a substituent, or an monovalent heterocyclic group optionally having a substituent; when $R^H$ is a plurally present, they may be the same as or different from each other, and
$Z^3$ and $Z^4$ each independently represent a group selected from a substituent group B:
<Substituent Group B>
a chlorine atom, a bromine atom, an iodine atom, and a group represented by —O—S(=O)$_2$R$^{103}$ wherein $R^{103}$ represents an alkyl group optionally having a substituent or an aryl group optionally having a substituent.

[8] A composition comprising:
the polymer compound according to any one of above [1] to [6], and
at least one type of material selected from the group consisting of a hole transport material, an electron transport material and a light-emitting material.

[9] A composition comprising the polymer compound according to any one of above [1] to [6], and a solvent.

[10] The composition according to above [8], further comprising a solvent.
[11] An organic film comprising the polymer compound according to any one of above [1] to [6].
[12] An organic film comprising the composition according to above [8].
[13] An insolubilized organic film, wherein the organic film according to above [11] is insolubilized against an organic solvent.
[14] An insolubilized organic film, wherein the organic film according to above [12] is insolubilized against an organic solvent.
[15] A light-emitting device comprising the organic film according to above [11] or [12].
[16] A light-emitting device comprising the insolubilized organic film according to above [13] or [14].
[17] A planar light source comprising the light-emitting device according to above [15] or [16].
[18] A display device comprising the light-emitting device according to above [15] or [16].

Effect of the Invention

The present invention can provide a polymer compound useful for the manufacture of a light-emitting device that is excellent in hole transportability. A preferred embodiment of the present invention can provide a polymer compound useful for the manufacture of a light-emitting device that is excellent also in durability (e.g., brightness life). The present invention can also provide a composition, an organic film, an insolubilized organic film, a light-emitting device, a planar light source, and a display device comprising the polymer compound. The present invention can further provide a raw material compound of the polymer compound and a method for manufacturing the polymer compound.

DESCRIPTION OF EMBODIMENTS

Figure 1:
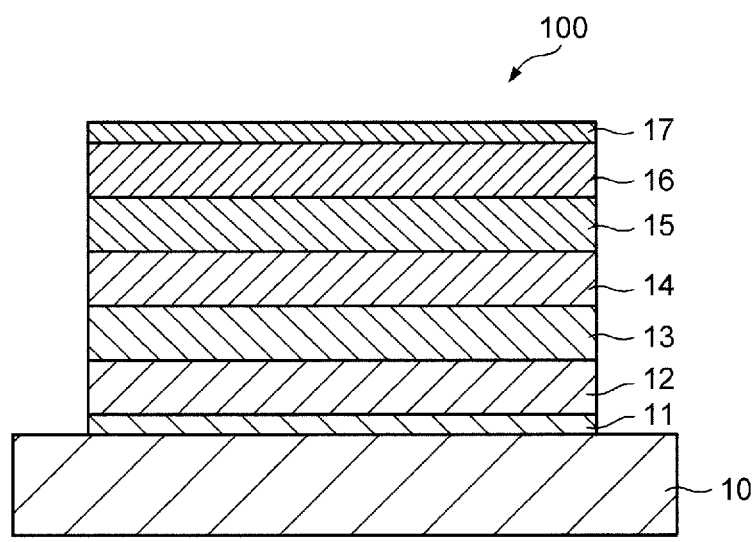
FIG. 1 is a schematic sectional view illustrating a light-emitting device according to a first embodiment of the present invention.

The following describes terms used in the present specification with reference to examples as needed.

In the present specification, "Me" represents a methyl group; "Et" represents an ethyl group; "Ph" represents a phenyl group; and "t-Bu" and "tBu" represents a tert-butyl group.

The "constitutional unit" means one or more unit structures that are present in a polymer compound. The "constitutional unit" is preferably comprised in a polymer compound as a "repeating unit (two or more unit structures present in the polymer compound)."

The term "$C_{x-y}$" (x and y are positive integers satisfying x<y) means that the number of carbon atoms of a partial structure corresponding to a functional group name written immediately after this term is within the range of from x to y. In other words, when an organic group written immediately after "$C_{x-y}$" is an organic group (e.g., $C_{x-y}$ alkoxyphenyl group) named with a plurality of functional group names combined, it means that the number of carbon atoms of a partial structure corresponding to the functional group name (e.g. alkoxy) written immediately after "$C_{x-y}$" among the functional group names is within the range of from x to y. A "$C_{1-12}$ alkyl group" means an alkyl group whose number of carbon atoms is from 1 to 12, whereas a "$C_{1-12}$ alkoxyphenyl group" means a phenyl group having an "alkoxy group whose number of carbon atoms is from 1 to 12," for example.

In the present specification, the term "optionally having a substituent" means that a functional group written immediately after this term may have a substituent or may have no substituent. The term "alkyl group optionally having a substituent" means "an unsubstituted alkyl group or an alkyl group having a substituent," for example.

Examples of the "substituent" may include an alkyl group, an alkoxy group, an alkylthio group, an aryl group, an aryloxy group, an arylthio group, an alkenyl group, an alkynyl group, an amino group, a silyl group, a halogen atom, an acyl group, an acyloxy group, an oxycarbonyl group, a monovalent heterocyclic group, a heterocyclic oxy group, a heterocyclic thio group, an imine residue, an amido compound residue, an acid imido residue, a carboxy group, a hydroxy group, a nitro group, and a cyano group. These groups optionally further have any "substituent" selected from the above examples.

The "alkyl group" optionally has a substituent and is optionally any of a linear alkyl group, a branched alkyl group, and a cyclic alkyl group (cycloalkyl group). The number of carbon atoms of the linear alkyl group and the branched alkyl group is, preferably from 1 to 20, more preferably from 1 to 15, and further preferably from 1 to 12 without comprising the number of carbon atoms of the substituent unless otherwise specified. The number of carbon atoms of the branched alkyl group is particularly preferably from 3 to 12 without comprising the number of carbon atoms of the substituent unless otherwise specified.

The number of carbon atoms of the cyclic alkyl group is preferably from 3 to 20, more preferably from 3 to 15, and further preferably from 3 to 12 without comprising the number of carbon atoms of the substituent unless otherwise specified.

Examples of the alkyl group may include a methyl group, an ethyl group, a propyl group, an isopropyl group, a butyl group, an isobutyl group, a sec-butyl group, a tert-butyl group, a pentyl group, an isopentyl group, a hexyl group, a cyclohexyl group, a heptyl group, an octyl group, a 2-ethylhexyl group, a nonyl group, a decyl group, a 3,7-dimethyloctyl group, and a dodecyl group.

The "alkoxy group" optionally has a substituent and is optionally any of a linear alkoxy group, a branched alkoxy group, and a cyclic alkoxy group (cycloalkoxy group). The number of carbon atoms of the linear alkoxy group and the branched alkoxy group is preferably from 1 to 20, more preferably from 1 to 15, and further preferably from 1 to 12 without comprising the number of carbon atoms of the substituent unless otherwise specified. The number of carbon atoms of the cyclic alkoxy group is preferably from 3 to 20, more preferably from 3 to 15, and further preferably from 3 to 12 without comprising the number of carbon atoms of the substituent unless otherwise specified. The number of carbon atoms of the branched alkoxy group is particularly preferably from 3 to 12 without comprising the number of carbon atoms of the substituent unless otherwise specified.

Examples of the alkoxy group may include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, and a dodecyloxy group.

The "alkylthio group" optionally has a substituent and is optionally any of a linear alkylthio group, a branched alkylthio group, and a cyclic alkylthio group (cycloalkylthio group). The number of carbon atoms of the linear alkylthio group and the branched alkylthio group is preferably from 1 to 20, more preferably from 1 to 15, and further preferably from 1 to 12 without comprising the number of carbon atoms of the substituent unless otherwise specified. The number of carbon atoms of the cyclic alkylthio group is preferably from 3 to 20, more preferably from 3 to 15, and further preferably from 3 to 12 without comprising the number of carbon atoms of the substituent unless otherwise specified. The number of carbon atoms of the branched alkylthio group is particularly preferably from 3 to 12 without comprising the number of carbon atoms of the substituent unless otherwise specified.

Examples of the alkylthio group may include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, and a dodecylthio group.

The "aryl group" is an atomic group remaining after removing one hydrogen atom bonded to a carbon atom constituting an aromatic ring from an aromatic hydrocarbon. The aryl group optionally has a substituent and comprises groups having a benzene ring and groups having a condensed ring. The number of carbon atoms of the aryl group is preferably from 6 to 60, more preferably from 6 to 48, and further preferably from 6 to 30 without comprising the number of carbon atoms of the substituent unless otherwise specified. Examples of the aromatic hydrocarbon may include benzene, naphthalene, anthracene, phenanthrene, naphthalene, fluorene, pyrene, and perylene.

Examples of the aryl group may include a phenyl group, a 1-naphthyl group, 2-naphthyl group, a 1-anthracenyl group, a 2-anthracenyl group, a 9-anthracenyl group, and a 2-fluorenyl group.

The "aryloxy group" is a group represented by —O—$Ar^{21}$. $Ar^{21}$ represents the above aryl group. The aryl group represented by $Ar^{21}$ optionally has a substituent. The number of carbon atoms of the aryloxy group is preferably from 6 to 60, more preferably from 6 to 48, and further preferably from 6 to 30 without comprising the number of carbon atoms of the substituent unless otherwise specified.

Examples of the aryloxy group may include a phenoxy group, a 1-naphthyloxy group, a 2-naphthyloxy group, a 1-anthracenyloxy group, a 2-anthracenyloxy group, a 9-anthracenyloxy group, and 2-fluorenyloxy group.

The "arylthio group" is a group represented by —S—$Ar^{22}$. $Ar^{22}$ represents the above aryl group. The aryl group represented by $Ar^{22}$ optionally has a substituent. The number of carbon atoms of the arylthio group is preferably from 6 to 60, more preferably from 6 to 48, and further preferably from 6 to 30 without comprising the number of carbon atoms of the substituent unless otherwise specified.

Examples of the arylthio group may include a phenylthio group, a 1-naphthylthio group, a 2-naphthylthio group, a 1-anthracenylthio group, a 2-anthracenylthio group, a 9-anthracenylthio group, and 2-fluorenylthio group.

The "alkenyl group" optionally has a substituent and may be any of a linear alkenyl group, a branched alkenyl group, and a cyclic alkenyl group. The number of carbon atoms of the linear alkenyl group and the branched alkenyl group is preferably from 2 to 20, more preferably from 2 to 15, and further preferably from 2 to 10 without comprising the number of carbon atoms of the substituent unless otherwise specified. The number of carbon atoms of the cyclic alkenyl group is preferably from 3 to 20, more preferably from 3 to 15, and further preferably from 3 to 10 without comprising the number of carbon atoms of the substituent unless otherwise specified. The number of carbon atoms of the branched alkenyl group is particularly preferably from 3 to 10 without comprising the number of carbon atoms of the substituent unless otherwise specified.

Examples of the alkenyl group may include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group, and a 1-octenyl group.

The "alkynyl group" optionally has a substituent and is optionally any of a linear alkynyl group, a branched alkynyl group, and a cyclic alkynyl group. The number of carbon atoms of the linear alkynyl group and the branched alkynyl group is preferably from 2 to 20, more preferably from 2 to 15, and further preferably from 2 to 10 without comprising the number of carbon atoms of the substituent unless otherwise specified. The number of carbon atoms of the cyclic alkynyl group is preferably from 3 to 20, more preferably from 3 to 15, and further preferably from 3 to 10 without comprising the number of carbon atoms of the substituent unless otherwise specified. The number of carbon atoms of the branched alkynyl group is particularly preferably from 3 to 10 without comprising the number of carbon atoms of the substituent unless otherwise specified.

Examples of the alkynyl group may include an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group, and a 1-octynyl group.

The "amino group" optionally has a substituent and is preferably an unsubstituted amino group or an amino group substituted with one or two substituents selected from the group consisting of an alkyl group, an aryl group, an alkyl group substituted with an aryl group, and a monovalent heterocyclic group. The amino group substituted with one or more substituents is referred to as a "substituted amino group" below. The substituent may further have a substituent. The further substituent of a substituent of an organic group may be referred to as a "secondary substituent" below. The number of carbon atoms of the substituted amino group is preferably from 1 to 60, more preferably from 2 to 48, and further preferably from 2 to 40.

Examples of the substituted amino group may include a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a heptylamino group, an octylamino group, a 2-ethylhexylamino group, a nonylamino group, a decylamino group, a 3,7-dimethyloctylamino group, a dodecylamino group, a cyclopentylamino group, a dicyclopentylamino group, a cyclohexylamino group, a dicyclohexylamino group, a ditrifluoromethylamino group, a phenylamino group, a diphenylamino group, a $C_{1-12}$ alkoxyphenylamino group, a bis($C_{1-12}$ alkoxyphenyl)amino group, a $C_{1-12}$ alkylphenylamino group, a bis($C_{1-12}$ alkylphenyl)amino group, a 1-naphthylamino group, a 2-naphthylamino group, a pentafluorophenylamino group, a pyridylamino group, a pyridazinylamino group, a pyrimidinylamino group, a pyrazinylamino group, a triazinylamino group, a phenyl-$C_{1-12}$ alkylamino group, a $C_{1-12}$ alkoxyphenyl-$C_{1-12}$ alkylamino group, a di($C_{1-12}$ alkoxyphenyl-$C_{1-12}$ alkyl)amino group, a $C_{1-12}$ alkylphenyl-$C_{1-12}$ alkylamino group, a di($C_{1-12}$ alkylphenyl-$C_{1-12}$ alkyl)amino group, a 1-naphthyl-$C_{1-12}$ alkylamino group, and a 2-naphthyl-$C_{1-12}$ alkylamino group.

The "silyl group" optionally has a substituent and is preferably an unsubstituted silyl group or a silyl group substituted with one to three substituents selected from the group consisting of an alkyl group, an aryl group, an alkyl group substituted with an aryl group, and a monovalent heterocyclic group (hereinafter referred to as a "substituted silyl group"). The substituent optionally has a secondary substituent. The number of carbon atoms of the substituted silyl group is preferably from 1 to 60, more preferably from 3 to 48, and further preferably from 3 to 40 without comprising the number of carbon atoms of the secondary substituent.

Examples of the substituted silyl group may include a trimethylsilyl group, a triethylsilyl group, a tripropylsilyl group, a tri-isopropylsilyl group, a dimethyl-isopropylsilyl group, a diethyl-isopropylsilyl group, a tert-butyldimethylsilyl group, a pentyldimethylsilyl group, a hexyldimethylsilyl group, a heptyldimethylsilyl group, an octyldimethylsilyl group, a 2-ethylhexyl-dimethylsilyl group, a nonyldimethylsilyl group, a decyldimethylsilyl group, a 3,7-dimethyloctyldimethylsilyl group, a dodecyldimethylsilyl group, a phenyl-$C_{1-12}$ alkylsilyl group, a $C_{1-12}$ alkoxyphenyl-$C_{1-12}$ alkylsilyl group, a $C_{1-12}$ alkylphenyl-$C_{1-12}$ alkylsilyl group, a 1-naphthyl-$C_{1-12}$ alkylsilyl group, a 2-naphthyl-$C_{1-12}$ alkylsilyl group, a phenyl-$C_{1-12}$ alkyldimethylsilyl group, a triphenylsilyl group, a tri-p-xylylsilyl group, a tribenzylsilyl group, a diphenylmethylsilyl group, a tert-butyldiphenylsilyl group, and a dimethylphenylsilyl group.

The "acyl group" is a group represented by —C(=O)—$R^{111}$, for example. $R^{111}$ represents the above alkyl group, the aryl group, or a monovalent heterocyclic group described below. The alkyl group, the above aryl group, and the monovalent heterocyclic group in $R^{111}$ optionally have a substituent. The number of carbon atoms of the acyl group is preferably from 2 to 20 and, more preferably from 2 to 18, and further preferably from 2 to 16 without comprising the number of carbon atoms of the substituent unless otherwise specified.

Examples of the acyl group may include an acetyl group, a propionyl group, a butyryl group, an isobutyryl group, a pivaloyl group, and a benzoyl group. The acyl group having a substituent may be an acyl group having a halogen atom as a substituent (e.g., a trifluoroacetyl group and a pentafluorobenzoyl group).

The "acyloxy group" is a group represented by —O—C(=O)—$R^{112}$, for example. $R^{112}$ represents the above alkyl group, the above aryl group, or a monovalent heterocyclic group described below. The alkyl group, the aryl group, and the monovalent heterocyclic group in $R^{112}$ optionally have a substituent. The number of carbon atoms of the acyloxy group is preferably from 2 to 20 and, more preferably from 2 to 18, and further preferably from 2 to 16 without comprising the number of carbon atoms of the substituent unless otherwise specified.

Examples of the acyloxy group may include an acetoxy group, a propionyloxy group, a butyryloxy group, an isobutyryloxy group, a pivaloyloxy group, and a benzoyloxy group. Examples of the acyloxy group having a substituent may include an acyloxy group having a halogen atom as a substituent (e.g., a trifluoroacetyloxy group and a pentafluorobenzoyloxy group).

The "oxycarbonyl group" is a group represented by —C(=O)—O—$R^{113}$, for example. $R^{113}$ represents the above alkyl group, the above aryl group, or a monovalent heterocyclic group described below. The alkyl group, the aryl group, and the monovalent heterocyclic group in $R^{113}$ optionally have a substituent. The number of carbon atoms of the oxycarbonyl group is preferably from 2 to 20 and, more preferably from 2 to 18, and further preferably from 2 to 16 without comprising the number of carbon atoms of the secondary substituent unless otherwise specified.

The "monovalent heterocyclic group" is an atomic group remaining after removing one hydrogen atom bonded to a carbon atom constituting a heterocycle or an aromatic ring from a heterocyclic compound. The monovalent heterocyclic group optionally has a substituent. The monovalent heterocyclic group comprises monocyclic groups and groups having a condensed ring. The number of carbon atoms of the monovalent heterocyclic group is preferably from 2 to 60 and, more preferably from 4 to 30, and further preferably from 4 to 20 without comprising the number of carbon atoms of the substituent unless otherwise specified.

The heterocyclic compound refers to compounds, among organic compounds having a ring, comprising not only a carbon atom, but also a hetero atom such as an oxygen atom, a sulfur atom, a nitrogen atom, a phosphor atom, a boron atom, a silicon atom, a selenium atom, a tellurium atom, and an arsenic atom as an atom constituting rings.

The monovalent heterocyclic group is preferably a monovalent aromatic heterocyclic group. The monovalent aromatic heterocyclic group is an atomic group remaining after removing one hydrogen atom bonded to a carbon atom constituting an aromatic heterocycle or an aromatic ring from an aromatic heterocyclic compound. Examples of the aromatic heterocyclic compound may include compounds in which a heterocycle comprising a hetero atom exhibits aromaticity in itself such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzophosphole, dibenzofuran, and dibenzothiophene and compounds in which although a heterocycle comprising a hetero atom does not exhibit aromaticity in itself, an aromatic ring is condensed with the heterocycle such as phenoxazine, phenothiazine, dibenzoborole, dibenzosilole, and benzopyran.

Examples of the monovalent aromatic heterocyclic group may include a thienyl group, a $C_{1-12}$ alkylthienyl group, a pyrrolyl group, a furyl group, a pyridyl group, a $C_{1-12}$ alkylpyridyl group, a piperidyl group, a quinolyl group, and an isoquinolyl group.

The "heterocyclic oxy group" is a group represented by —O—$Ar^{101}$. $Ar^{101}$ represents the above monovalent heterocyclic group. The monovalent heterocyclic group represented by $Ar^{101}$ optionally has a substituent. The number of carbon atoms of the heterocyclic oxy group is preferably from 2 to 60, more preferably from 4 to 30, and further preferably from 4 to 20 without comprising the number of carbon atoms of the substituent unless otherwise specified.

Examples of the heterocyclic oxy group may include a pyridyloxy group, a pyridazinyloxy group, a pyrimidinyloxy group, a pyrazinyloxy group, and a triazinyloxy group.

The "heterocyclic thio group" is a group represented by —S—$Ar^{102}$. $Ar^{102}$ represents in the above monovalent heterocyclic group. The monovalent heterocyclic thio group represented by $Ar^{102}$ optionally has a substituent. The number of carbon atoms of the heterocyclic thio group is preferably from 2 to 60, more preferably from 4 to 30, and further preferably from 4 to 20 without comprising the number of carbon atoms of the substituent unless otherwise specified.

Examples of the heterocyclic thio group may include a pyridylthio group, a pyridazinylthio group, a pyrimidinylthio group, a pyrazinylthio group, and a triazinylthio group.

The "imine residue" means a residue remaining after removing one hydrogen atom from an imine compound having a structure represented by a formula: $H-N=C(R^{114})_2$ or a formula: $H-C(R^{115})=N-R^{116}$. $R^{114}$, $R^{115}$, and $R^{116}$ in the formulae each independently represent the above alkyl group, the above aryl group, the above alkenyl group, the above alkynyl group, or the above monovalent heterocyclic group. The alkyl group, the aryl group, the alkenyl group, the alkynyl group, and the monovalent heterocyclic group in $R^{114}$, $R^{115}$, and $R^{116}$ optionally have a substituent. $R^{114}$ being plurally present may be the same as or different from each other and may be linked to each other, thus forming a ring structure together with a carbon atom to which they are bonded.

Examples of the imine residue may include groups represented by the following structural formulae.

[Chemical Formula 11]

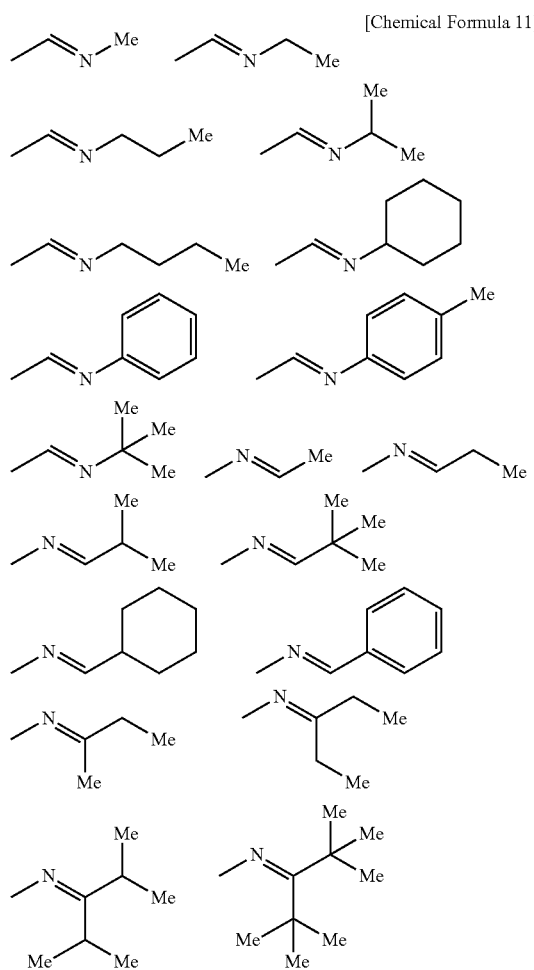
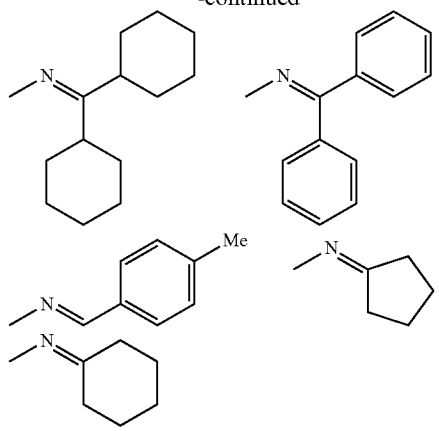

The "amido compound residue" means a residue remaining after removing one hydrogen atom from an amido compound having a structure represented by a formula: $H-N(R^{117})-C(=O)R^{118}$ or a formula: $H-C(=O)-N(R^{119})_2$. $R^{117}$, $R^{118}$, and $R^{119}$ in the formulae each independently represent the above alkyl group, the above aryl group, the above alkenyl group, the above alkynyl group, or the above monovalent heterocyclic group. The alkyl group, the aryl group, the alkenyl group, the alkynyl group, and the monovalent heterocyclic group in $R^{117}$, $R^{118}$, and $R^{119}$ optionally have a substituent. The two $R^{119}$ may be the same as or different from each other and are optionally linked to each other, thus forming a ring structure together with a nitrogen atom to which the two are bonded.

Examples of the amido compound residue may include a formamido residue, an acetamido residue, a propioamido residue, a butyramido residue, a benzamido residue, a trifluoroacetamido residue, a pentafluorobenzamido residue, a diformamido residue, a diacetamido residue, a dipropioamido residue, dibutyroamido residue, a dibenzamido residue, a ditrifluoroacetamido residue, and dipentafluorobenzamido residue.

The "acid imido residue" means a residue remaining after removing one hydrogen atom bonded to a nitrogen atom from an acid imido compound. The acid imido compound optionally has a substituent. The number of carbon atoms of the acid imido residue is preferably from 4 to 20, more preferably from 4 to 18, and further preferably from 4 to 16 without comprising the number of carbon atoms of the substituent unless otherwise specified.

Examples of the acid imido residue may include groups represented by the following structural formulae.

[Chemical Formula 12]

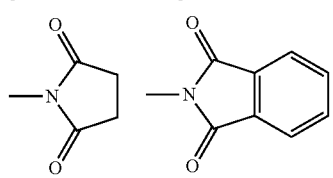

-continued

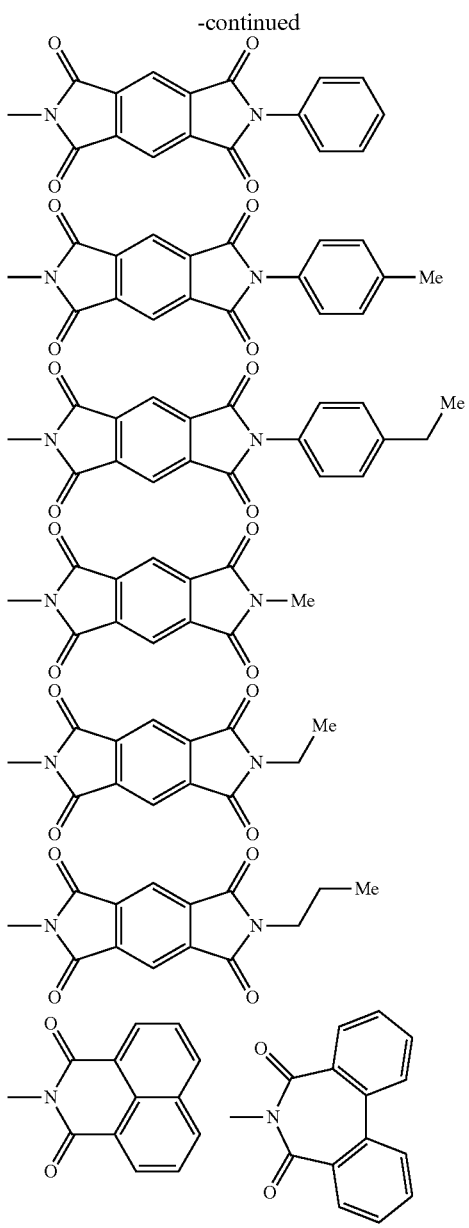

Examples of the "alkyl group optionally having a substituent" may include an unsubstituted alkyl group and an alkyl group having the above substituent. The substituent of the alkyl group is preferably a substituent selected from the group consisting of an alkoxy group, an aryl group, an aryloxy group, a monovalent heterocyclic group, a heterocyclic oxy group, and a halogen atom.

Examples of the "alkoxy group optionally having a substituent" may include an unsubstituted alkoxy group and an alkoxy group having the above substituent. The substituent of the alkoxy group is preferably a substituent selected from the group consisting of an alkoxy group, an aryl group, an aryloxy group, a monovalent heterocyclic group, a heterocyclic oxy group, and a halogen atom.

Examples of the "aryl group optionally having a substituent" may include an unsubstituted aryl group and an aryl group having the above substituent. The substituent of the aryl group is preferably a substituent selected from the group consisting of an alkyl group, an alkoxy group, an aryl group, an aryloxy group, a monovalent heterocyclic group, a heterocyclic oxy group, and a halogen atom.

Examples of the "aryloxy group optionally having a substituent" may include an unsubstituted aryloxy group and an aryloxy group having the above substituent. The substituent of the aryloxy group is preferably a substituent selected from the group consisting of an alkyl group, an alkoxy group, an aryl group, an aryloxy group, a monovalent heterocyclic group, a heterocyclic oxy group, and a halogen atom.

Examples of the "monovalent heterocyclic group optionally having a substituent" may include an unsubstituted monovalent heterocyclic group and a monovalent heterocyclic group having the above substituent. The substituent of the monovalent heterocyclic group is preferably a substituent selected from the group consisting of an alkyl group, an alkoxy group, an aryl group, an aryloxy group, a monovalent heterocyclic group, a heterocyclic oxy group, and a halogen atom.

Examples of the "arylene group optionally having a substituent" may include an unsubstituted arylene group and an arylene group having the above substituent. The substituent of the arylene group is preferably a substituent selected from the group consisting of an alkyl group, an alkoxy group, an aryl group, an aryloxy group, a monovalent heterocyclic group, a heterocyclic oxy group, and a halogen atom.

The "arylene group" is an atomic group remaining after removing two hydrogen atoms bonded to a carbon atom constituting an aromatic ring from an aromatic hydrocarbon. The arylene group comprises groups having a benzene ring and groups having a condensed ring.

The number of carbon atoms of the arylene group optionally having a substituent is preferably from 6 to 60, more preferably from 6 to 48, and further preferably from 6 to 30 without comprising the number of carbon atoms of the substituent unless otherwise specified. Examples of the aromatic hydrocarbon may include benzene, naphthalene, anthracene, phenanthrene, naphthacene, fluorene, pyrene, and perylene.

Examples of the arylene group may include phenylene groups such as a 1,4-phenylene group, a 1,3-phenylene group, and a 1,2-phenylene group; naphthalenediyl groups such as a 1,4-naphthalenediyl group, a 1,5-naphthalenediyl group, a 2,6-naphthalenediyl group, and a 2,7-naphthalenediyl group; anthracenediyl groups such as a 1,4-anthracenediyl group, a 1,5-anthracenediyl group, a 2,6-anthracenediyl group, and a 9,10-anthracenediyl group; phenanthrenediyl groups such as a 2,7-phenanthrenediyl group; naphthacenediyl groups such as a 1,7-naphthacenediyl group, a 2,8-naphthacenediyl group, and a 5,12-naphthacenediyl group; fluorenediyl groups such as a 2,7-fluorenediyl group and a 3,6-fluorenediyl group; pyrenediyl groups such as a 1,6-pyrenediyl group, a 1,8-pyrenediyl group, a 2,7-pyrenediyl group, and a 4,9-pyrenediyl group; and perylenediyl groups such as a 3,8-perylenediyl group, a 3,9-perylenediyl group, and a 3,10-perylenediyl group.

Examples of the "divalent heterocyclic group optionally having a substituent" may include an unsubstituted divalent heterocyclic group and a divalent heterocyclic group having the above substituent. The substituent of the divalent heterocyclic group is preferably a substituent selected from the group consisting of an alkyl group, an alkoxy group, an aryl group, an aryloxy group, a monovalent heterocyclic group, a heterocyclic oxy group, and a halogen atom.

The "divalent heterocyclic group" is an atomic group remaining after removing two hydrogen atoms bonded to a carbon atom constituting a heterocycle or an aromatic ring from a heterocyclic compound. The divalent heterocyclic group comprises monocyclic groups and condensed ring groups.

The number of carbon atoms of the divalent heterocyclic group optionally having a substituent is preferably from 2 to 60, more preferably from 4 to 30, and further preferably from 4 to 20 without comprising the number of carbon atoms of the substituent unless otherwise specified.

The divalent heterocyclic group is preferably a divalent aromatic heterocyclic group. The divalent aromatic heterocyclic group is an atomic group remaining after removing two hydrogen atoms bonded to a carbon atom constituting a heterocycle or an aromatic ring from an aromatic heterocyclic compound.

Examples of the divalent heterocyclic group may include pyridinediyl groups such as a 2,5-pyridinediyl group and a 2,6-pyridinediyl group; quinolinediyl groups such as a 2,6-quinolinediyl group; isoquinolinediyl groups such as a 1,4-isoquinolinediyl group and a 1,5-isoquinolinediyl group; quinoxalinediyl groups such as a 5,8-quinoxalinediyl group; 2,1,3-benzothiadiazole groups such as a 2,1,3-benzothiadiazole-4,7-diyl group; benzothiazolediyl groups such as a 4,7-benzothiazolediyl group; dibenzosilolediyl groups such as a 2,7-dibenzosilolediyl group; dibenzofurandiyl groups such as a dibenzofuran-4,7-diyl group and a dibenzofuran-3,8-diyl group; dibenzothiophenediyl groups such as a dibenzothiophene-4,7-diyl group and a dibenzothiophene-3,8-diyl group; a 3,6-carbazolediyl group; a 2,7-carbazolediyl group; a 3,7-phenoxazinediyl group; and a 2,8-phenoxazinediyl group.

The "crosslinking group" is a group exhibiting crosslinkability through external stimuli such as a heating treatment and a light irradiation treatment, for example. By performing a crosslinking treatment on a polymer compound having a crosslinking group and an organic film comprising a composition comprising the polymer compound, the "organic film" can be converted into an "insolubilized organic film" insolubilized against organic solvents, which is insoluble in organic solvents.

The following describes in detail preferred embodiments of the polymer compound, the raw material compound for the polymer compound, the composition, the organic film, the insolubilized organic film, the light-emitting device, the planar light source, and the display device comprising the polymer compound, and the method for manufacturing the same according to the present invention.

(Polymer Compound)

The polymer compound according to the present embodiment comprises a first constitutional unit represented by Formula (1) in an amount of 51% by mol or more with respect to the total amount of all constitutional units and at least one of a constitutional unit represented by Formula (2) and a constitutional unit represented by Formula (3).

The polymer compound according to the present embodiment is preferably a conjugated polymer compound. The "conjugated polymer compound" is a polymer compound in which a conjugated system spreads along its main chain; examples of the conjugated polymer compound may include polyarylenes such as polyfluorene and polyphenylene having an arylene group as a constitutional unit; polyheteroarylenes such as polythiophene and polydibenzofuran having a divalent heterocyclic group as a constitutional unit; poly(arylene vinylene)s such as poly(phenylene vinylene); and copolymers in which these constitutional units are combined. The "conjugated polymer compound" is only required to comprise a conjugated system spreading along substantially its main chain even when it comprises hetero atoms or the like in the constitutional unit constituting its main chain and optionally also comprises a constitutional unit derived from triarylamine or the like as a constitutional unit.

(First Constitutional Unit)

The first constitutional unit is the constitutional unit represented by Formula (1). The constitutional unit represented by Formula (1) does not generally have any crosslinking group.

In Formula (1), a is more preferably 1, because a monomer as a raw material is easily synthesized and the hole transportability and durability of a light-emitting device manufactured using the polymer compound according to the present embodiment are more excellent.

In Formula (1), b is more preferably 0, because a monomer as a raw material is easily synthesized and the hole transportability and durability of the light-emitting device manufactured using the polymer compound according to the present embodiment are more excellent.

In Formula (1), when the groups represented by $Ar^1$, $Ar^2$, $Ar^3$, and $Ar^4$ have a substituent, examples of the substituent may include an alkyl group, an alkoxy group, an aryl group, an aryloxy group, an arylalkyl group, an arylalkoxy group, an arylalkenyl group, arylalkynyl group, an amino group, a substituted amino group, a halogen atom, an acyl group, an acyloxy group, a monovalent heterocyclic group, a carboxy group, a nitro group, and a cyano group; preferably an alkyl group, an alkoxy group, an aryl group, an aryloxy group, an arylalkyl group, an arylalkoxy group, a substituted amino group, an acyl group, and a cyano group; and more preferably an alkyl group, an alkoxy group, and an aryl group.

In Formula (1), the groups represented by $Ar^2$ and $Ar^4$ are preferably an arylene group optionally having a substituent, more preferably an arylene group optionally having a substituent with the number of carbon atoms of from 10 to 60, further preferably a 2,7-fluorenediyl group optionally having a substituent, a naphthalenediyl group optionally having a substituent, a phenanthrenediyl group optionally having a substituent, a dihydrophenanthrenediyl group optionally having a substituent, an anthracenediyl group optionally having a substituent, a pyrenediyl group optionally having a substituent, and a perylenediyl group optionally having a substituent, and particularly preferably a 2,7-fluorenediyl group, a naphthalenediyl group, a phenanthrenediyl group, a dihydrophenanthrenediyl group, an anthracenediyl group, a pyrenediyl group, and a perylenediyl group, because the hole transportability and durability of a light-emitting device manufactured using the polymer compound according to the present embodiment are more excellent. When these groups have the above substituent, the number of carbon atoms does not comprise the number of carbon atoms of the substituent.

In Formula (1), the divalent group made by linking two or more groups that are selected from the group consisting of an arylene group and a divalent heterocyclic group and may be the same as or different from each other in $Ar^2$ and $Ar^4$ is preferably a group represented by Formula (1a-1), (1a-2), (1a-3), (1a-4), (1a-5), (1a-6), or (1a-7) and more preferably the group represented by Formula (1a-1). These groups optionally have the above substituent.

[Chemical Formula 13]

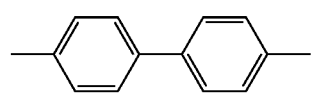

(1a-1)

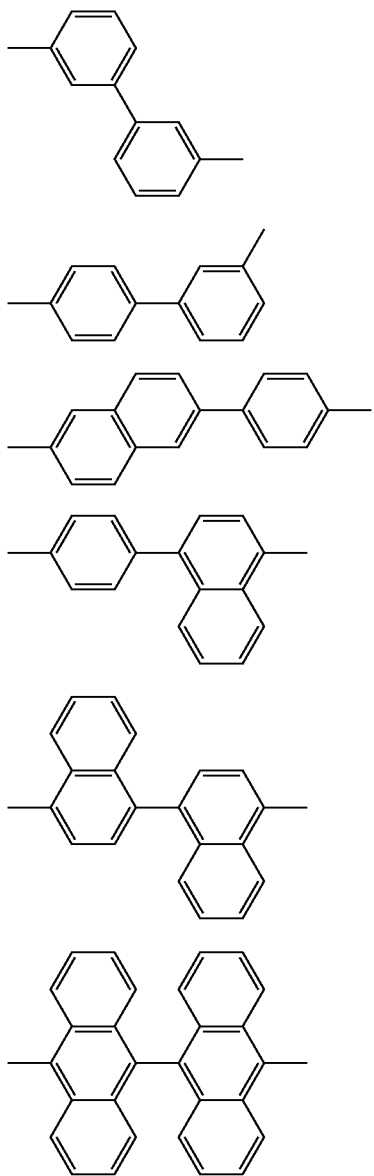

(1a-2)
(1a-3)
(1a-4)
(1a-5)
(1a-6)
(1a-7)

In Formula (1), the groups represented by $Ar^1$ and $Ar^3$ are preferably an arylene group optionally having a substituent, because the hole transportability and durability of a light-emitting device manufactured using the polymer compound according to the present embodiment are more excellent.

In Formula (1), the arylene group in $Ar^1$ and $Ar^3$ is, for example, preferably a 1,2-phenylene group, a 1,3-phenylene group, a 1,4-phenylene group, a 1,4-naphthalenediyl group, a 2,6-naphthalenediyl group, a 2,7-naphthalenediyl group, a 2,6-anthracenediyl group, a 9,10-anthracenediyl group, a 2,7-phenanthrenediyl group, a 5,12-naphthacenediyl group, a 2,7-fluorenediyl group, a 3,6-fluorenediyl group, a 1,6-pyrenediyl group, a 2,7-pyrenediyl group, or a 3,8-perylenediyl group and more preferably a 1,4-phenylene group, a 2,7-fluorenediyl group, a 2,6-anthracenediyl group, a 9,10-anthracenediyl group, a 2,7-phenanthrenediyl group, or a 1,6-pyrenediyl group. These groups optionally have the above substituent.

In Formula (1), the divalent heterocyclic group in $Ar^1$, $Ar^2$, $Ar^3$, and $Ar^4$ is preferably a divalent aromatic heterocyclic group and more preferably a 2,5-pyrroldiyl group, a dibenzofurandiyl group, a dibenzothiophenediyl group, or a 2,1,3-benzothiadiazole-4,7-diyl group, because the hole transportability and durability of a light-emitting device manufactured using the polymer compound according to the present embodiment are more excellent. These groups optionally have the above substituent.

In Formula (1), $R^A$, $R^B$, and $R^C$ are preferably an alkyl group having a substituent, an aryl group optionally having a substituent, or a monovalent heterocyclic group optionally having a substituent, more preferably an aryl group optionally having a substituent, further preferably an aryl group having a substituent, and particularly preferably an aryl group having an alkyl group as the substituent, because the hole transportability and durability of a light-emitting device manufactured using the polymer compound according to the present embodiment are more excellent.

In Formula (1), the alkyl group as $R^A$, $R^B$, and $R^C$ is the same as the "alkyl group" described as the above substituent. This alkyl group is preferably a $C_{1-20}$ alkyl group.

The group optionally has the above substituent.

In Formula (1), the aryl group as $R^A$, $R^B$, and $R^C$ is the same as the "aryl group" described as the above substituent. This aryl group is preferably a phenyl group, a 1-naphthyl group, a 2-naphthyl group, a 1-anthracenyl group, a 2-anthracenyl group, a 9-anthracenyl group, or a 2-fluorenyl group and more preferably a phenyl group. These groups optionally have the above substituent.

In Formula (1), the monovalent heterocyclic group as $R^A$, $R^B$, and $R^C$ is the same as the "monovalent heterocyclic group" described as the above substituent. This monovalent heterocyclic group is preferably a pyridyl group, a pyrimidyl group, a triazyl group, or a quinolyl group. These groups optionally have the above substituent.

In Formula (1), when the groups represented by $R^A$, $R^B$, and $R^C$ have a substituent, the substituent is preferably an alkyl group, an alkoxy group, an aryl group, an aryloxy group, an arylalkyl group, an arylalkoxy group, an arylalkenyl group, an arylalkynyl group, an amino group, a substituted amino group, a halogen atom, an acyl group, an acyloxy group, a monovalent heterocyclic group, a carboxy group, a nitro group, or a cyano group, more preferably an alkyl group, an alkoxy group, an aryl group, an aryloxy group, an arylalkyl group, an arylalkoxy group, a substituted amino group, an acyl group, or a cyano group, and further preferably an alkyl group, an alkoxy group, or an aryl group.

$Ar^1$ and $R^A$ are optionally linked to each other, thus forming a ring structure; $Ar^1$ and $Ar^2$ are optionally linked to each other, thus forming a ring structure; $Ar^2$ and $R^A$ are optionally linked to each other, thus forming a ring structure; $Ar^2$ and $R^B$ are optionally linked to each other, thus forming a ring structure; $Ar^2$ and $Ar^3$ are optionally linked to each other, thus forming a ring structure; and $Ar^3$ and $R^B$ are optionally linked to each other, thus forming a ring structure.

"Being optionally linked to each other, thus forming a ring structure" means that $Ar^1$ and $R^A$, for example, may be linked to each other, thus forming a ring structure through a single bond, a group represented by —O—, a group represented by —S—, a group represented by —C(=O)—, a group represented by —C(=O)—O—, a group represented by —N($R^{120}$)—, a group represented by —C(=O)—N($R^{120}$)—, or a group represented by —C($R^{120}$)$_2$—. $R^{120}$ represents an alkyl group optionally having a substituent or an aryl group optionally having a substituent. When $R^{120}$ is plurally present, they may be the same as or different from each other. These groups form a ring, thus generally forming a five-membered ring, a six-membered ring, or a seven-membered ring.

The amount of the first constitutional unit is preferably from 60% by mol to 99.5% by mol, more preferably from 70% by mol to 99% by mol, and further preferably from 80% by mol to 97% by mol with respect to the total amount of all constitutional units, because the hole transportability and durability of the light-emitting device manufactured using the polymer compound according to the present embodiment are more excellent.

Examples of the first constitutional unit may include constitutional units represented by Formulae (1-01) to (1-27); preferably the constitutional units represented by Formulae (1-01), (1-02), (1-04) to (1-18), (1-20), (1-22), and (1-24) to (1-27); more preferably the constitutional units represented by Formulae (1-01), (1-02), (1-05) to (1-09), (1-11), (1-13) to (1-16), (1-20), (1-22), and (1-25) to (1-27); and further preferably the constitutional units represented by Formulae (1-05), (1-07) to (1-09), (1-11), and (1-13) to (1-16).

[Chemical Formula 14]

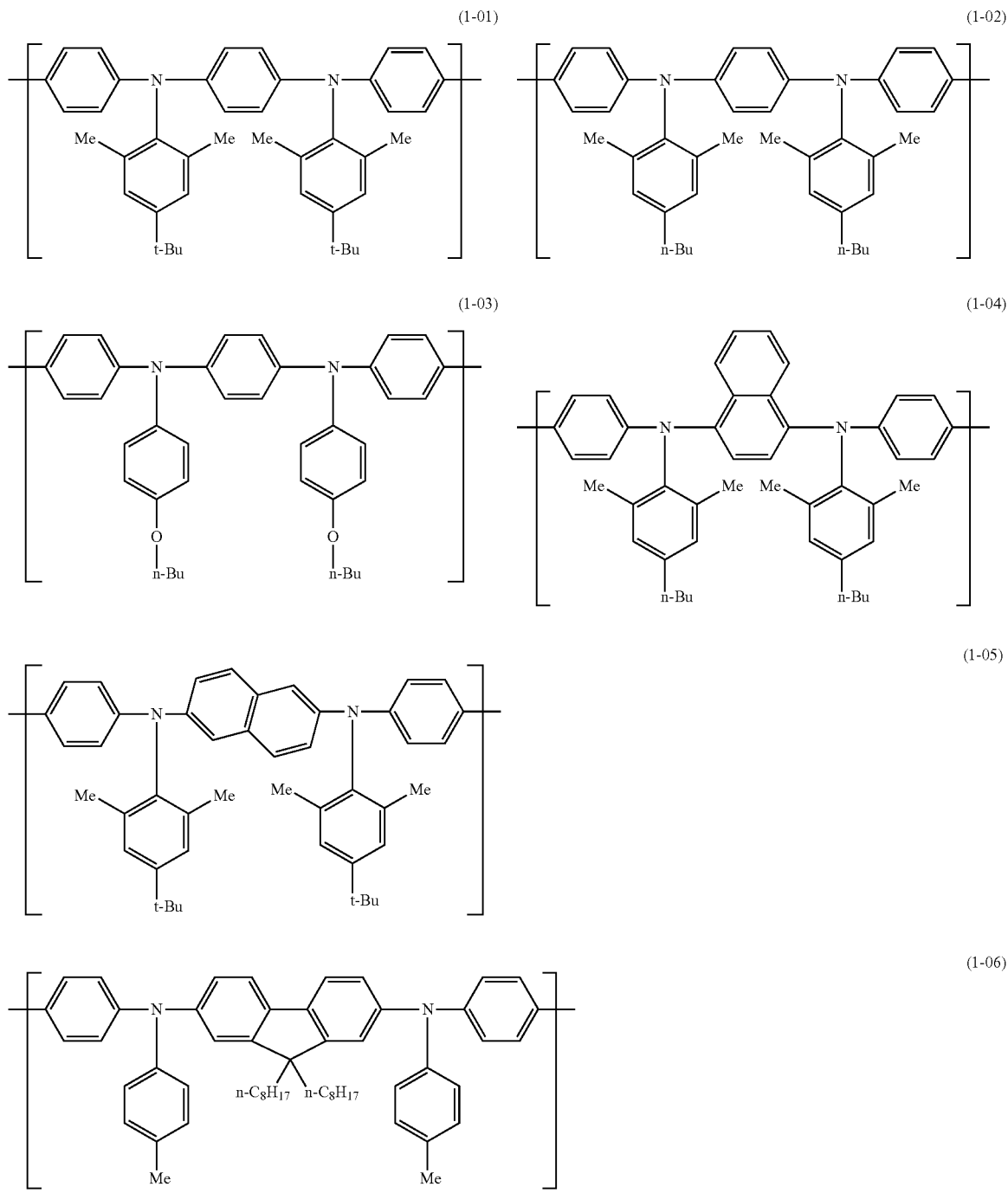

-continued
[Chemical Formula 15]
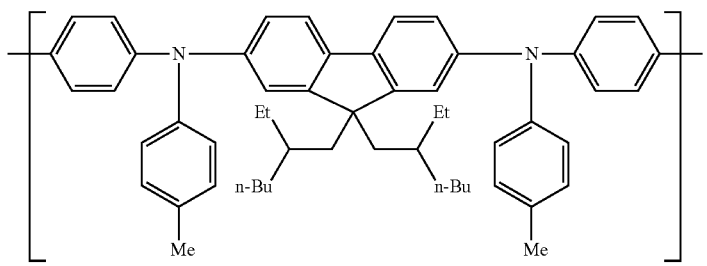
(1-07)
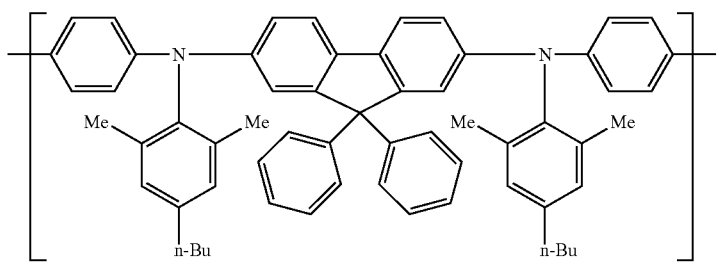
(1-08)
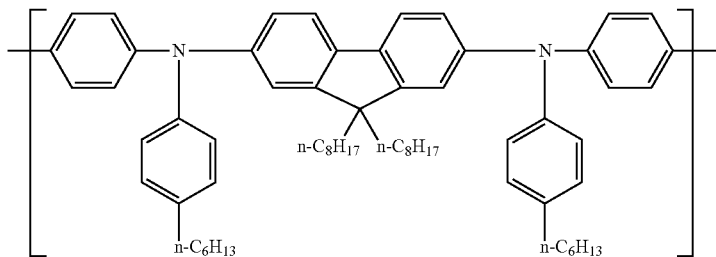
(1-09)
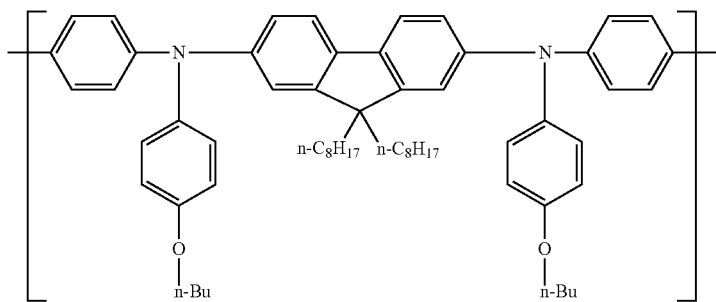
(1-10)
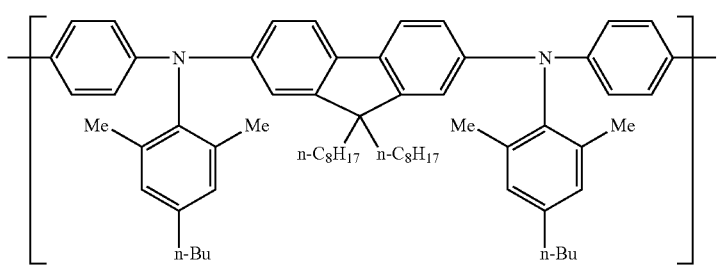
(1-11)

-continued
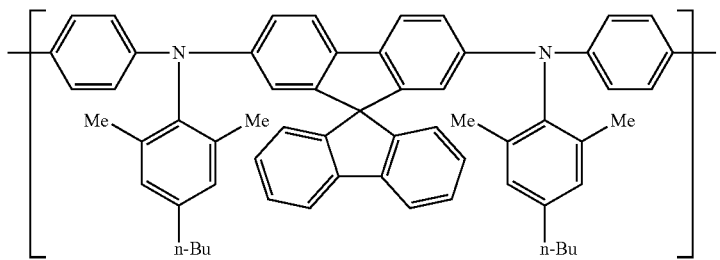
(1-12)
[Chemical Formula 16]
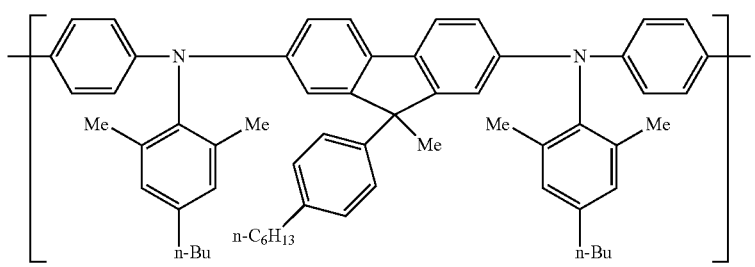
(1-13)
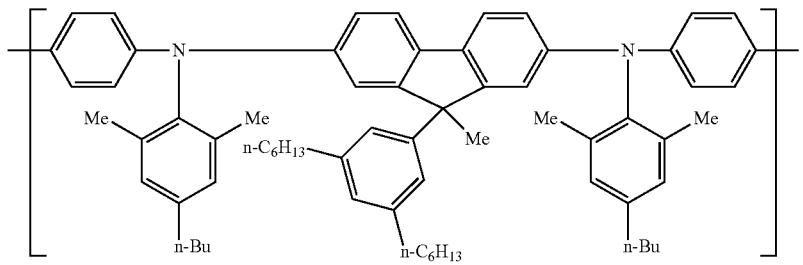
(1-14)
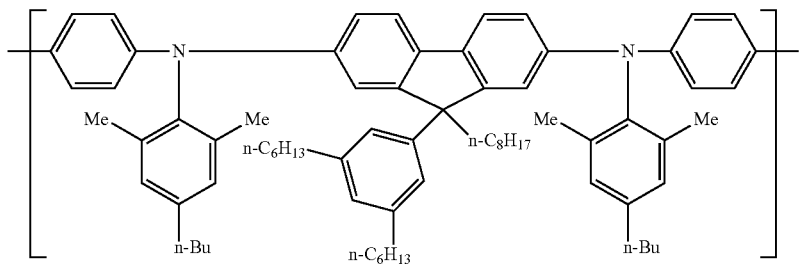
(1-15)
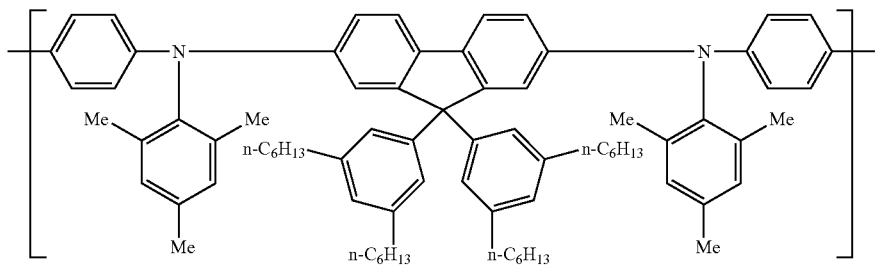
(1-16)

[Chemical Formula 17]
(1-17)
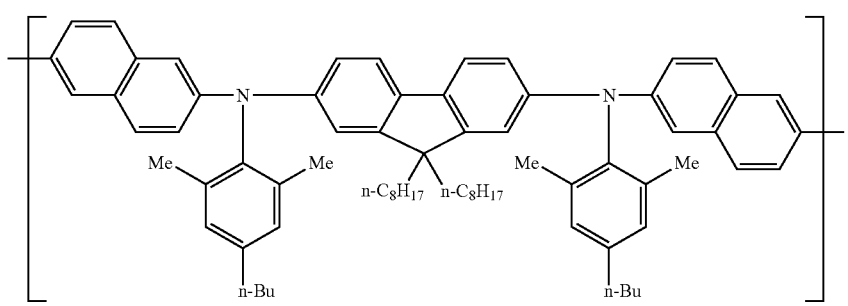
(1-18)
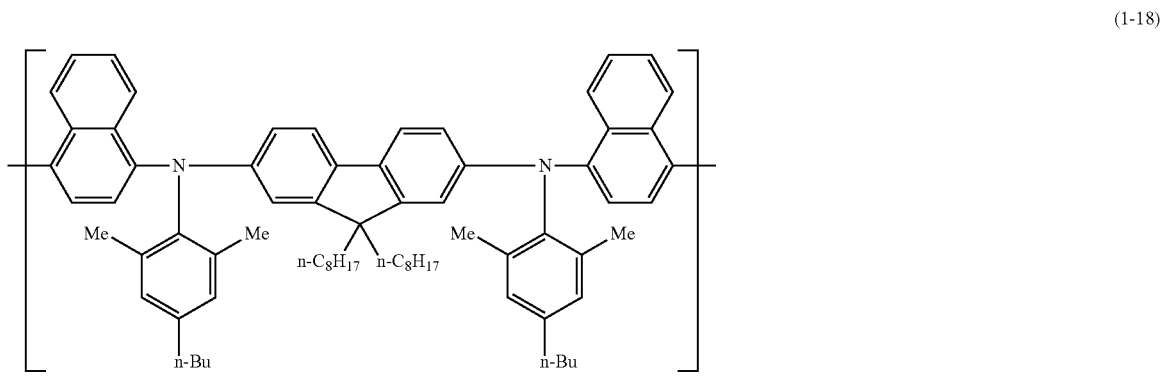
(1-19)
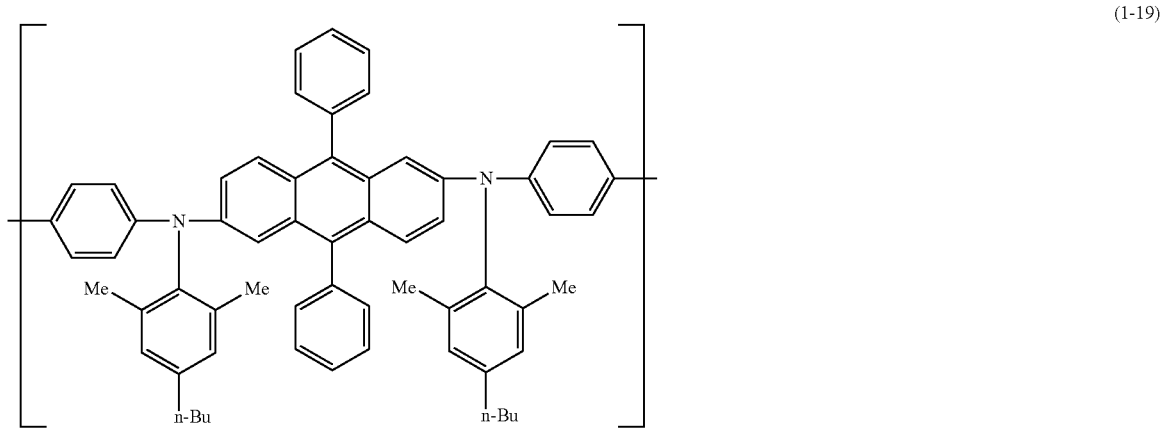
(1-20)
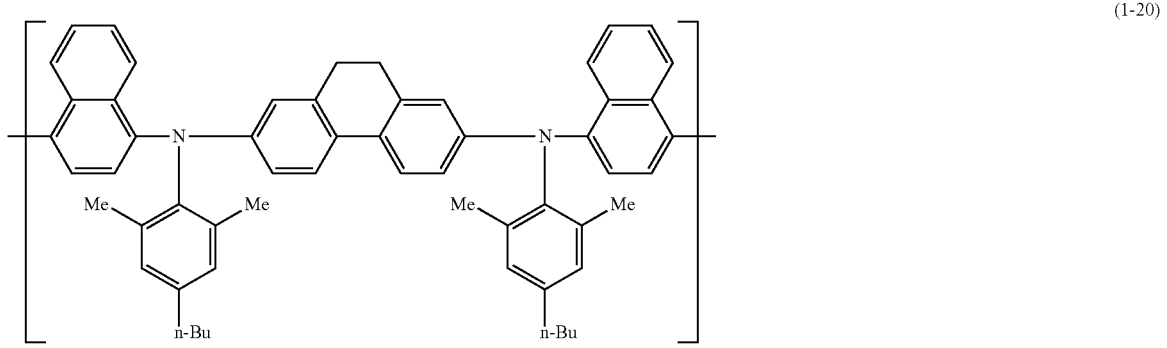

-continued
[Chemical Formula 18]
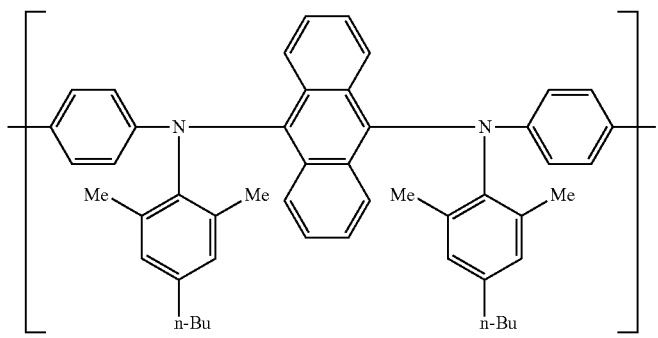
(1-21)
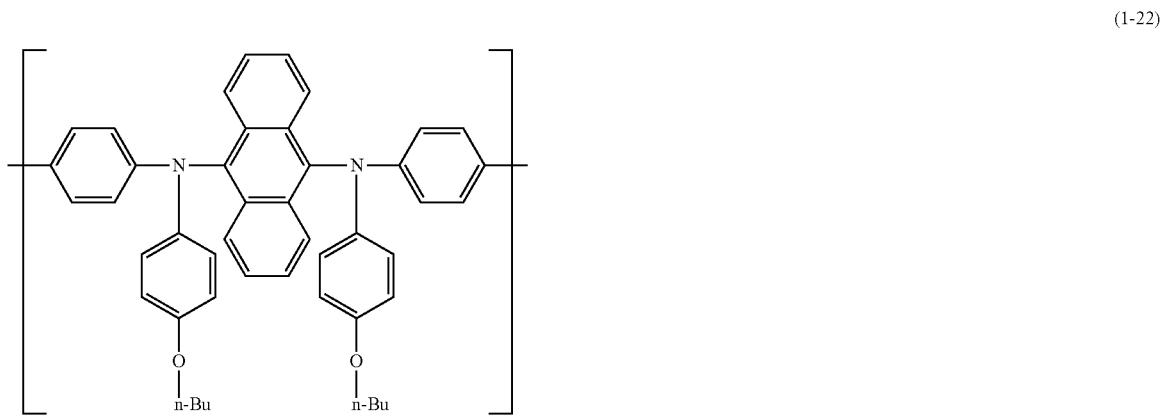
(1-22)
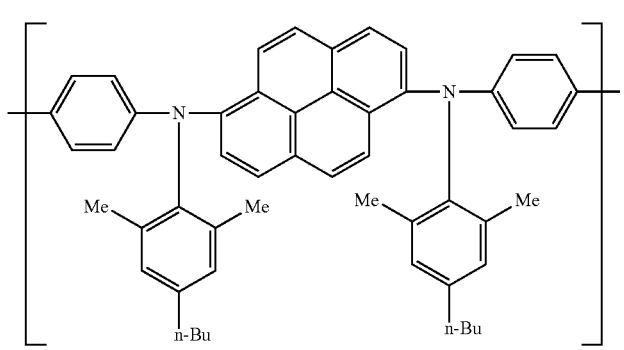
(1-23)
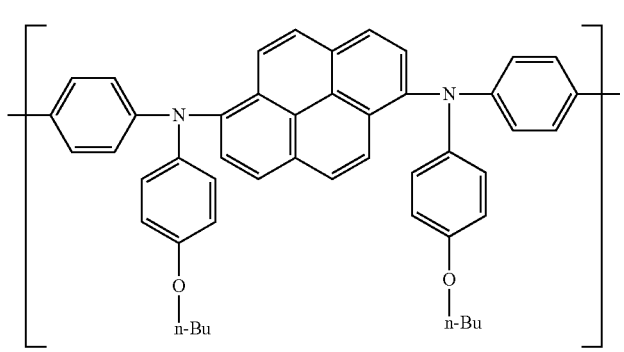
(1-24)

[Chemical Formula 19]
(1-25)
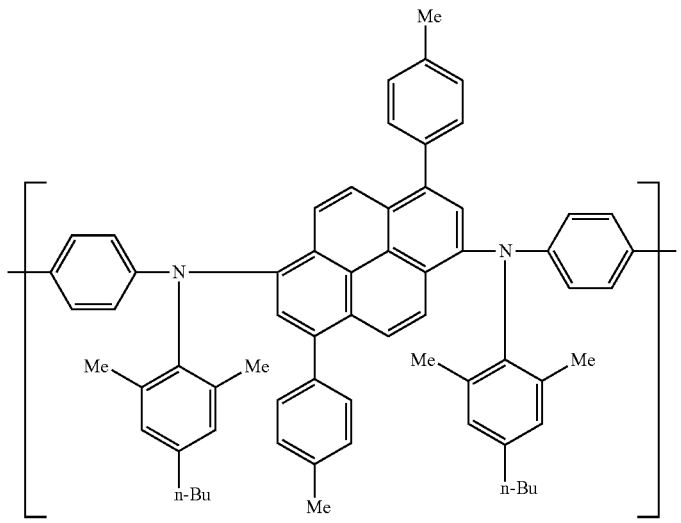
(1-26)
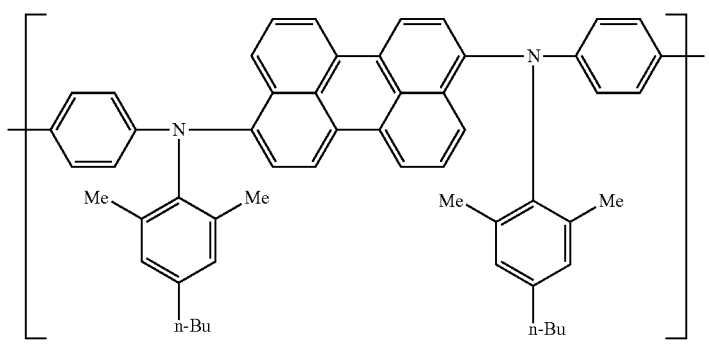
(1-27)
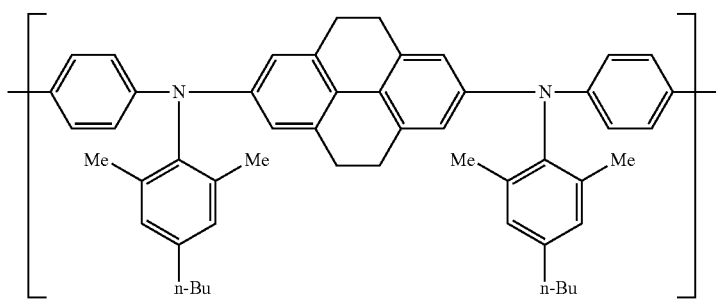
(1-28)
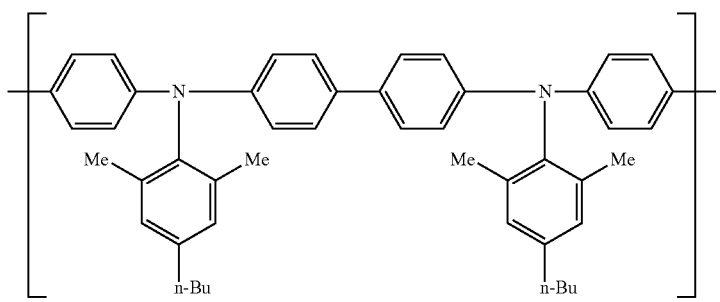

(Second Constitutional Unit)

The second constitutional unit is the constitutional unit represented by Formula (2).

In Formula (2), na is preferably an integer of 0 to 2, more preferably 0 or 1, and further preferably 0, because a monomer as a raw material is easily synthesized.

In Formula (2), nb is preferably an integer of 0 to 10 and more preferably an integer of 0 to 8, because a monomer as a raw material is easily synthesized.

In Formula (2), nA is preferably 0, because the hole transportability and durability of a light-emitting device manufactured using the polymer compound according to the present embodiment are more excellent.

In Formula (2), n is preferably an integer of 0 to 3, because the hole transportability and durability of a light-emitting device manufactured using the polymer compound according to the present embodiment are more excellent. In view of converting an organic film comprising the polymer compound according to the present embodiment into an insolubilized organic film, n is preferably an integer of 1 to 4, more preferably an integer of 1 to 3, and further preferably 2.

In Formula (2), the number of carbon atoms of the (2+n)-valent aromatic hydrocarbon group optionally having a substituent as $Ar^5$ is generally from 6 to 60, preferably from 6 to 48, more preferably from 6 to 20, and further preferably from 6 to 14. The (2+n)-valent aromatic hydrocarbon group is preferably a divalent, trivalent, quadrivalent, or quinquevalent aromatic hydrocarbon group and more preferably a trivalent or quadrivalent aromatic hydrocarbon group. The "(2+n)-valent aromatic hydrocarbon group" means an atomic group remaining after removing (2+n) hydrogen atoms bonded to a carbon atom constituting a ring (preferably an aromatic ring) from an aromatic hydrocarbon compound and comprises groups having a benzene ring and groups having a condensed ring. The number of carbon atoms does not comprise the number of carbon atoms of the substituent.

Examples of the aromatic hydrocarbon compound may include benzene, naphthalene, anthracene, 1-tetracene, pyrene, perylene, fluorene, benzofluorene, phenanthrene, dihydrophenanthrene, chrysene, and coronene; preferably benzene, naphthalene, anthracene, pyrene, fluorene, benzofluorene, phenanthrene, and dihydrophenanthrene; and more preferably benzene, naphthalene, and fluorene, because the stability of the polymer compound according to the present embodiment is more excellent and the hole transportability of the light-emitting device manufactured using the polymer compound is more excellent.

In Formula (2), the number of carbon atoms of the (2+n)-valent heterocyclic group optionally having a substituent as $Ar^5$ is generally from 3 to 60 and preferably from 3 to 20. The (2+n)-valent heterocyclic group is preferably a divalent, trivalent, quadrivalent, or quinquevalent heterocyclic group and more preferably divalent, trivalent, or quadrivalent heterocyclic group. The "(n+2)-valent heterocyclic group" means an atomic group remaining after removing (2+n) hydrogen atoms bonded to a carbon atom constituting a heterocycle or an aromatic ring from a heterocyclic compound and comprises monocyclic groups and groups having a condensed ring. The number of carbon atoms does not comprise the number of carbon atoms of the substituent.

Examples of the heterocyclic compound may include pyridine, pyrimidine, triazine, quinoline, isoquinoline, quinoxaline, dibenzofuran, dibenzothiophene, carbazole, phenoxazine, phenothiazine, benzothiadiazole, and dibenzosilole.

In Formula (2), when the group represented by $Ar^5$ has a substituent, the substituent is preferably an alkyl group, an alkoxy group, an aryl group, an aryloxy group, an arylalkyl group, an arylalkoxy, an arylalkenyl group, an arylalkynyl group, an amino group, a substituted amino group, a halogen atom, an acyl group, an acyloxy group, a monovalent heterocyclic group, a carboxy group, a nitro group, or a cyano group, more preferably an alkyl group, an alkoxy group, an aryl group, an aryloxy group, an arylalkyl group, an arylalkoxy, a substituted amino group, an acyl group, or a cyano group, and further preferably an alkyl group, an alkoxy group, or an aryl group.

In Formula (2), $Ar^5$ is preferably an aromatic hydrocarbon group optionally having a substituent, because the hole transportability and durability of a light-emitting device manufactured using the polymer compound according to the present embodiment are excellent.

In Formula (2), the alkylene group represented by $L^a$ and $L^b$ may be any of linear, branched, and cyclic and optionally has a substituent; the linear alkylene group is preferable, because a monomer as a raw material is easily synthesized. The number of carbon atoms of the linear alkylene group and the branched alkylene group is generally from 1 to 20, preferably from 1 to 10, and more preferably from 1 to 6. The number of carbon atoms of the cyclic alkylene group is generally from 3 to 20, preferably from 3 to 10, and more preferably from 3 to 6. The number of carbon atoms of the branched alkylene group is particularly preferably from 3 to 6 without comprising the number of carbon atoms of the substituent unless otherwise specified.

Examples of the alkylene group may include a methylene group, a 1,2-ethylene group, a 1,3-propylene group, a 1,3-butylene group, a 1,3-pentylene group, a 1,4-pentylene group, a 1,5-pentylene group, a 1,4-hexylene group, a 1,6-hexylene group, a 1,7-heptylene group, a 1,6-octylene group, and a 1,8-octylene group.

In Formula (2), the phenylene group represented by $L^a$ and $L^b$ optionally has a substituent. The phenylene group comprises a 1,2-phenylene group, a 1,3-phenylene group, and a 1,4-phenylene group. Examples of the substituent that the phenylene group may have may include an alkyl group, an alkoxy group, a halogen atom, and a cyano group.

In Formula (2), $L^a$ is preferably a phenylene group, because a monomer as a raw material is easily synthesized.

In Formula (2), $L^b$ is preferably an alkylene group, because a monomer as a raw material is easily synthesized.

In Formula (2), $L^A$ represents an oxygen atom or a sulfur atom and is preferably an oxygen atom, because a monomer as a raw material is easily synthesized.

In Formula (2), X represents a monovalent crosslinking group. Examples of X may include an aziridinyl group optionally having a substituent, an azetidinyl group optionally having a substituent, an azide group, an epoxy group optionally having a substituent, an oxetanyl group optionally having a substituent, an alkenyl group optionally having a substituent, an alkynyl group optionally having a substituent, and a group having a cyclobutene structure in the group; preferably aziridinyl group optionally having a substituent, an azide group, an epoxy group optionally having a substituent, an oxetanyl group optionally having a substituent, an alkenyl group optionally having a substituent, an alkynyl group optionally having a substituent, an aryl group optionally having a substituent having a cyclobutene structure in the group, and a monovalent heterocyclic group optionally having a substituent having a cyclobutene structure in the group; more preferably an alkenyl group optionally having a substituent, an aryl group optionally having a substituent having a cyclobutene structure in the group, and a monovalent heterocyclic group optionally having a substituent having a cyclobutene structure in the group; and further preferably an alkenyl group optionally having a substituent and an aryl group optionally having a substituent having a cyclobutene structure in the group, because a monomer as a raw material is easily synthesized.

In Formula (2), examples of X may include the group represented by above Formula (X-1), the group represented by Formula (X-2) and groups represented by following Formulae (X-01) to (X-19); preferably the constitutional units represented by (X-1), (X-2), (X-01), (X-03), (X-04), and (X-06) to (X-18); more preferably the constitutional units represented by (X-1), (X-2), and (X-09) to (X-18); and further preferably the constitutional units represented by (X-1) and (X-2), because a monomer as a raw material is easily synthesized.

Examples of the substituent in (X-1) may include an alkyl group optionally having a substituent, an alkoxy group optionally having a substituent, an alkylthio group optionally having a substituent, an aryl group optionally having a substituent, an aryloxy group optionally having a substituent, an arylthio group optionally having a substituent, an amino group optionally having a substituent, a silyl group optionally having a substituent, a halogen atom, an acyl group, an acyloxy group, an imine residue, a carbamoyl group, an acid imido group, a monovalent heterocyclic group optionally having a substituent, a carboxy group optionally having a substituent, a cyano group, and a nitro group.

In Formula (X-2), the wavy line between $R^4$ and $R^5$ means that the arrangement of $R^4$ and $R^5$ may be either the E type or the Z type.

[Chemical Formula 20]

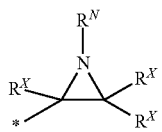
(X-01)

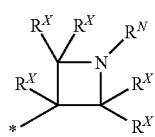
(X-02)

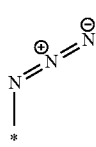
(X-03)

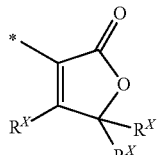
(X-04)

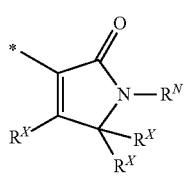
(X-05)

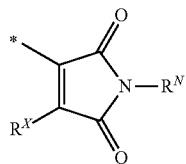
(X-06)

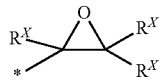
(X-07)

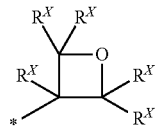
(X-08)

[Chemical Formula 21]

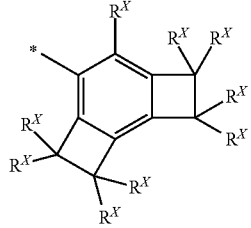
(X-09)

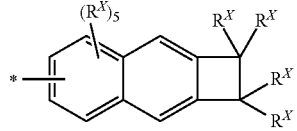
(X-10)

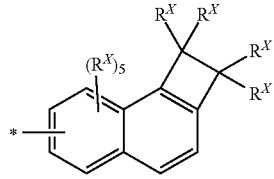
(X-11)

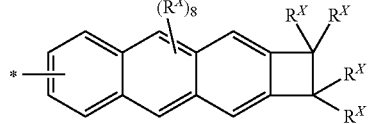
(X-12)

[Chemical Formula 22]

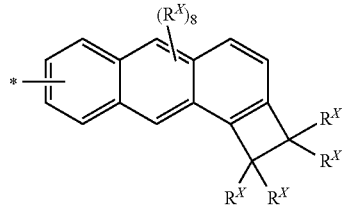
(X-13)

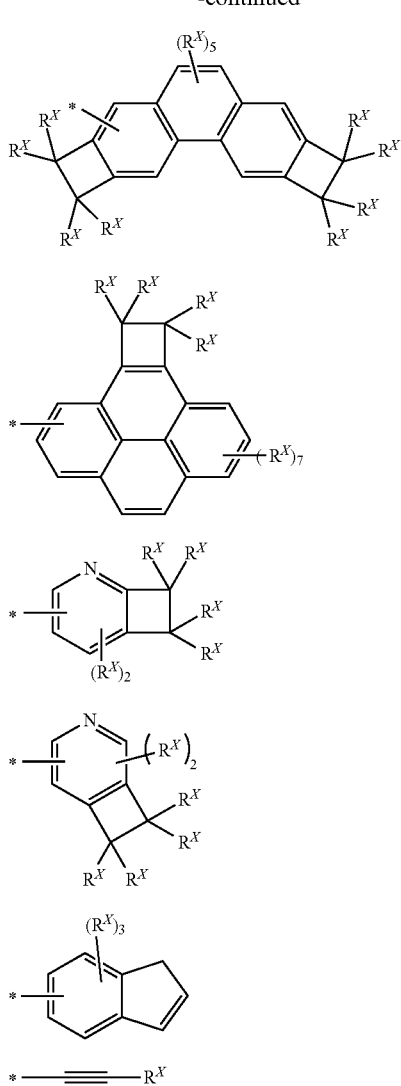

(X-14)
(X-15)
(X-16)
(X-17)
(X-18)
(X-19)

In Formulae (X-01) to (X-19), $R^X$ represents a hydrogen atom, an alkyl group optionally having a substituent, an alkoxy group optionally having a substituent, an alkylthio group optionally having a substituent, an aryl group optionally having a substituent, an aryloxy group optionally having a substituent, an arylthio group optionally having a substituent, an amino group optionally having a substituent, a silyl group optionally having a substituent, a halogen atom, an acyl group, an acyloxy group, an imine residue, a carbamoyl group, an acid imido group, a monovalent heterocyclic group optionally having a substituent, a carboxy group optionally having a substituent, a cyano group, or a nitro group. $R^X$ being plurally present may be the same as or different from each other.

$R^N$ represents a hydrogen atom, an alkyl group optionally having a substituent, an acyl group optionally having a substituent, an aryl group optionally having a substituent, or a monovalent heterocyclic group optionally having a substituent.

$R^X$ is preferably a hydrogen atom, an alkyl group optionally having a substituent, an alkoxy group optionally having a substituent, an aryl group optionally having a substituent, an aryloxy group optionally having a substituent, or a monovalent heterocyclic group optionally having a substituent and more preferably a hydrogen atom, an alkyl group optionally having a substituent, an alkoxy group optionally having a substituent, or an aryl group optionally having a substituent, because a monomer as a raw material is easily synthesized.

$R^N$ is preferably an alkyl group substituted with an aryl group, an acyl group optionally having a substituent, or a monovalent heterocyclic group optionally having a substituent, because a monomer as a raw material is easily synthesized.

In Formulae (X-01) to (X-19), "*" represents an atomic bonding.

Examples of Formula (X-1) may include Formulae (X-1-1) and (X-1-2); Formula (X-1-1) is preferable, because a monomer as a raw material is easily synthesized.

[Chemical Formula 23]

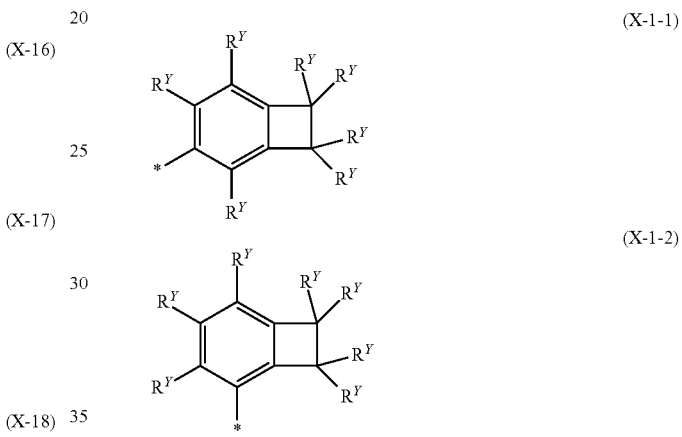

(X-1-1)
(X-1-2)

$R^Y$ in Formulae (X-1-1) and (X-1-2) represents a hydrogen atom, an alkyl group optionally having a substituent, an alkoxy group optionally having a substituent, an alkylthio group optionally having a substituent, an aryl group optionally having a substituent, an aryloxy group optionally having a substituent, an arylthio group optionally having a substituent, an amino group optionally having a substituent, a silyl group optionally having a substituent, a halogen atom, an acyl group, an acyloxy group, an imine residue, a carbamoyl group, an acid imido group, a monovalent heterocyclic group optionally having a substituent, a carboxy group optionally having a substituent, a cyano group, or a nitro group. $R^Y$ being plurally present may be the same as or different from each other.

$R^Y$ is preferably a hydrogen atom, an alkyl group optionally having a substituent, an alkoxy group optionally having a substituent, an aryl group optionally having a substituent, an aryloxy group optionally having a substituent, or a monovalent heterocyclic group optionally having a substituent, more preferably a hydrogen atom, an alkyl group optionally having a substituent, an alkoxy group optionally having a substituent, or an aryl group optionally having a substituent, and further preferably a hydrogen atom or an alkyl group optionally having a substituent, because a monomer as a raw material is easily synthesized. In Formulae (X-1-1) and (X-1-2), "*" represents an atomic bonding.

In Formula (X-2), ne represents 0 or 1 and is preferably 0, because the hole transportability and durability of the light-emitting device manufactured using the polymer compound according to the present embodiment are more excellent.

In Formula (X-2), of represents 0 or 1 and is preferably 0, because a monomer as a raw material is easily synthesized.

In Formula (X-2), $L^{X1}$ represents an oxygen atom, a sulfur atom, a carbonyl group, or a group represented by —O—CO— and is preferably a carbonyl group or a group represented by —O—CO—, because a monomer as a raw material is easily synthesized.

In Formula (X-2), $R^4$, $R^5$, $R^6$, $R^7$, and $R^8$ are preferably a hydrogen atom, an alkyl group, an alkoxy group, an aryl group, an aryloxy group, a monovalent heterocyclic group, a halogen atom, or a cyano group, more preferably a hydrogen atom, an alkyl group, or a fluorine atom, and further preferably a hydrogen atom, because the hole transportability and durability of a light-emitting device manufactured using the polymer compound according to the present embodiment are more excellent.

The constitutional unit represented by Formula (2) is preferably the constitutional unit represented by Formula (4), because the hole transportability and durability of a light-emitting device manufactured using the polymer compound according to the present embodiment are more excellent.

In Formula (4), nc is preferably an integer of 0 to 2, more preferably 0 or 1, and further preferably 0, because a monomer as a raw material is easily synthesized.

In Formula (4), nd is preferably an integer of 0 to 10 and more preferably an integer of 0 to 8, because a monomer as a raw material is easily synthesized.

In Formula (4), nB is preferably 0, because the hole transportability and durability of a light-emitting device manufactured using the polymer compound according to the present embodiment are more excellent.

In Formula (4), m is preferably 1 or 2 and more preferably 2, because the hole transportability and durability of a light-emitting device manufactured using the polymer compound according to the present embodiment are more excellent and in view of converting an organic film comprising the polymer compound according to the present embodiment into an insolubilized organic film.

In Formula (4), the alkylene group represented by $L^c$ and $L^d$ may be any of linear, branched, and cyclic and optionally has a substituent; the linear alkylene group is preferable, because a monomer as a raw material is easily synthesized. The number of carbon atoms of the linear alkylene group and the branched alkylene group is preferably from 1 to 20, more preferably from 1 to 10, and further preferably from 1 to 6. The number of carbon atoms of the cyclic alkylene group is preferably from 3 to 20, more preferably from 3 to 10, and further preferably from 3 to 6. The number of carbon atoms of the branched alkylene group is particularly preferably from 3 to 6 without comprising the number of carbon atoms of the substituent unless otherwise specified.

Examples of the alkylene group may include a methylene group, a 1,2-ethylene group, a 1,3-propylene group, a 1,3-butylene group, a 1,3-pentylene group, a 1,4-pentylene group, a 1,5-pentylene group, a 1,4-hexylene group, a 1,6-hexylene group, a 1,7-heptylene group, a 1,6-octylene group, and a 1,8-octylene group.

In Formula (4), the phenylene group represented by $L^c$ and $L^d$ optionally has a substituent. The phenylene group may be any of a 1,2-phenylene group, a 1,3-phenylene group, and a 1,4-phenylene group. Examples of the substituent that the phenylene group optionally has may include an alkyl group, an alkoxy group, a halogen atom, and a cyano group.

In Formula (4), $L^c$ is preferably a phenylene group, because a monomer as a raw material is easily synthesized.

In Formula (4), $L^d$ is preferably an alkylene group, because a monomer as a raw material is easily synthesized.

In Formula (4), $L^B$ is preferably an oxygen atom, because a monomer as a raw material is easily synthesized.

In Formula (4), X means the same meaning as X in Formula (2) and has the same examples and preferable ranges as those in Formula (2).

In Formula (4), $R^3$ is preferably an alkyl group optionally having a substituent or an aryl group optionally having a substituent, more preferably an aryl group optionally having a substituent, and further preferably an aryl group substituted with an alkyl group, because the hole transportability and durability of the light-emitting device manufactured using the polymer compound according to the present embodiment are more excellent.

In Formula (4), the fluorene ring optionally has a substituent; the substituent is preferably an alkyl group, an alkoxy group, an aryl group, an aryloxy group, an arylalkyl group, an arylalkoxy group, an arylalkenyl group, arylalkynyl group, an amino group, a substituted amino group, a halogen atom, an acyl group, an acyloxy group, a monovalent heterocyclic group, a carboxy group, a nitro group, or a cyano group, more preferably an alkyl group, an alkoxy group, an aryl group, an aryloxy group, an arylalkyl group, an arylalkoxy group, a substituted amino group, an acyl group, or a cyano group, and further preferably an alkyl group, an alkoxy group, or an aryl group.

In Formula (2), the constitutional unit with n=0 is, for example, preferably any constitutional unit represented by Formulae (2-01) to (2-45), more preferably any constitutional unit represented by Formulae (2-01) to (2-04), (2-06), (2-07), (2-09), (2-10), (2-13), (2-14), (2-16) to (2-27), (2-29) to (2-40) and (2-44), further preferably any constitutional unit represented by Formulae (2-01) to (2-04), (2-06), (2-07), (2-09), (2-10), (2-14), (2-17), (2-18), (2-21) to (2-25), (2-27), and (2-29) to (2-40), and particularly preferably any constitutional unit represented by Formulae (2-02), (2-03), (2-06), (2-09), (2-10), (2-23) to (2-25), (2-27), and (2-29) to (2-40).

[Chemical Formula 24]

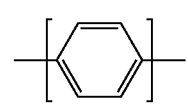

(2-01)

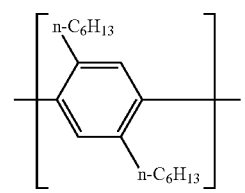

(2-02)

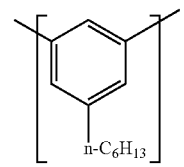

(2-03)

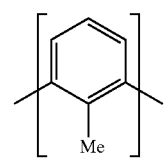

(2-04)

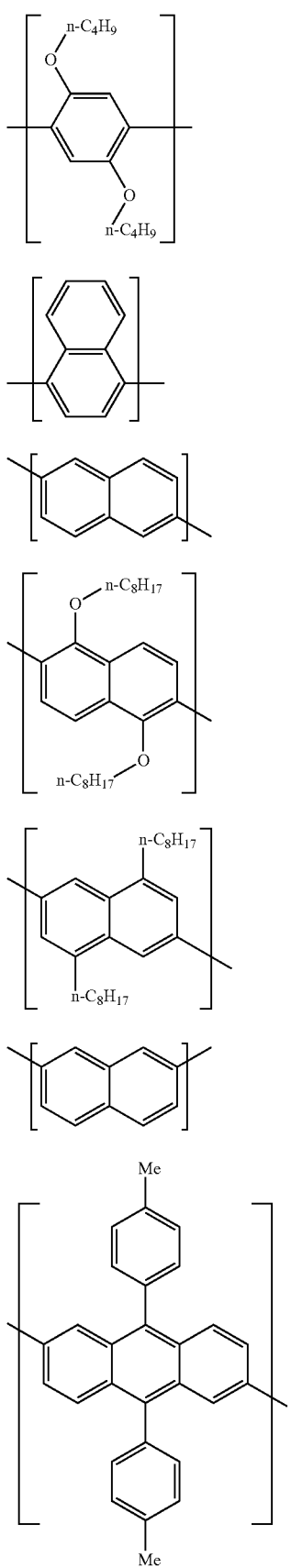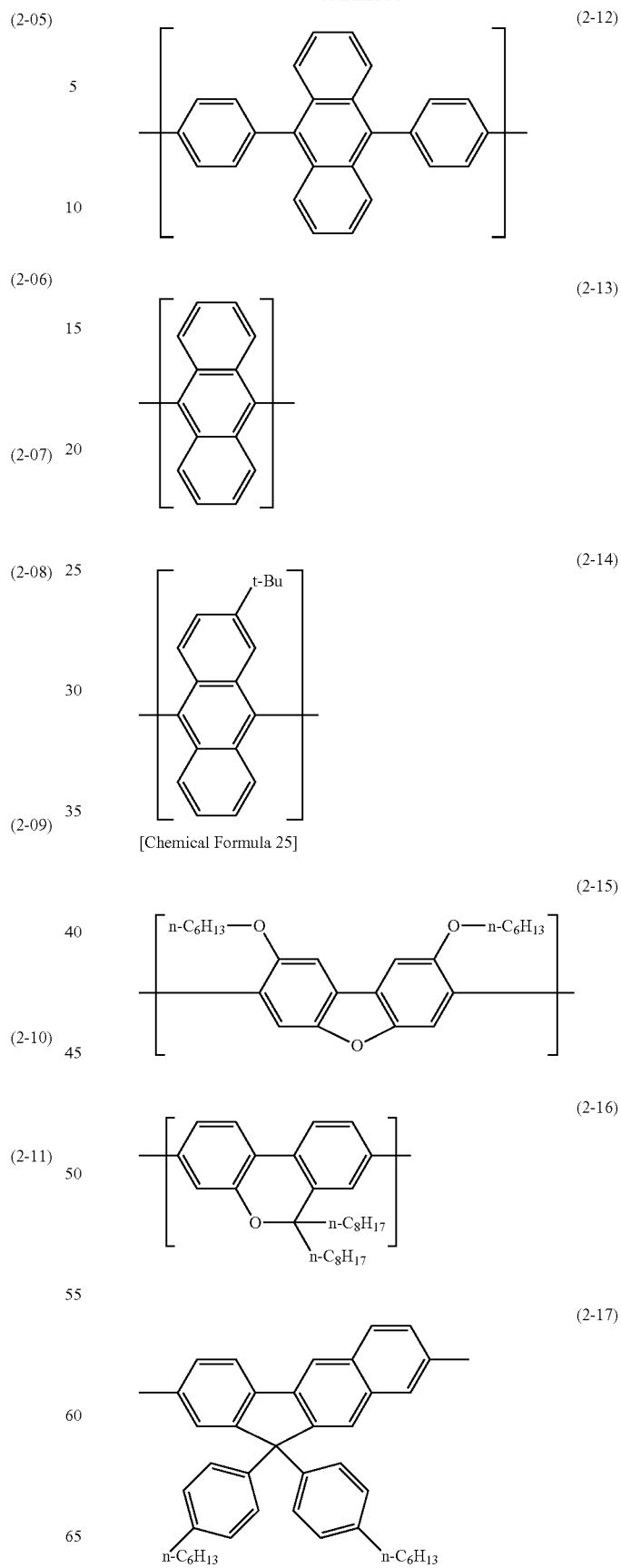
[Chemical Formula 25]

(2-18)
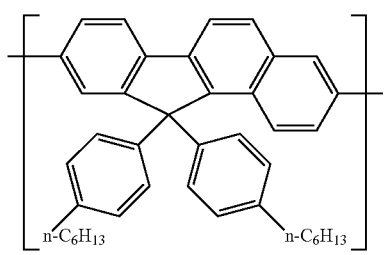
(2-19)
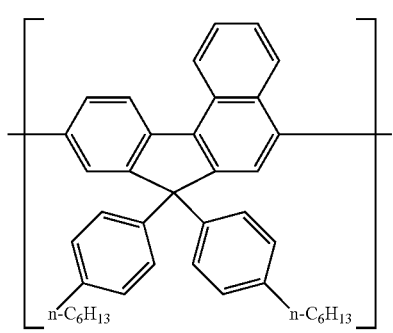
(2-20)
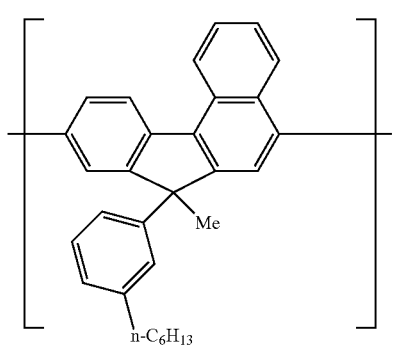
[Chemical Formula 26]
(2-21)
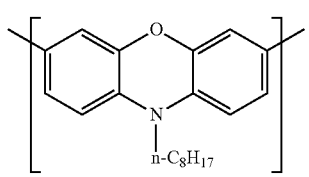
(2-22)
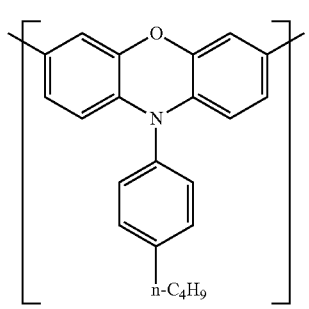
(2-23)
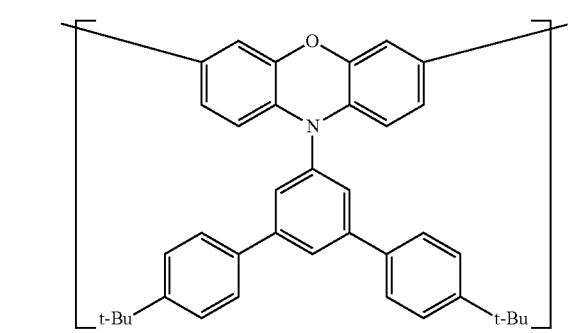
(2-24)
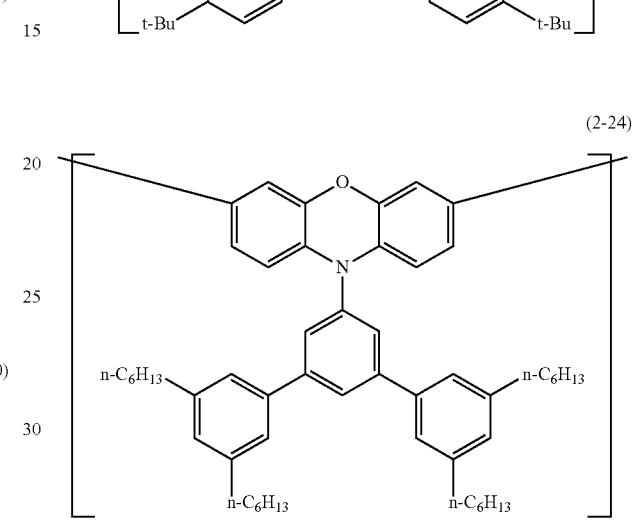
(2-25)
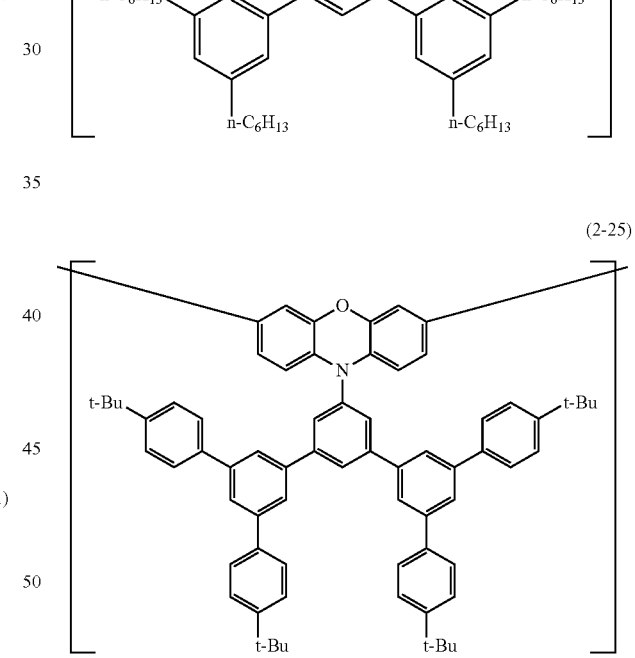
[Chemical Formula 27]
(2-26)
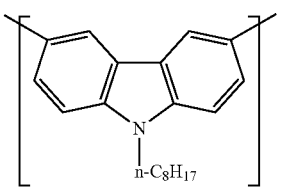

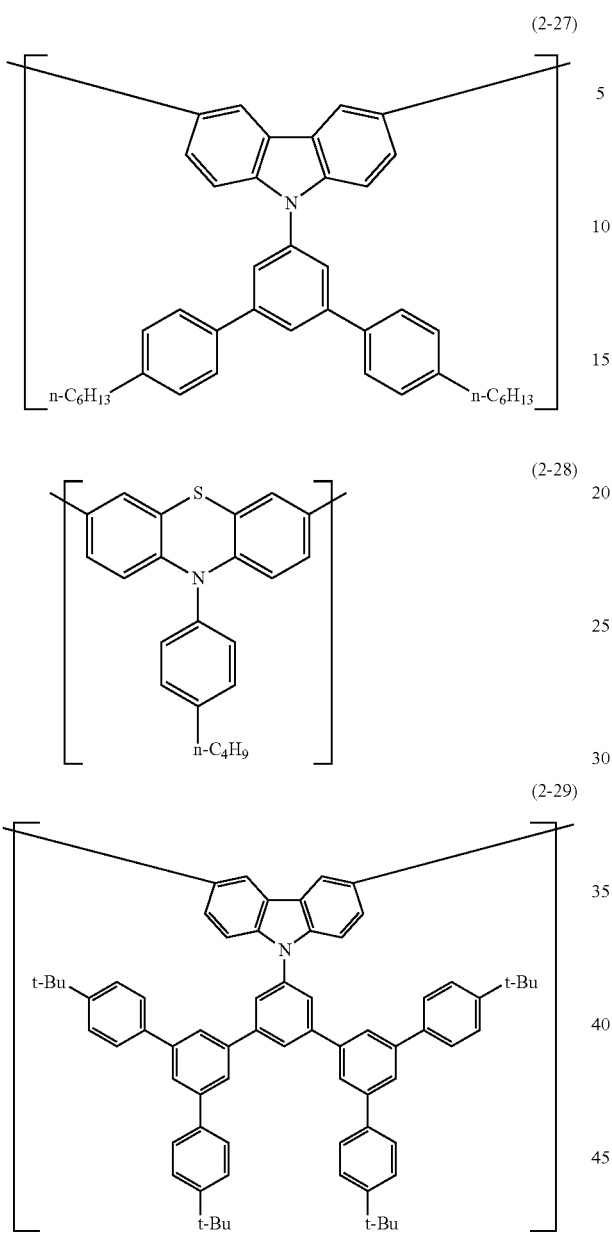
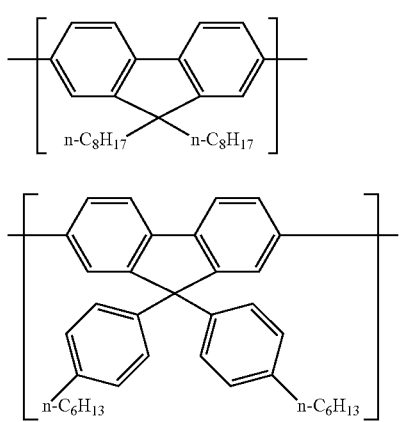
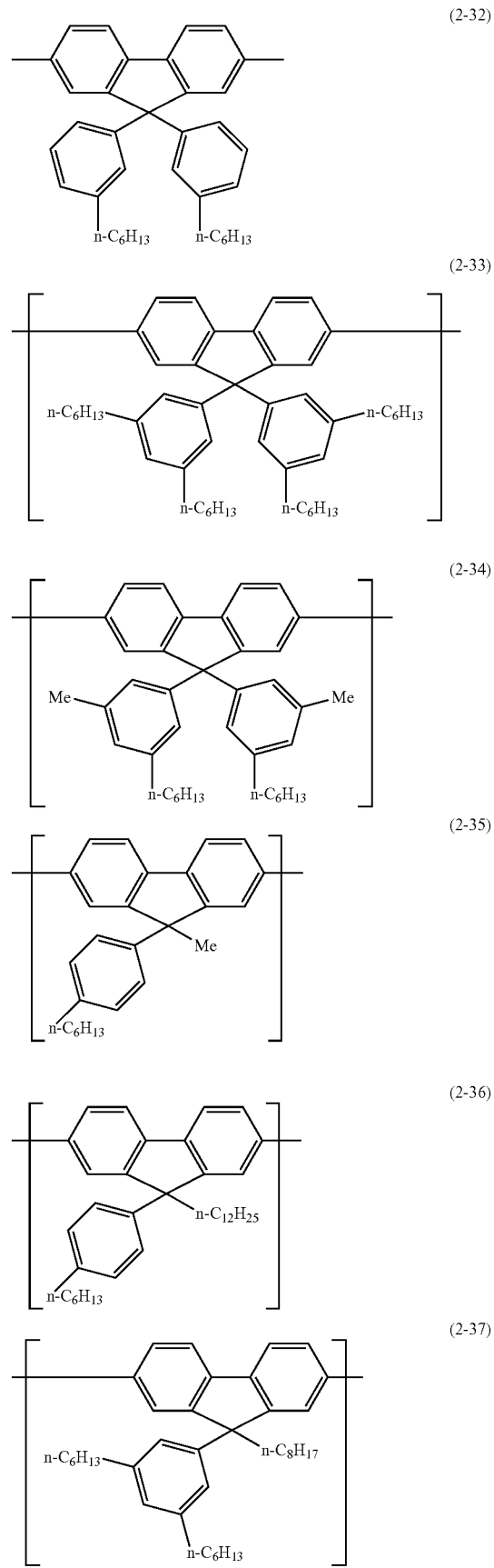

-continued (2-38)
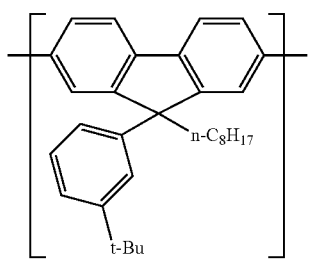

[Chemical Formula 29]

(2-39)
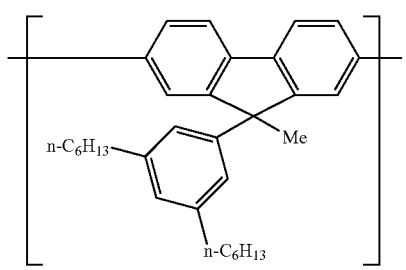

(2-40)
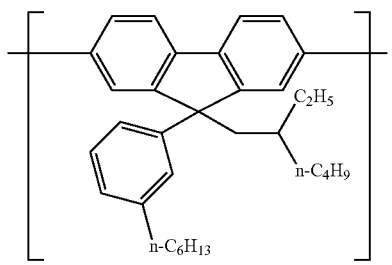

(2-41)
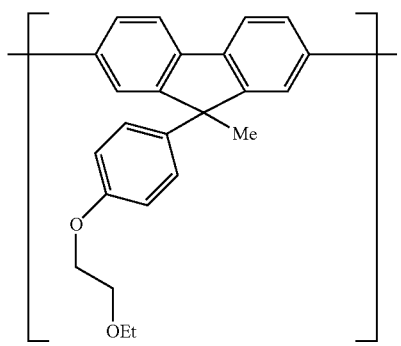

(2-42)
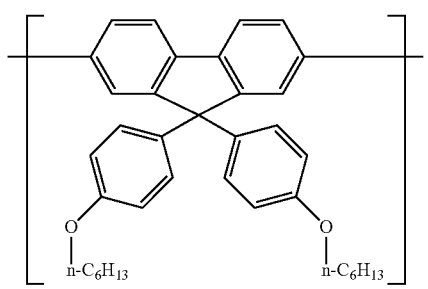

-continued (2-43)
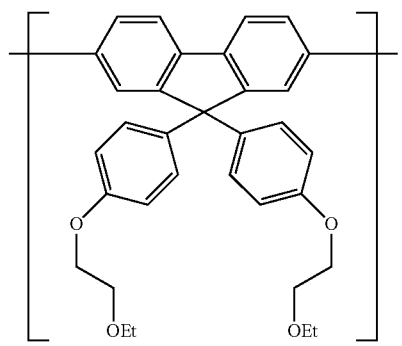

(2-44)
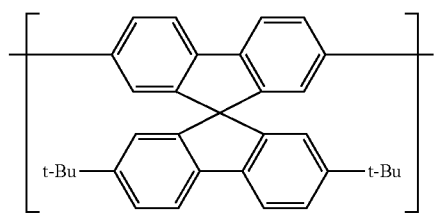

(2-45)
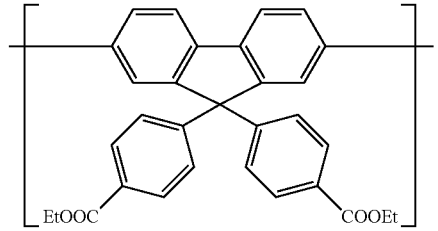

In Formula (2), the constitutional unit with n≥1 is, for example, preferably any constitutional unit represented by Formulae (2-101) to (2-139), more preferably any constitutional unit represented by Formulae (2-101), (2-107), (2-109) to (2-112), (2-118), and (2-125) to (2-136), further preferably any constitutional unit represented by Formulae (2-101), (2-107), (2-110), (2-112), (2-125), (2-127), (2-129), (2-130), and (2-133) to (2-136), and particularly preferably any constitutional unit represented by Formulae (2-101), (2-110), (2-112), (2-125), (2-127), (2-129), (2-133), and (2-135).

[Chemical Formula 30]

(2-101)
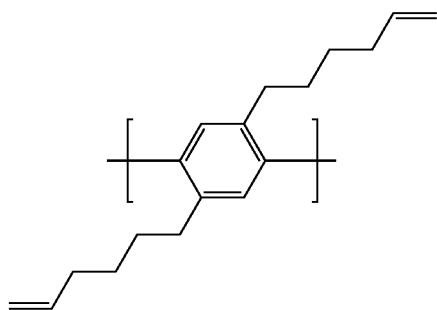

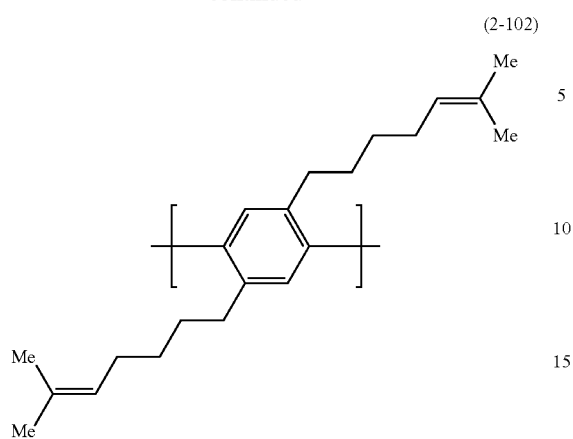
(2-102)
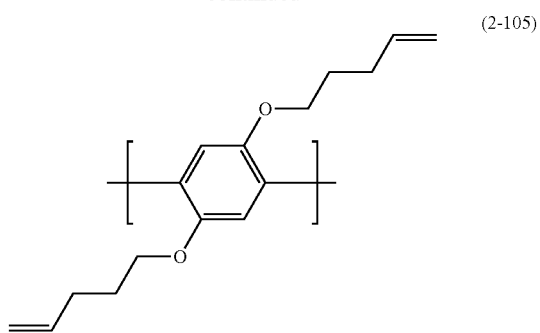
(2-105)
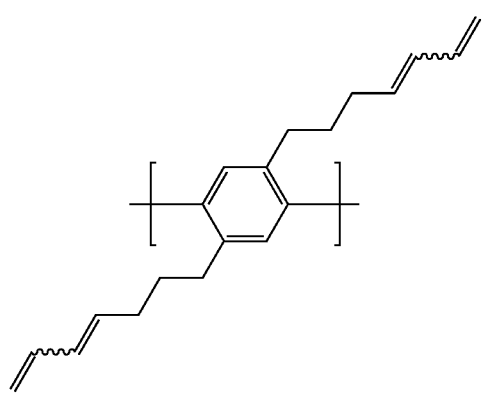
(2-103)
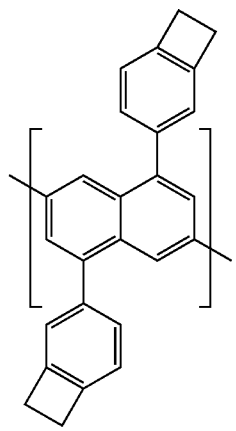
(2-106)
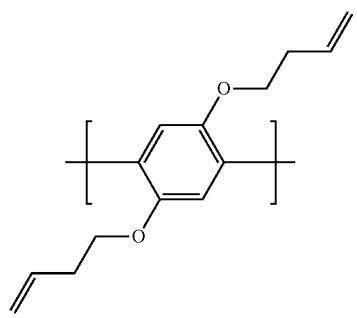
(2-104)
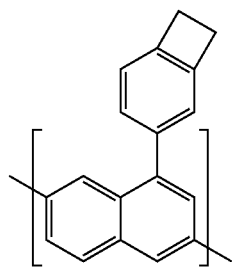
(2-107)
(2-108)

[Chemical Formula 31]
(2-109)
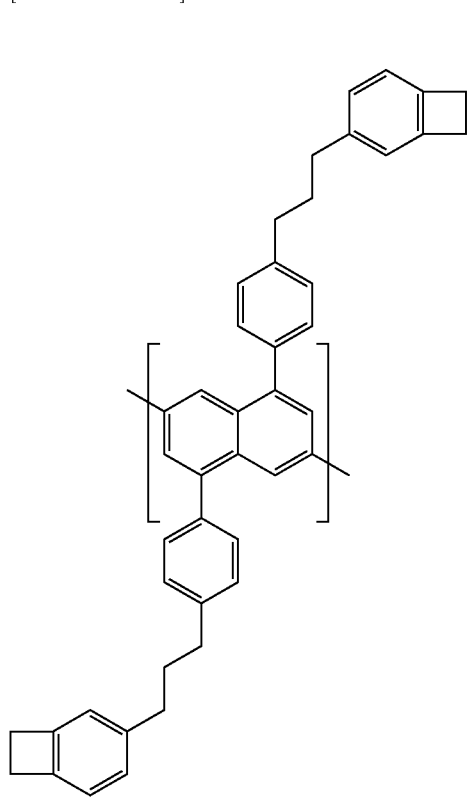
(2-110)
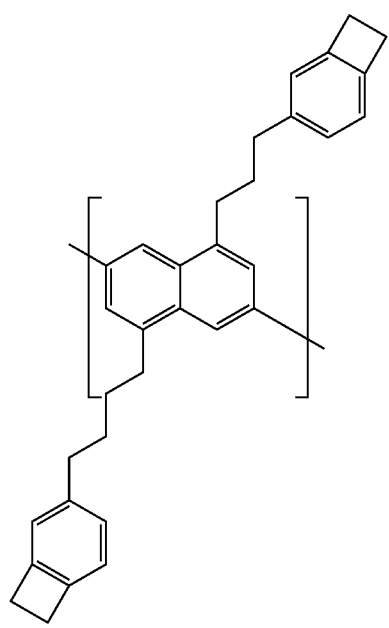
(2-111)
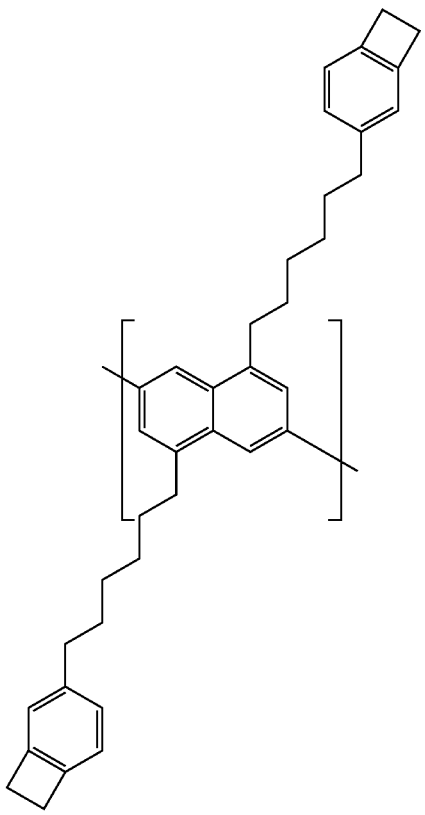
(2-112)
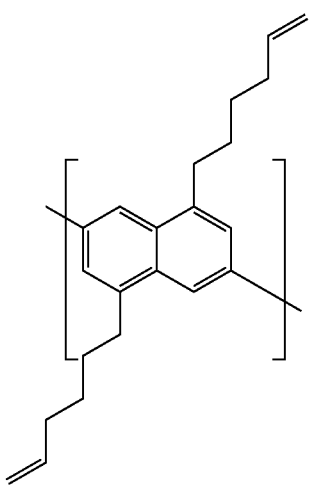

-continued
(2-113)
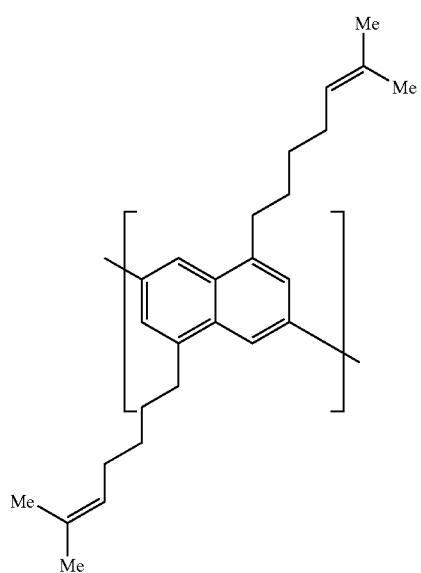
(2-114)
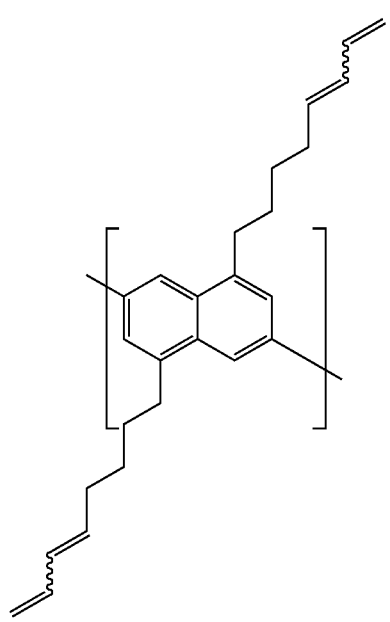
(2-115)
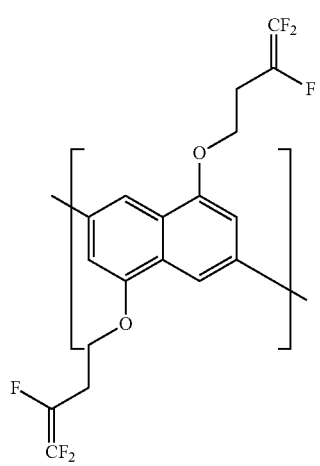
(2-116)
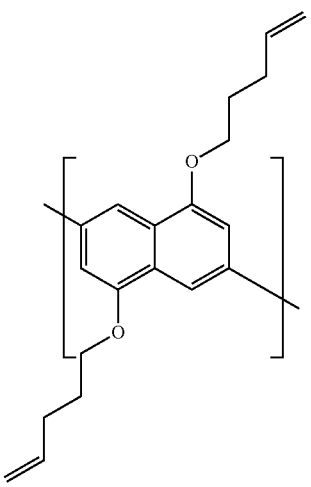
[Chemical Formula 32]
(2-117)
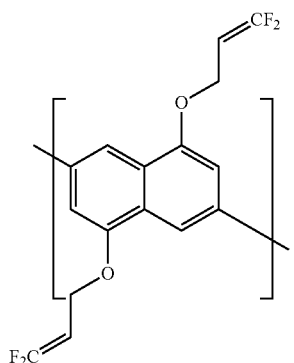
(2-118)
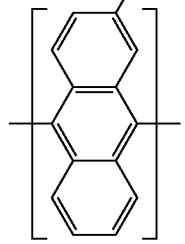
(2-119)
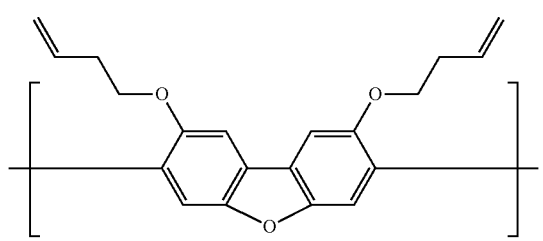

-continued
(2-120)
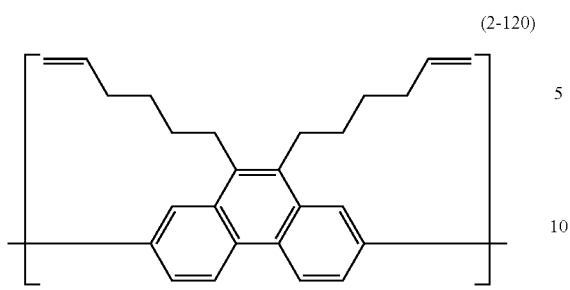
(2-121)
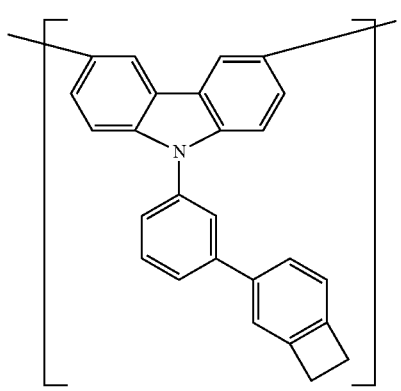
(2-122)
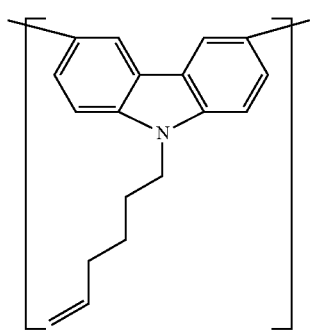
[Chemical Formula 33]
(2-123)
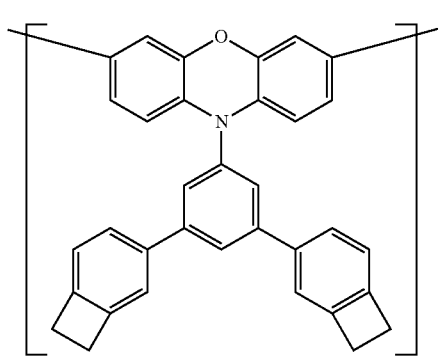
-continued
(2-124)
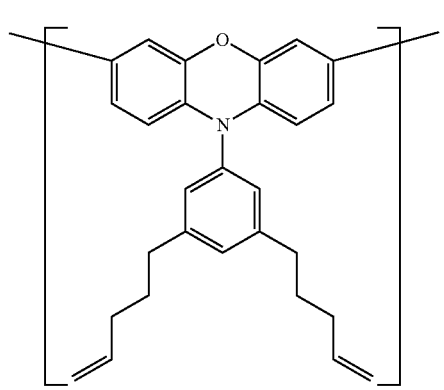
[Chemical Formula 34]
(2-125)
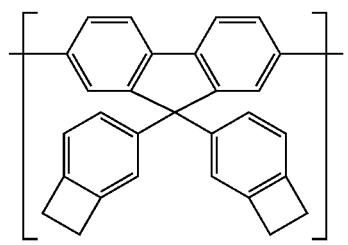
(2-126)
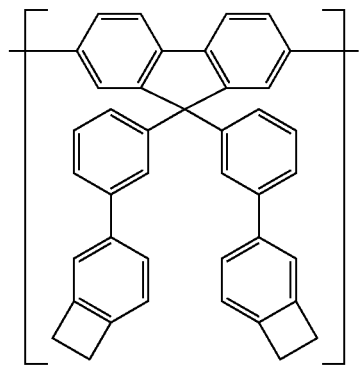
(2-127)
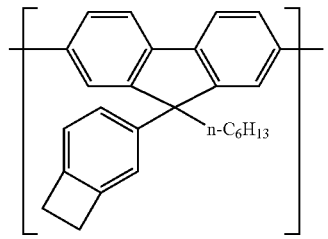
(2-128)
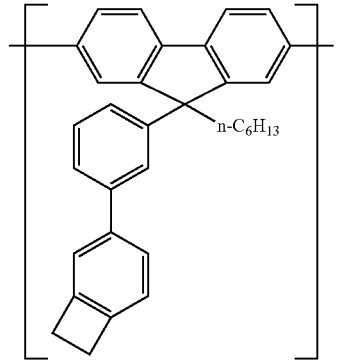

(2-129)
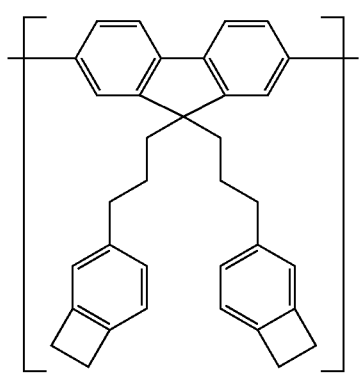
(2-130)
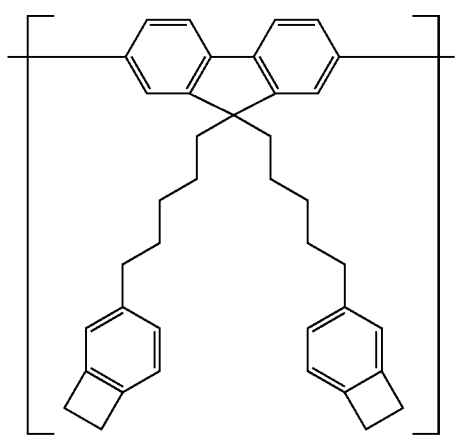
[Chemical Formula 35]
(2-131)
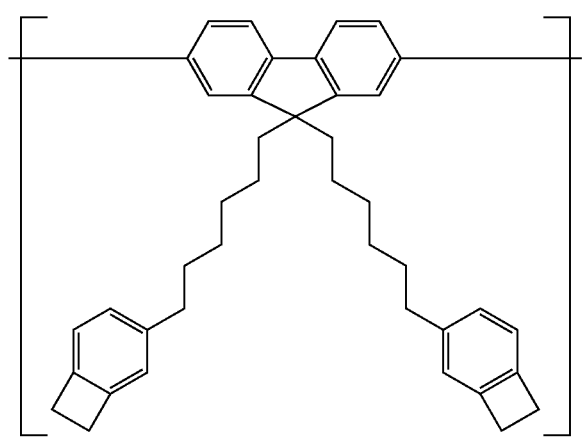
(2-132)
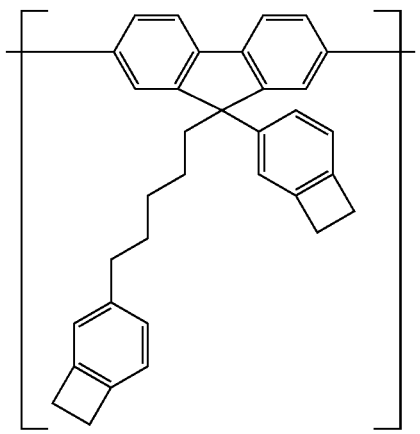
(2-133)
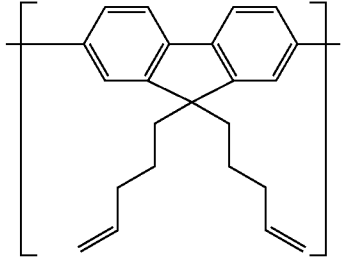
(2-134)
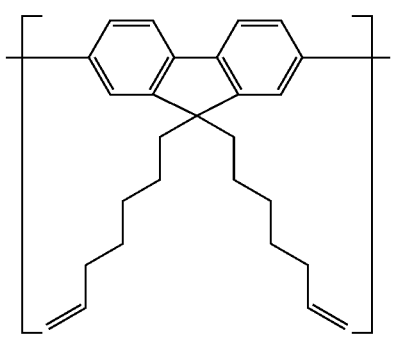
(2-135)
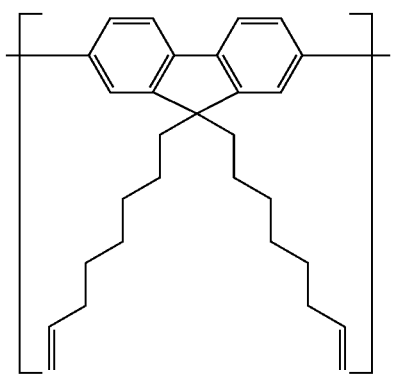

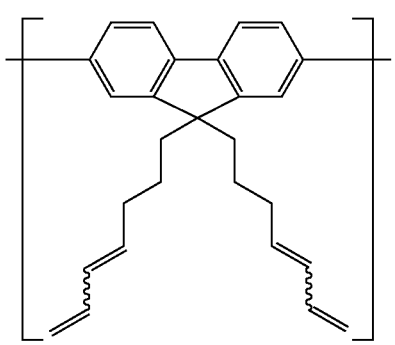

(2-136)

[Chemical Formula 36]

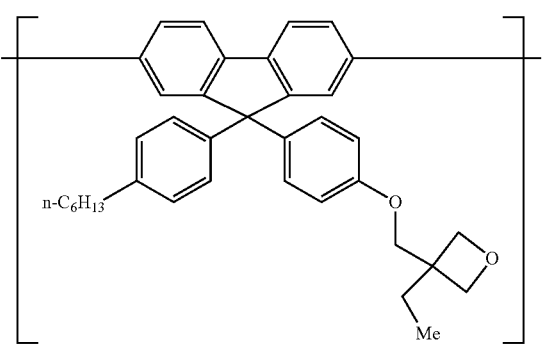

(2-137)

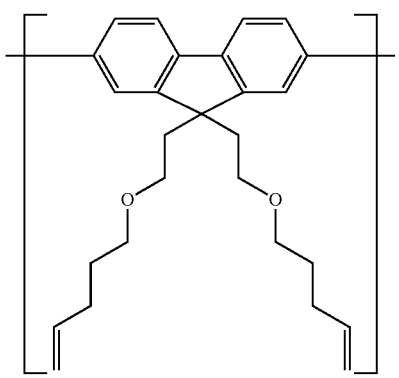

(2-138)

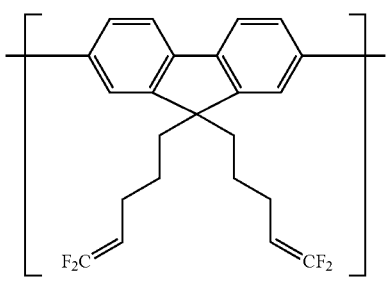

(2-139)

In Formulae (2-103), (2-114), and (2-136), each wavy line means that the arrangement of the bonded groups may be either the E type or the Z type.

When n=0 in Formula (2), the amount of the second constitutional unit is preferably from 0.5% by mol to 40% by mol, more preferably from 1% by mol to 30% by mol, and further preferably from 5% by mol to 20% by mol with respect to the total amount of all constitutional units, because the hole transportability and durability of a light-emitting device manufactured using the polymer compound according to the present embodiment are more excellent.

When n≥1 in Formula (2), the amount of the second constitutional unit is preferably from 0.5% by mol to 40% by mol, more preferably from 3% by mol to 30% by mol, and further preferably from 3% by mol to 20% by mol with respect to the total amount of all constitutional units, because the hole transportability and durability of a light-emitting device manufactured using the polymer compound according to the present embodiment are more excellent and the crosslinkability is excellent.

The polymer compound according to the present embodiment optionally has, as the second constitutional unit, only one type of the above constitutional units or optionally has two or more different types of the above constitutional units. In view of converting an organic film into an insolubilized organic film, the polymer compound preferably comprises at least one type of the monovalent crosslinking groups represented by Formula (X-1), comprises at least one type of the monovalent crosslinking groups represented by Formula (X-2), or comprises at least each one of the monovalent crosslinking groups represented by Formula (X-1) and the monovalent crosslinking groups represented by Formula (X-2). The polymer compound more preferably comprises at least each one of the monovalent crosslinking groups represented by Formula (X-1) and the monovalent crosslinking groups represented by Formula (X-2).

(Third Constitutional Unit)

The third constitutional unit is the constitutional unit represented by Formula (3).

In Formula (3), c is preferably 0, because a monomer as a raw material is easily synthesized and the hole transportability and durability of a light-emitting device manufactured using the polymer compound according to the present embodiment are more excellent.

In Formula (3), the groups represented by $Ar^6$, $Ar^7$, and $Ar^8$ are preferably an arylene group optionally having a substituent, because the hole transportability and durability of a light-emitting device manufactured using the polymer compound according to the present embodiment are more excellent.

In Formula (3), the arylene group in $Ar^6$, $Ar^7$, and $Ar^8$ is selected from the group consisting of a 1,2-phenylene group, a 1,3-phenylene group, a 1,4-phenylene group, a 1,4-naphthalenediyl group, a 2,6-naphthalenediyl group, a 2,7-naphthalenediyl group, a 2,6-anthracenediyl group, a 9,10-anthracenediyl group, a 2,7-phenanthrenediyl group, a 5,12-naphthacenediyl group, a 2,7-fluorenediyl group, a 3,6-fluorenediyl group, a 1,6-pyrenediyl group, a 2,7-pyrenediyl group, and a 3,8-perylenediyl group, for example; preferably a 1,4-phenylene group, a 2,7-fluorenediyl group, a 2,6-anthracenediyl group, a 9,10-anthracenediyl group, a 2,7-phenanthrenediyl group, and a 1,6-pyrenediyl group; and more preferably a 1,4-phenylene group. These groups optionally have the above substituent.

In Formula (3), the divalent heterocyclic group in $Ar^6$, $Ar^7$, and $Ar^8$ is selected from the group consisting of a 2,5-pyrroldiyl group, a dibenzofurandiyl group, a dibenzothiophenediyl group, and a 2,1,3-benzothiadiazole-4,7-diyl group, for example. These groups optionally have the above substituent.

In Formula (3), the divalent group made by linking two or more groups that are selected from the group consisting of an arylene group and a divalent heterocyclic group and may be the same as or different from each other in $Ar^7$ is preferably any group represented by Formulae (1a-1), (1a-2), (1a-3), (1a-4), (1a-5), (1a-6), and (1a-7), and more preferably the group represented by Formula (1a-1). These groups optionally have the above substituent.

In Formula (3), when the groups represented by $Ar^6$, $Ar^7$, and $Ar^8$ have a substituent, examples of the substituent may include an alkyl group, an alkoxy group, an aryl group, an aryloxy group, an arylalkyl group, an arylalkoxy group, an arylalkenyl group, an arylalkynyl group, an amino group, a substituted amino group, a halogen atom, an acyl group, an acyloxy group, a monovalent heterocyclic group, a carboxy group, a nitro group, and a cyano group; preferably an alkyl group, an alkoxy group, an aryl group, an aryloxy group, an arylalkyl group, an arylalkoxy group, a substituted amino group, an acyl group, and a cyano group; and more preferably an alkyl group, an alkoxy group, and an aryl group.

In Formula (3), examples of the monovalent crosslinking groups represented by $R^1$ and $R^2$ may include groups represented by Formulae (X-1), (X-2), (X-01) to (X-18); preferably groups represented by Formulae (X-1), (X-2), (X-01), (X-03), (X-04), and (X-06) to (X-18); more preferably groups represented by Formulae (X-1), (X-2), and (X-07) to (X-18); and further preferably a group represented by Formula (X-1), because the hole transportability and durability of a light-emitting device manufactured using the polymer compound according to the present embodiment are more excellent.

In Formula (3), the alkyl group optionally having a substituent represented by $R^2$ is the same as the "alkyl group" described as the above substituent and is preferably a $C_{1-20}$ alkyl group.

In Formula (3), the aryl group optionally having a substituent represented by $R^2$ is the same as the "aryl group" described as the above substituent and is preferably a phenyl group, a 1-naphthyl group, a 2-naphthyl group, a 1-anthracenyl group, a 2-anthracenyl group, a 9-anthracenyl group, or a 2-fluorenyl group.

In Formula (3), the monovalent heterocyclic group optionally having a substituent represented by $R^2$ is the same as the "monovalent heterocyclic group" described as the above substituent and is preferably a pyridyl group, a pyrimidyl group, a triazyl group, or a quinolyl group.

In Formula (3), $R^2$ is preferably the same monovalent crosslinking group as $R^1$, because a monomer as a raw material is easily synthesized.

In Formula (3), when the group represented by $R^2$ has a substituent, the substituent is preferably an alkyl group, an alkoxy group, an aryl group, an aryloxy group, an arylalkyl group, an arylalkoxy group, an arylalkenyl group, arylalkynyl group, an amino group, a substituted amino group, a halogen atom, an acyl group, an acyloxy group, a monovalent heterocyclic group, a carboxy group, a nitro group, or a cyano group, more preferably an alkyl group, an alkoxy group, an aryl group, an aryloxy group, an arylalkyl group, an arylalkoxy group, a substituted amino group, an acyl group, or a cyano group, and further preferably an alkyl group, an alkoxy group, or an aryl group.

Examples of the third constitutional unit may include constitutional units represented by Formulae (3-01) to (3-05); preferably constitutional units represented by Formulae (3-01), (3-02), (3-04), and (3-05); more preferably constitutional units represented by Formulae (3-01) and (3-02); and further preferably a constitutional unit represented by Formula (3-01).

[Chemical Formula 37]

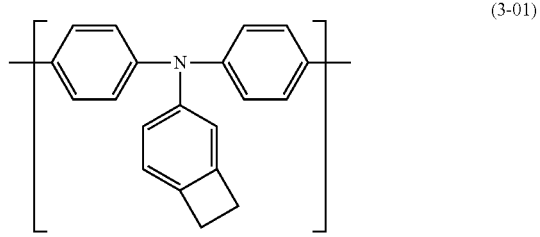

(3-01)

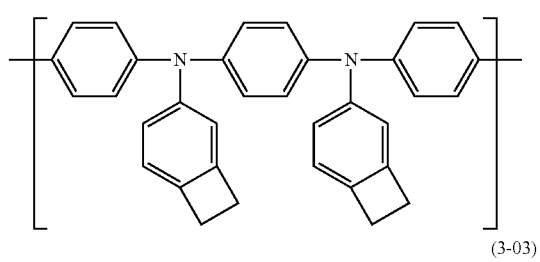

(3-02)

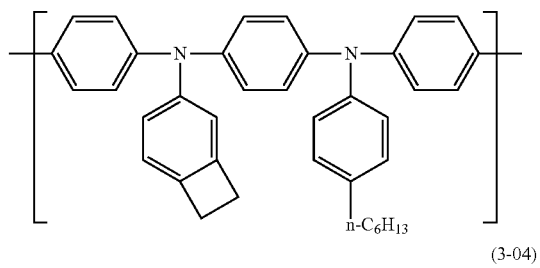

(3-03)

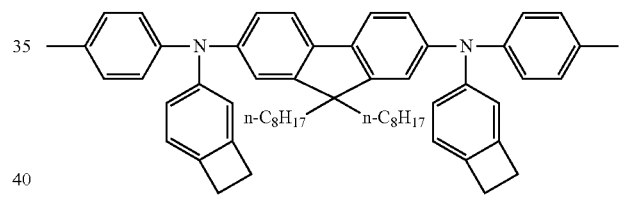

(3-04)

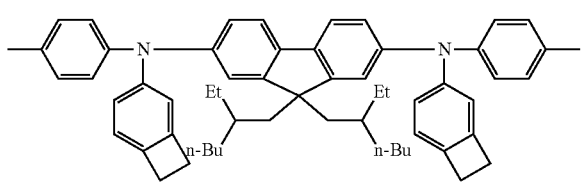

(3-05)

The amount of the third constitutional unit is preferably from 0.5% by mol to 40% by mol, more preferably from 3% by mol to 30% by mol, and further preferably from 3% by mol to 20% by mol with respect to the total amount of all constitutional units, because the hole transportability and durability of a light-emitting device manufactured using the polymer compound according to the present embodiment are more excellent and the crosslinkability is excellent.

The polymer compound according to the present embodiment optionally has, as the third constitutional unit, only one type of the above constitutional units or optionally has two or more different types of the above constitutional units.

The polymer compound according to the present embodiment optionally comprises the second constitutional unit and the third constitutional unit. When it comprises the second constitutional unit and the third constitutional unit, the total amount is preferably from 0.5% by mol to 40% by mol and more preferably from 3% by mol to 30% by mol with respect to the total amount of all constitutional units, because the hole transportability and durability of a light-emitting device manufactured using the polymer compound according to the present embodiment are more excellent and the crosslinkability is excellent.

The polymer compound according to the present embodiment is a polymer compound comprising the first constitutional unit represented by Formula (1) in an amount of 51% by mol or more with respect to the total amount of all constitutional units and comprising at least one of the constitutional unit represented by Formula (2) and the constitutional unit represented by Formula (3). The polymer compound according to the present embodiment preferably comprises the first constitutional unit and the second constitutional unit or comprises the first constitutional unit, the second constitutional unit, and the third constitutional unit and more preferably comprises the first constitutional unit and the second constitutional unit, because the crosslinkability is more excellent.

The following describes examples (P1 to P30) of combinations of the constitutional units in the polymer compound according to the present embodiment.

[Chemical Formula 38]

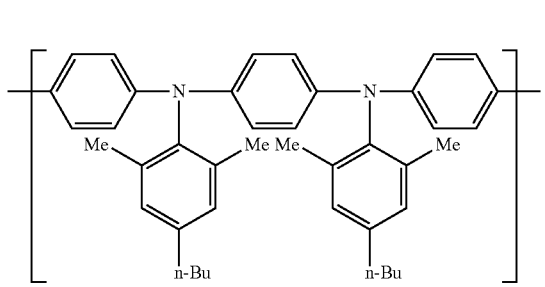
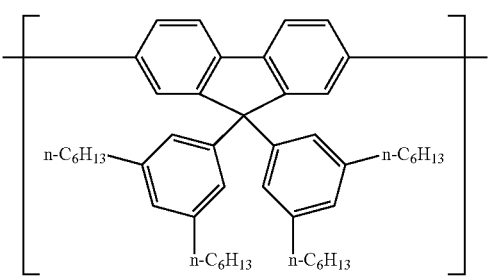

P1

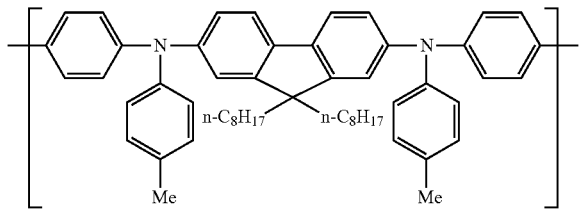
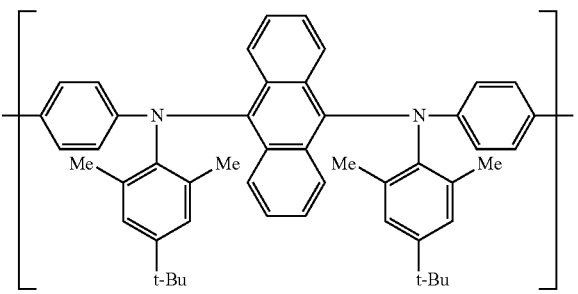

P2

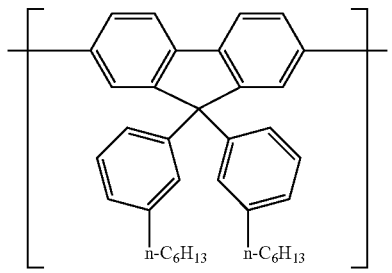

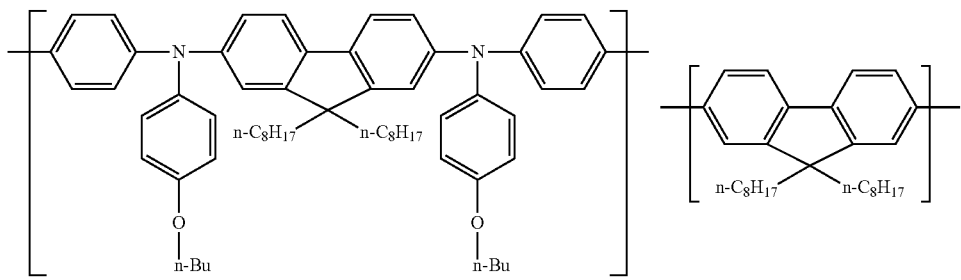

P3

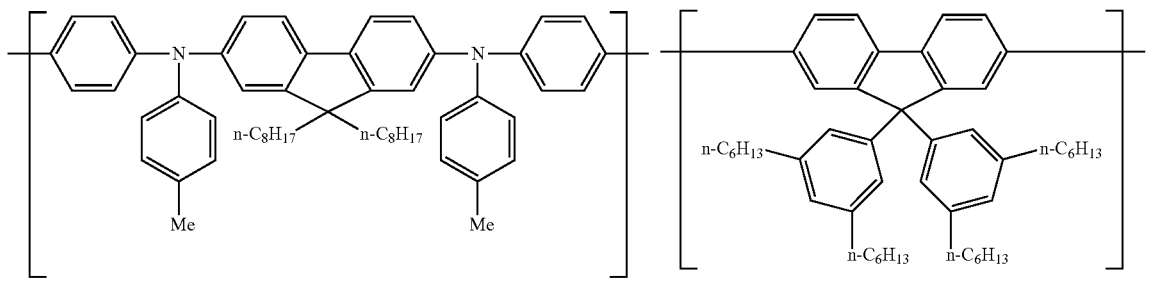
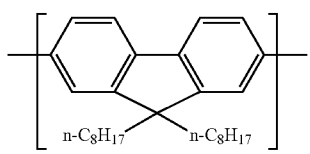
[Chemical Formula 39]
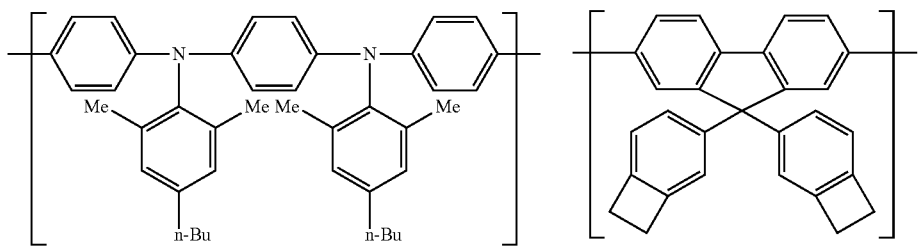
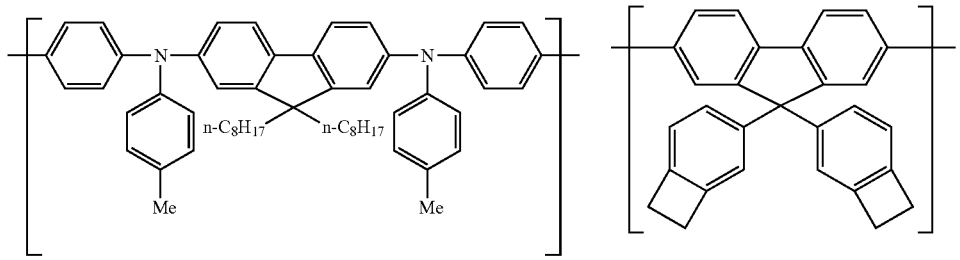
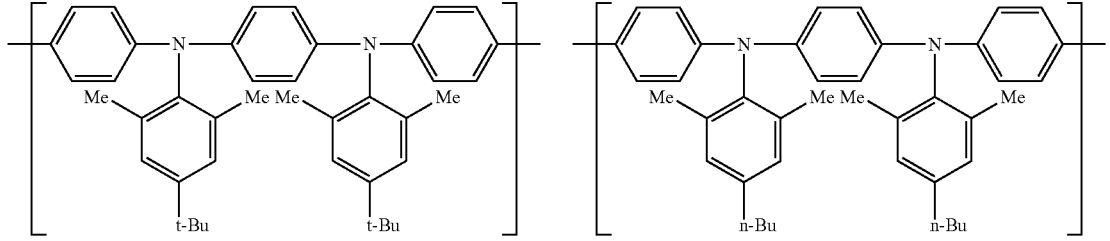
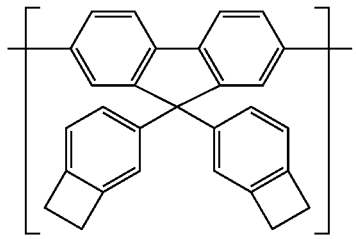

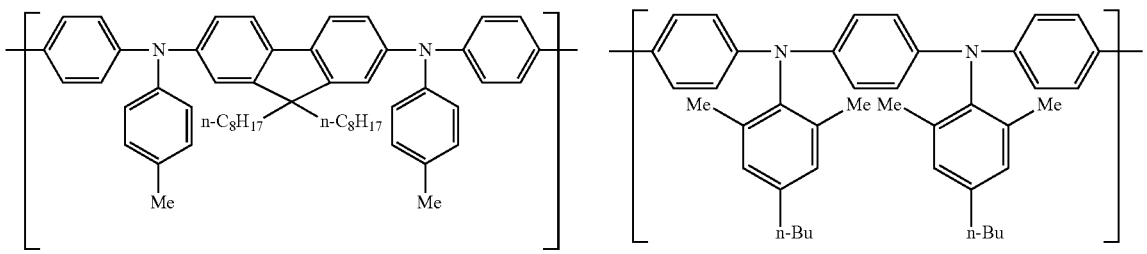
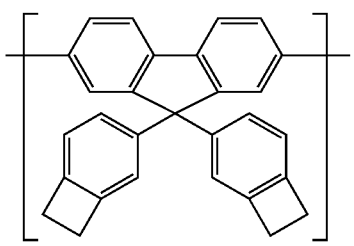
[Chemical Formula 40]
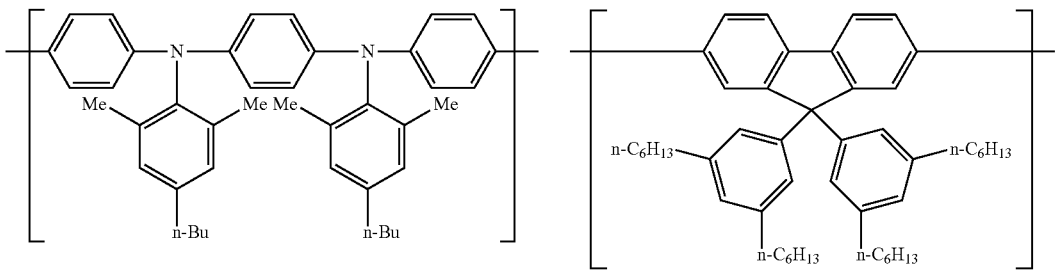
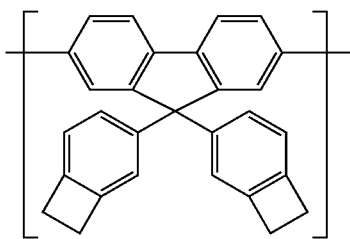
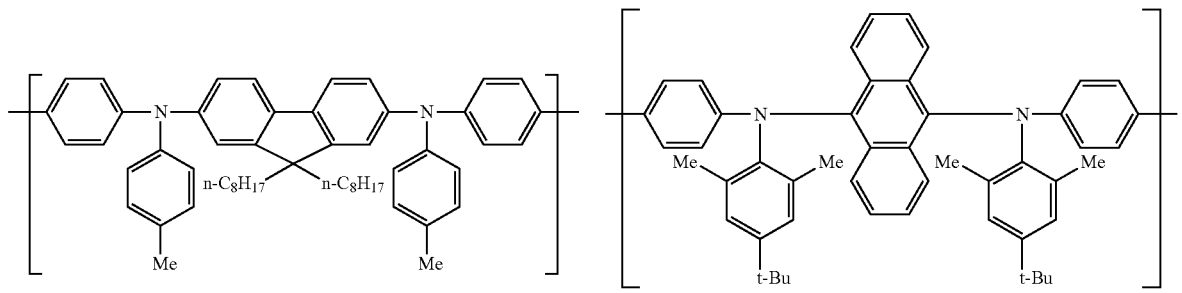

-continued
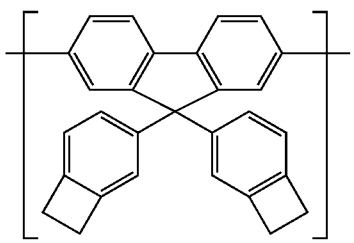
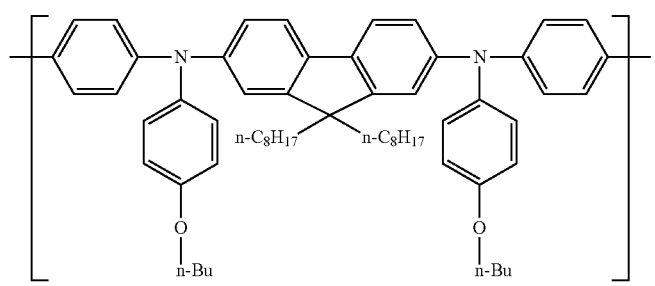
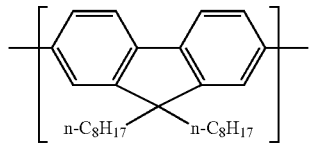
P11
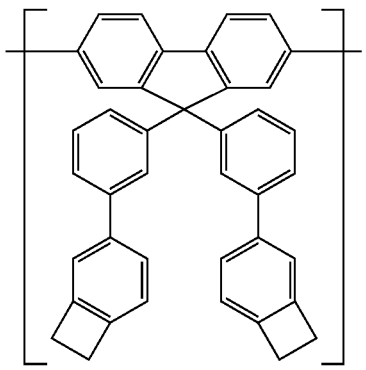
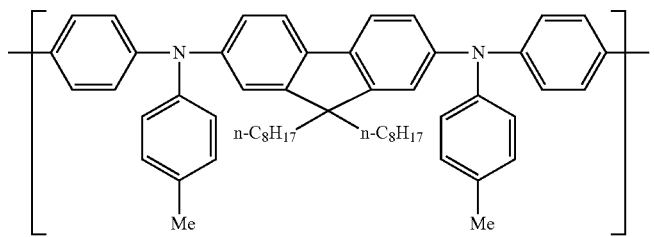
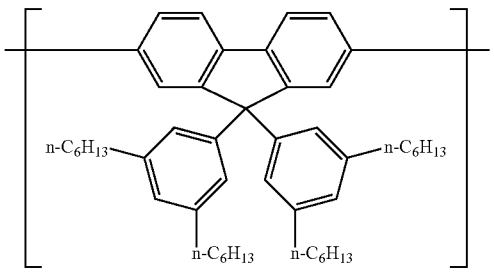
P12
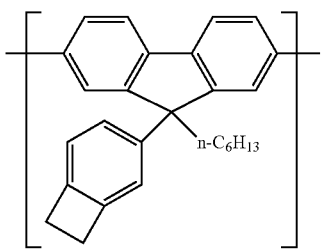

-continued
[Chemical Formula 41]
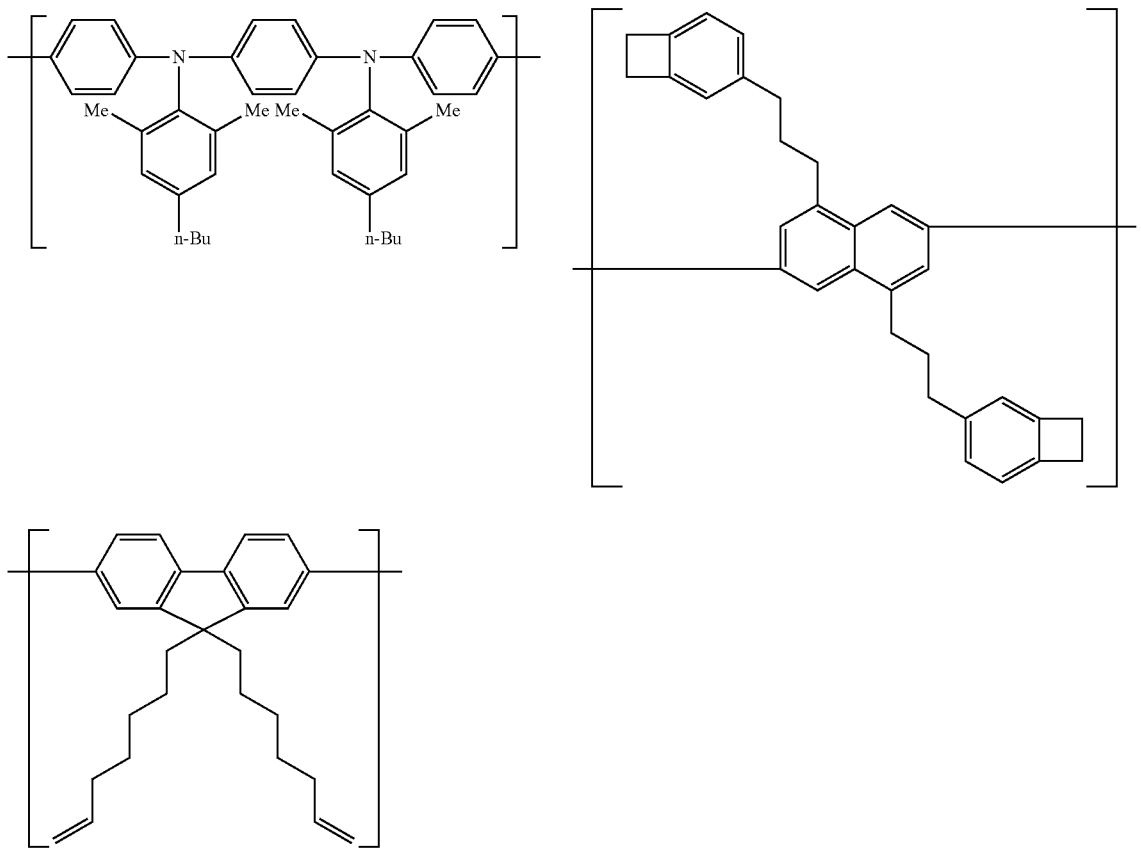
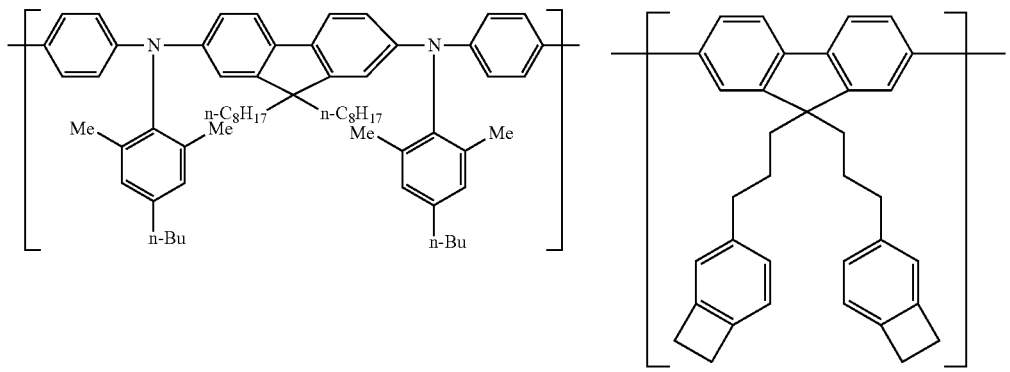
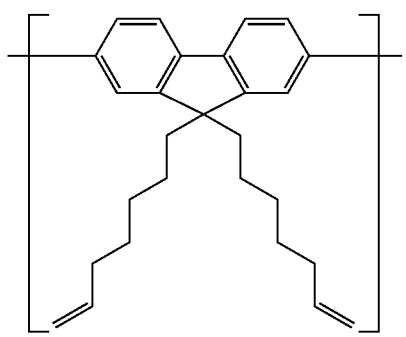

-continued
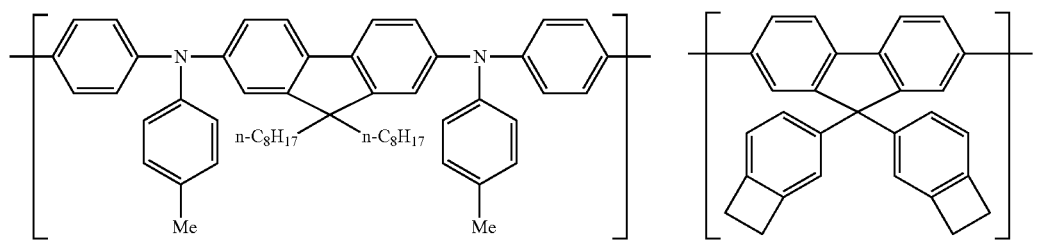
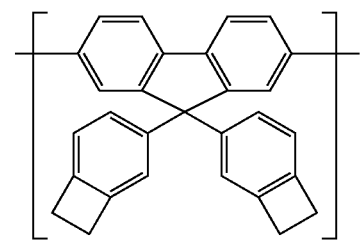
P15
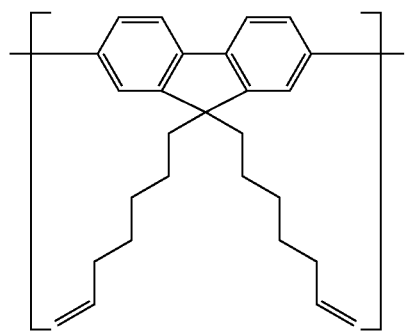
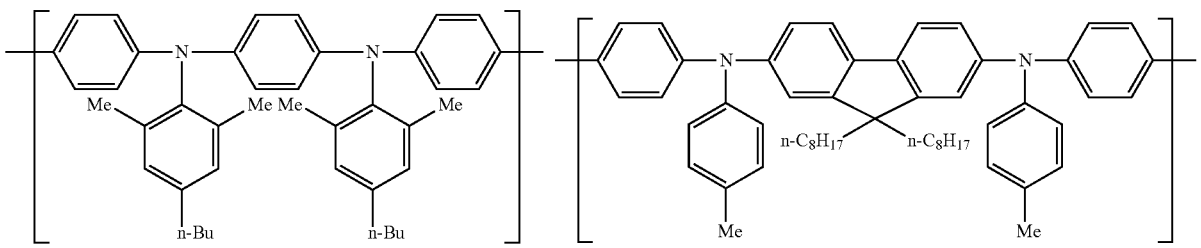
P16
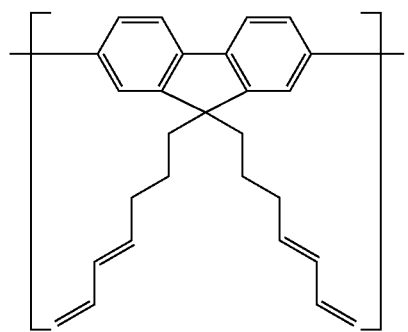
[Chemical Formula 42]
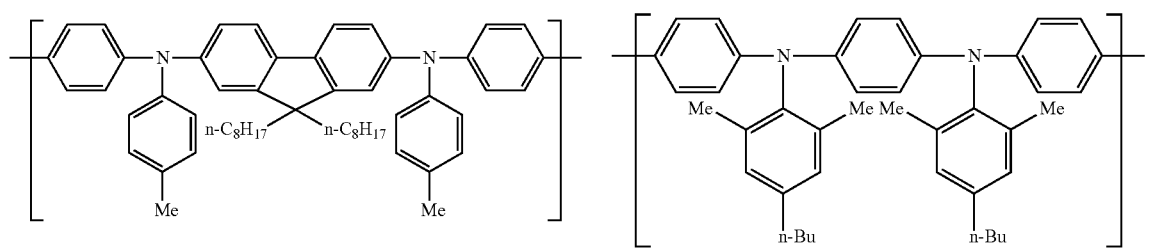
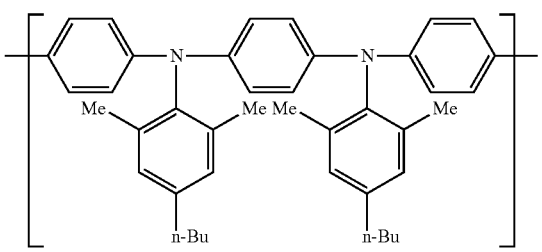
P17

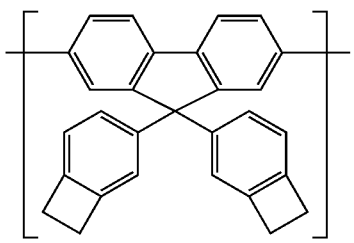
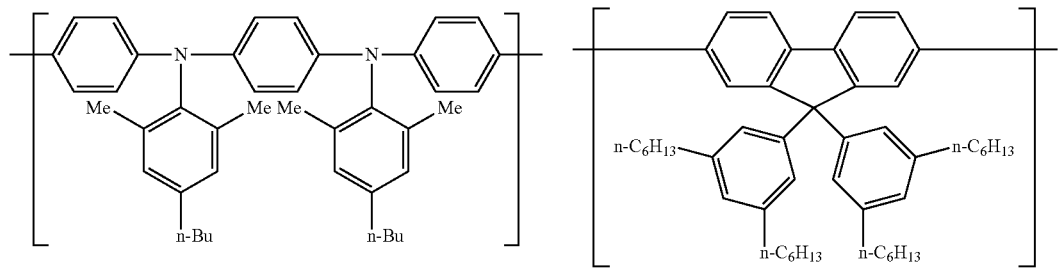
P18
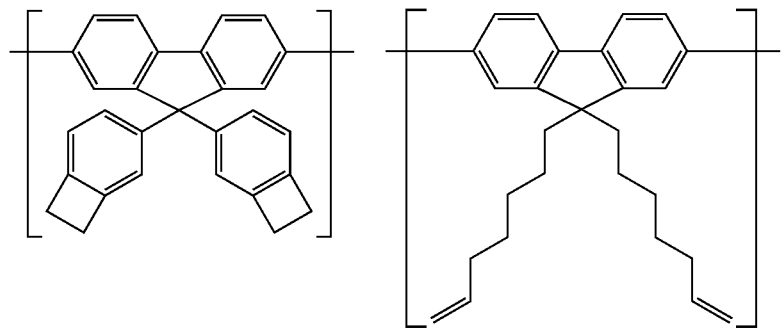
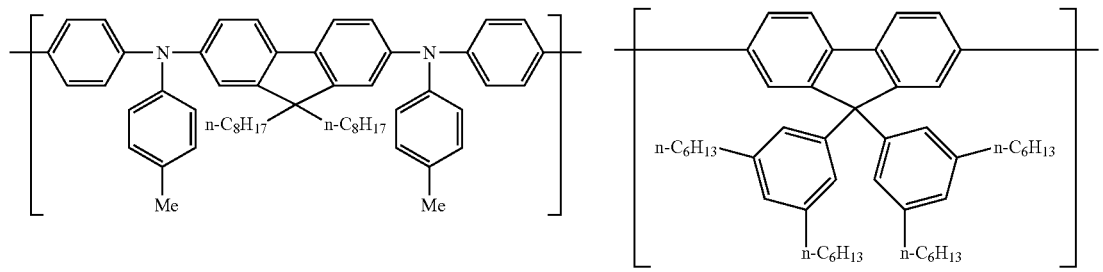
P19
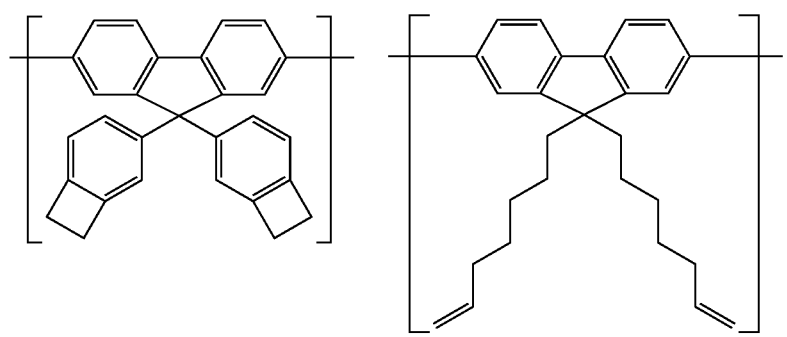

[Chemical Formula 43]
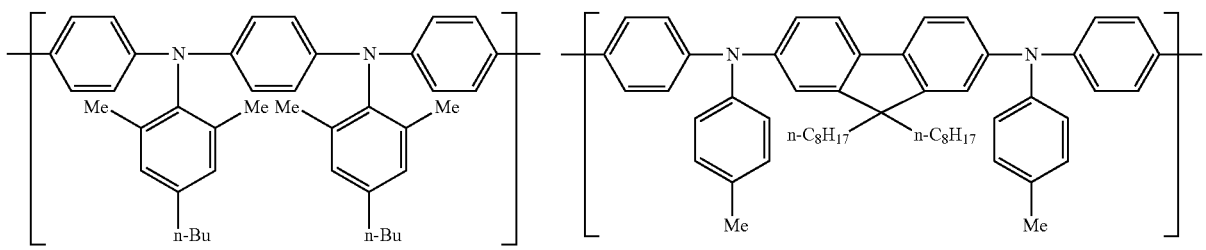
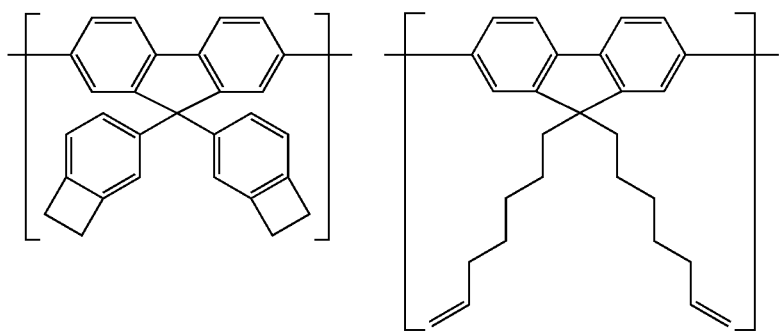
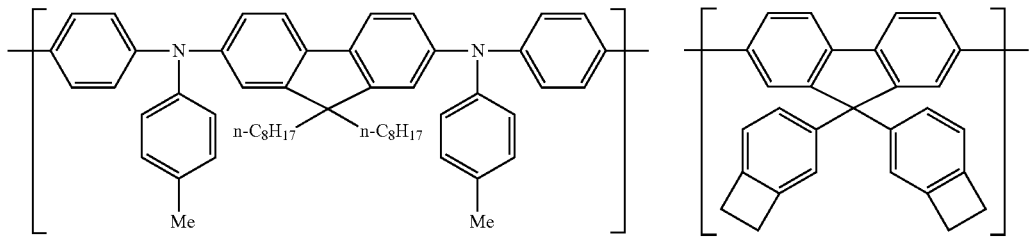
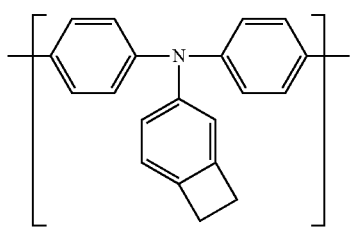
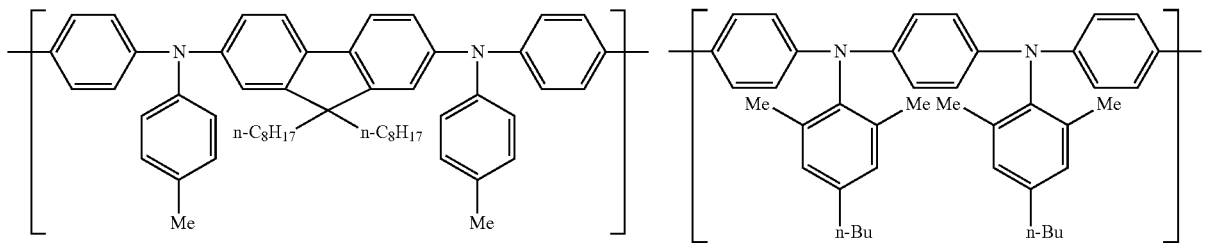

79
-continued
80
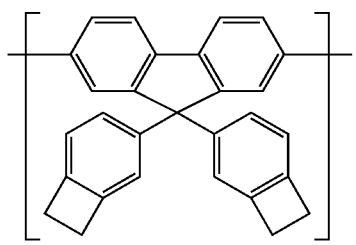 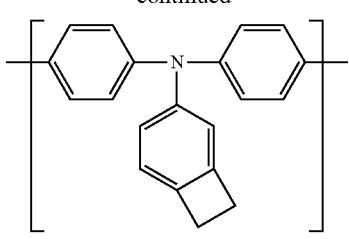 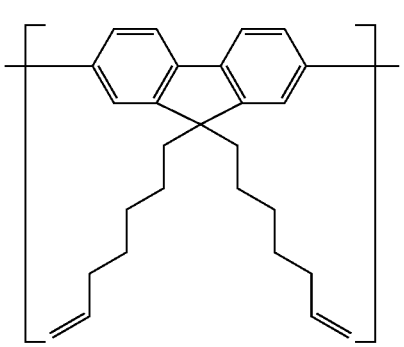
[Chemical Formula 44]
P23
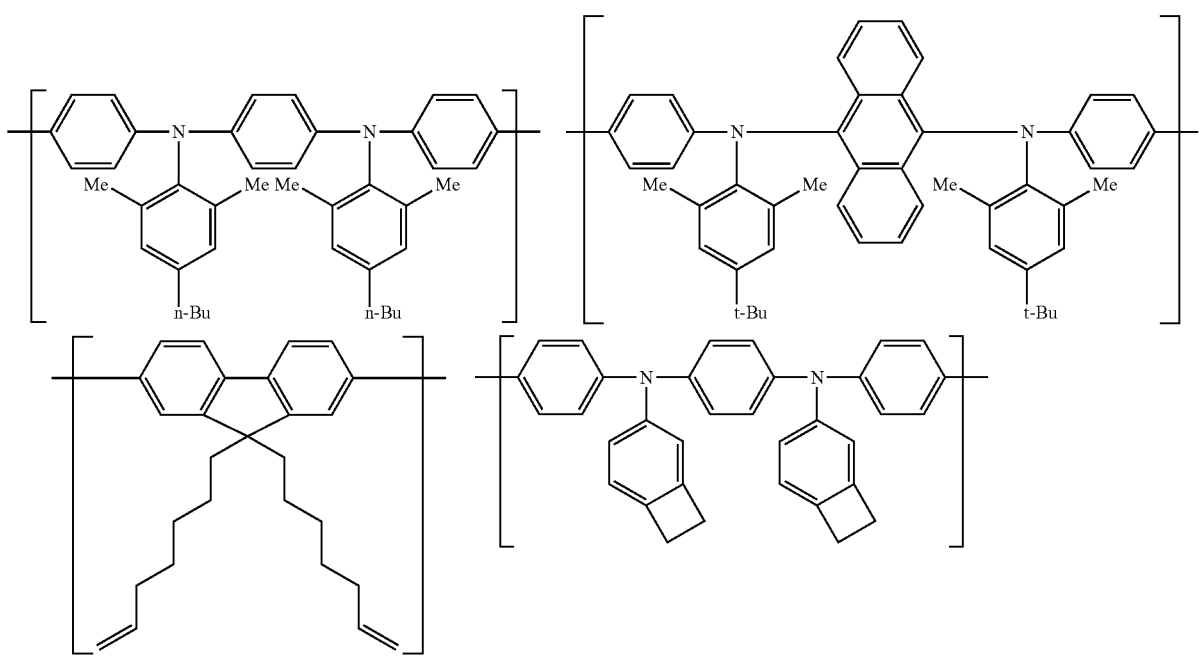
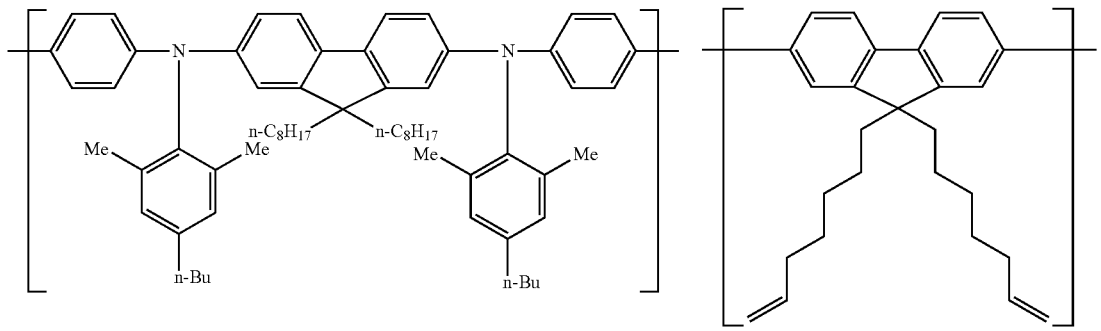
P24
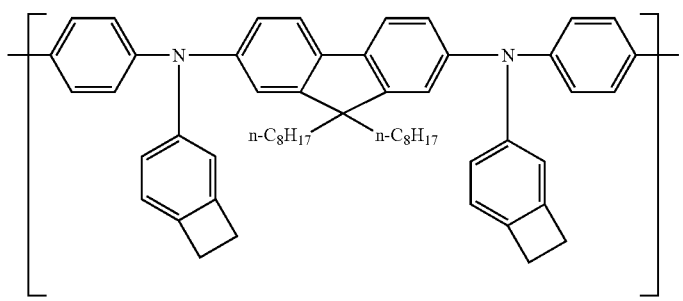

-continued
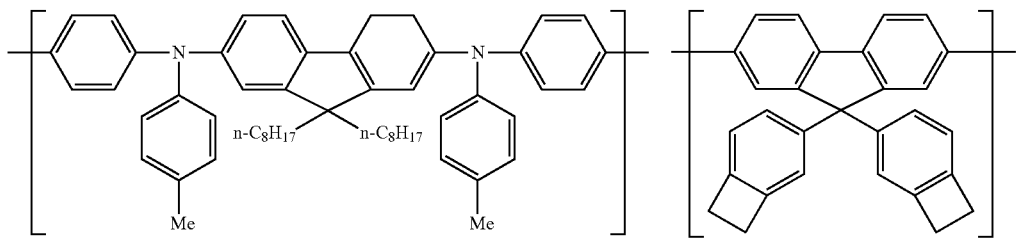
P25
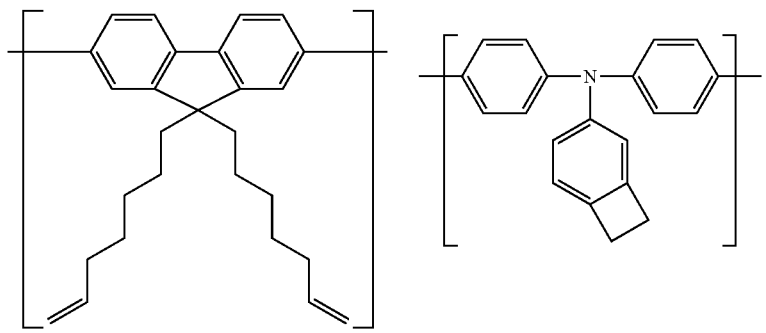
[Chemical Formula 45]
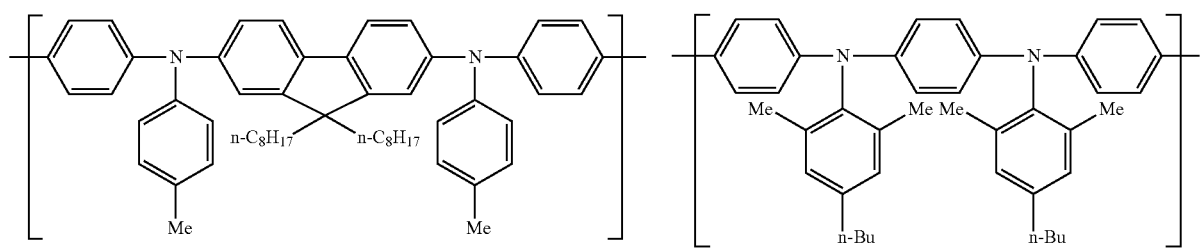
P26
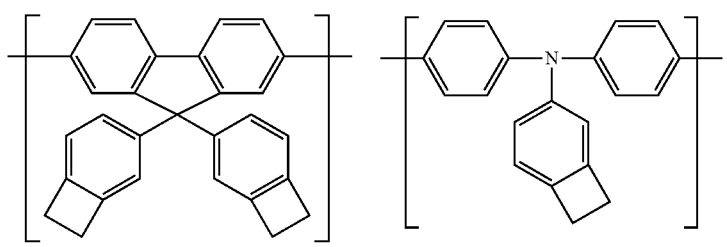
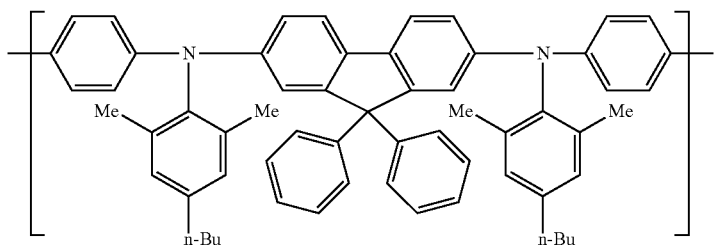
P27

83 84
-continued
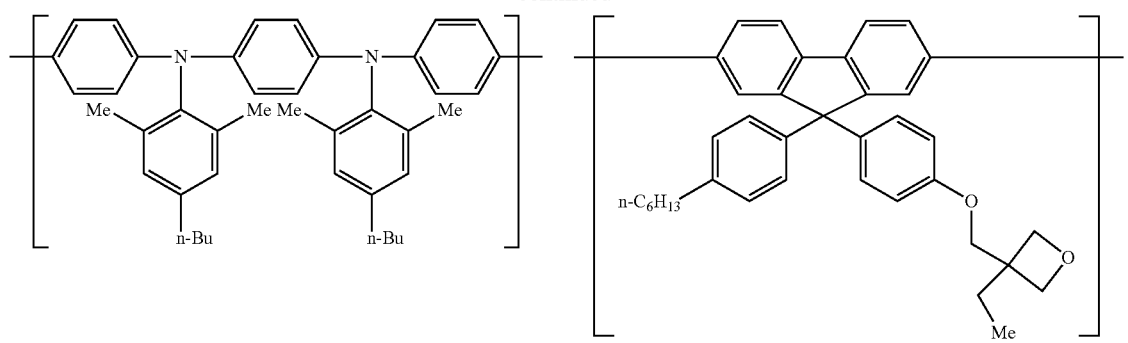
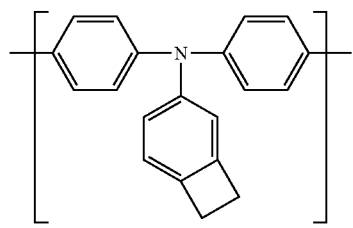
[Chemical Formula 46]
P28
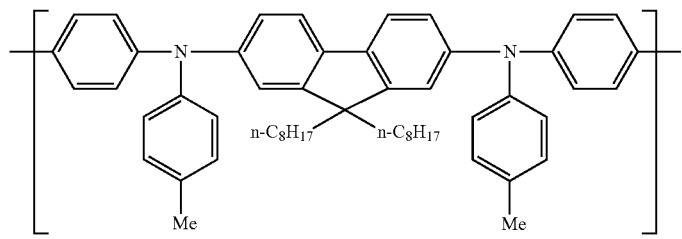
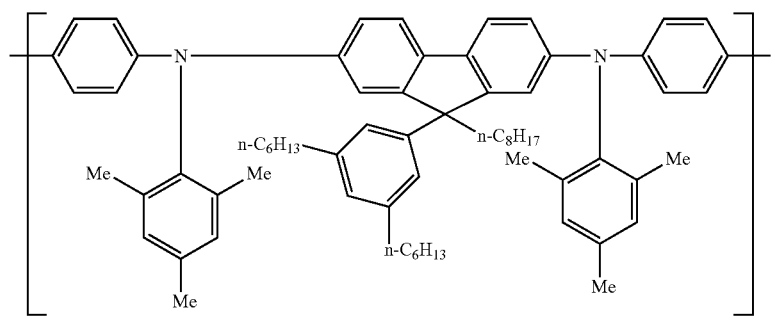
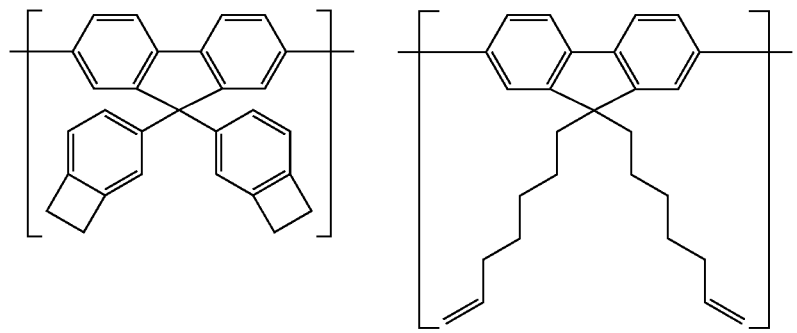

-continued

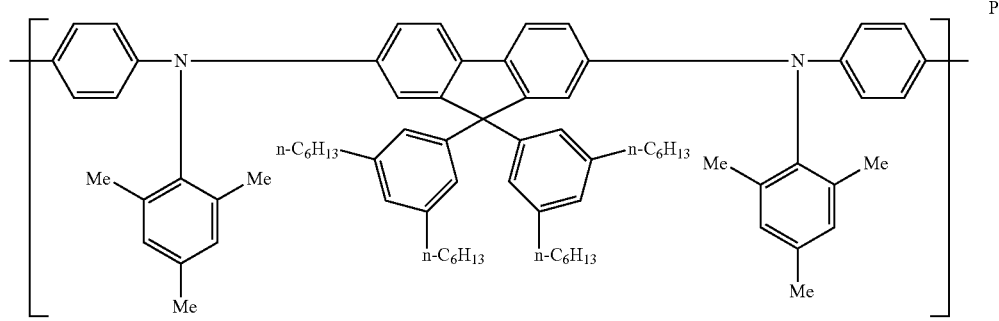
P29

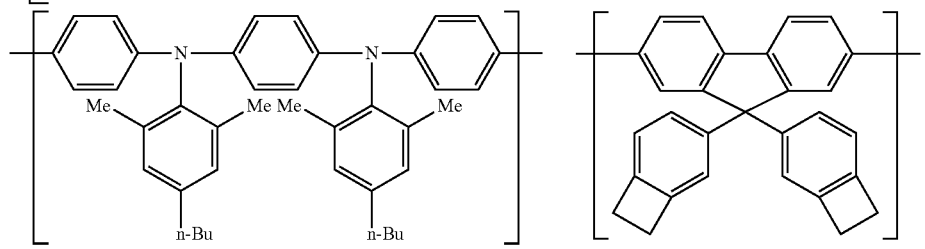
P30

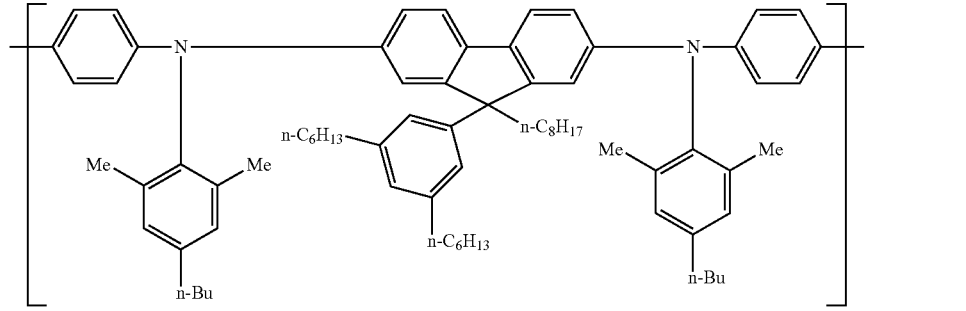

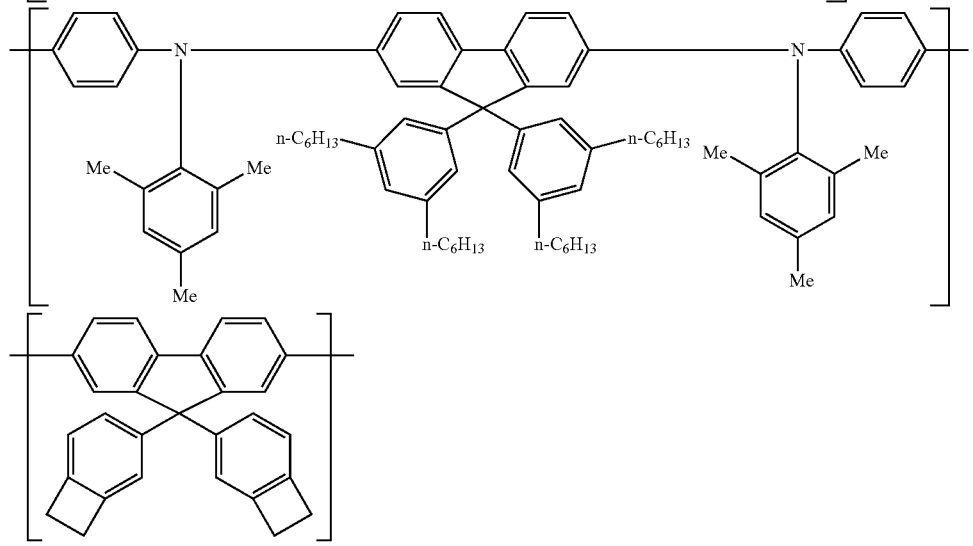

The polymer compound according to the present embodiment is synthesized by, for example, the condensation polymerization of a monomer (1) introducing the constitutional unit represented by Formula (1) and a monomer (A) introducing a constitutional unit different from the constitutional unit.

Examples of the monomer (1) may include a compound represented by Formula (5) and a compound represented by Formula (6) described below. Examples of the monomer (A) may include a compound represented by Formula (2M) and a compound represented by Formula (3M) described below.

In the polymer compound according to the present embodiment, when a polymerizable group remains as it is as a terminal group, the light-emitting characteristics and life of a light-emitting device manufactured using the polymer compound may degrade. For this reason, the terminal group is preferably a stable group (e.g., an aryl group or a monovalent heterocyclic group (particularly a monovalent aromatic heterocyclic group)).

When the polymer compound according to the present embodiment is a copolymer, it may be any copolymer and may be any of a block copolymer, a random copolymer, an alternating copolymer, and a graft copolymer, for example.

The polymer compound according to the present embodiment is useful as a hole-transporting material or the like and may be used in combination with other compounds to be used as a composition described below.

A polystyrene-equivalent number average molecular weight (Mn) of the polymer compound according to the present embodiment by gel permeation chromatography (hereinafter referred to as "GPC") is generally from $1 \times 10^3$ to $1 \times 10^8$ and preferably from $1 \times 10^4$ to $5 \times 10^6$. A polystyrene-equivalent weight average molecular weight (Mw) of the polymer compound according to the present embodiment is generally from $1 \times 10^3$ to $1 \times 10^8$ and preferably from $5 \times 10^3$ to $1 \times 10^7$, because film formability is excellent and the brightness life of a light-emitting device manufactured using the polymer compound is more excellent.

The glass transition temperature of the polymer compound according to the present embodiment is preferably 70° C. or more, because durability against various processes for manufacturing a light-emitting device is excellent and the heat resistance of the light-emitting device is favorable.

The polymer compound according to the present embodiment may also be used as a light-emitting film material that emits fluorescence or phosphorescence.

The light-emitting device comprising the polymer compound according to the present embodiment is a high-performance light-emitting device excellent in hole transportability and durability. The light-emitting device is therefore useful for backlights of liquid crystal devices, curved and planar light sources for illumination, segment display devices, dot matrix display devices, or the like. The polymer compound according to the present embodiment can be used for, not only light-emitting devices, but electronic devices such as organic solar cells and organic transistors and used for dye materials for lasers, materials for organic solar cells, organic semiconductor materials for organic transistors, materials for conductive films, materials for organic semiconductor films, or the like.

(Method for Manufacturing Polymer Compound)

When the polymer compound according to the present embodiment is a copolymer, it can be manufactured by, for example, condensation polymerization of a compound (hereinafter may be referred to as a "compound 5") represented by Formula (5), a compound (hereinafter may be referred to as a "compound 6") represented by Formula (6), a compound (hereinafter may be referred to as a "compound 2M") represented by Formula (2M) and/or a compound (hereinafter may be referred to as a "compound 3M") represented by Formula (3M).

In the present specification, the compound 5, the compound 6, the compound 2M, and the compound 3M may be collectively referred to as a "monomer."

[Chemical Formula 47]

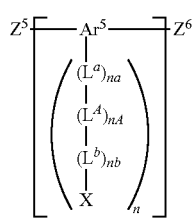

(2M)

In Formula (2M), $Ar^5$, X, $L^a$, $L^b$, $L^A$, na, nb, nA, and n are as defined in Formula (2), whereas $Z^5$ and $Z^6$ each independently represent a group selected from the substituent group A and the substituent group B.

[Chemical Formula 48]

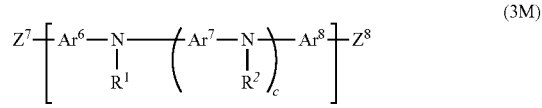

(3M)

In Formula (3M), c, $Ar^6$, $Ar^7$, $Ar^8$, $R^1$ and $R^2$ are as defined in Formula (3), whereas $Z^7$ and $Z^8$ each independently represent a group selected from the substituent group A and the substituent group B.

It is known that a compound having a group selected from the substituent group A and a compound having a group selected from the substituent group B are condensation-polymerized by a known coupling reaction, and that a carbon atom bonded to the group selected from the substituent group A and a carbon atom bonded to the group selected from the substituent group B are bonded to each other. For this reason, a compound A having two groups selected from the substituent group A and a compound B having two groups selected from the substituent group B are subjected to a known coupling reaction to obtain a condensation polymer of the compound A and the compound B by a condensation polymerization reaction.

Even with compounds having two groups selected from the substituent group B, a condensation polymer can be obtained by, for example, a method of polymerization with a Ni(0) catalyst (the Yamamoto polymerization) (Progress in Polymer Science, vol. 17, pp. 1153-1205, 1992).

Such a condensation polymerization reaction introduces the first constitutional unit by the compound 5 and the compound 6, introduces the second constitutional unit by the compound 2M, and introduces the third constitutional unit by the compound 3M.

Examples of the method of condensation polymerization may include a method of polymerization by the Suzuki coupling reaction (Chem. Rev., vol. 95, pp. 2457-2483, 1995), a method of polymerization by the Grignard reaction (Bull. Chem. Soc. Jpn., vol. 51, p. 2091, 1978), a method of polymerization with a Ni(0) catalyst (Progress in Polymer Science, vol. 17, pp. 1153-1205, 1992), and a method of polymerization using the Stille coupling reaction (European Polymer Journal, vol. 41, pp. 2923-2933, 2005). Among these methods, the method of polymerization by the Suzuki coupling reaction and the method of polymerization with a Ni(0) catalyst are preferable, because raw materials are easily synthesized and the polymerization reaction operation is simple. In view of also the easiness of controlling the structure of a polymer compound, the methods of polymerization by aryl-aryl cross-coupling reactions such as the Suzuki coupling reaction, the Grignard reaction, and the Stille coupling reaction are more preferable, and the method of polymerization by the Suzuki coupling reaction is particularly preferable.

Examples of the method of condensation polymerization may include a method by which the above compounds are reacted together with appropriate catalysts or bases as needed. When selecting the method of polymerization by the Suzuki coupling reaction, in order to obtain a polymer compound having a desired molecular weight, the ratio of the total number of moles of the groups selected from the substituent group A and the total number of moles of the groups selected from the substituent group B of the compounds needs to be adjusted. Generally, the ratio of the number of moles of the latter to the number of moles of the former is preferably from 0.95 to 1.05, more preferably from 0.98 to 1.02, and further preferably from 0.99 to 1.01.

The usage amount of the compound 5 in the condensation polymerization reaction is preferably from 1% by mol to 50% by mol, more preferably from 5% by mol to 50% by mol, and further preferably from 10% by mol to 50% by mol with respect to the total number of moles of the compound 5, the compound 6, and the other monomers. The usage amount of the compound 6 in the condensation polymerization reaction is preferably from 1% by mol to 50% by mol, more preferably from 10% by mol to 50% by mol, and further preferably from 30% by mol to 50% by mol with respect to the total number of moles of the compound 5, the compound 6, and the other monomers.

When using the compound 2M in the condensation polymerization reaction, when n=0 in Formula (2M), its usage amount is preferably from 0.5% by mol to 40% by mol, more preferably from 1% by mol to 30% by mol, further preferably from 5% by mol to 30% by mol, and particularly preferably from 5% by mol to 20% by mol with respect to the total number of moles of the compound 2M and the other monomers. When n=1 in Formula (2M), its usage amount is preferably from 0.5% by mol to 40% by mol, more preferably from 3% by mol to 30% by mol, further preferably from 3% by mol to 20% by mol, and particularly preferably from 5% by mol to 20% by mol.

When using the compound 3M in the condensation polymerization reaction, its usage amount is preferably from 0.5% by mol to 40% by mol, more preferably from 3% by mol to 30% by mol, further preferably from 3% by mol to 20% by mol, and particularly preferably from 5% by mol to 20% by mol with respect to the total number of moles of the compound 3M and the other monomers.

Such a condensation polymerization reaction can manufacture the polymer compound according to the present embodiment.

The monomers may be synthesized in advance, isolated, and used or, may be synthesized in a reaction system and used as they are. When the resultant polymer compound is used for an electronic device, the purity of the polymer compound may affect the performance of the electronic device. These monomer are therefore preferably purified by such methods as distillation, chromatography, sublimation purification, and recrystallization or any combination thereof.

The method for manufacturing the polymer compound according to the present embodiment preferably polymerizes the monomers in the presence of a catalyst. For polymerization by the Suzuki coupling reaction, examples of the catalyst may include transition metal complexes such as palladium complexes such as palladium[tetrakis(triphenylphosphine)], [tris(dibenzylideneacetone)]dipalladium, palladium acetate, and dichlorobistriphenylphosphinepalladium; and complexes in which a ligand such as triphenylphosphine, tri-tert-butylphosphine, and tricyclohexylphosphine coordinates to these transition metal complexes.

For polymerization with a Ni(0) catalyst, examples of the Ni(0) catalyst may include transition metal complexes such as nickel complexes such as nickel[tetrakis(triphenylphosphine)], [1,3-bis(diphenylphosphino)propane]dichloronickel, and [bis(1,4-cyclooctadiene)]nickel; and complexes in which a ligand such as triphenylphosphine, tri-tert-butylphosphine, tricyclohexylphosphine, diphenylphosphinopropane, bipyridyl optionally having a substituent, and phenanthroline optionally having a substituent coordinates to these transition metal complexes.

The above catalysts may be synthesized in advance and used or may be prepared in a reaction system and used as they are. One type of these catalysts may be used singly, or two or more types of them may be used in combination.

The usage amount of the catalyst needs to be any effective amount as a catalyst, which is, for example, generally from 0.0001% by mol to 300% by mol, preferably from 0.001% by mol to 50% by mol, and more preferably from 0.01% by mol to 20% by mol in terms of the number of moles of the transition metal with respect to a total of 100% by mol of all monomers in the polymerization reaction.

In the method of polymerization by the Suzuki coupling reaction, a base is preferably used. Examples of the base may include inorganic bases such as sodium carbonate, potassium carbonate, cesium carbonate, potassium fluoride, cesium fluoride, and potassium phosphate; and organic bases such as tetrabutyl ammonium fluoride, tetrabutyl ammonium chloride, tetrabutyl ammonium bromide, tetraethyl ammonium hydroxide, and tetrabutyl ammonium hydroxide.

The usage amount of the base is generally from 50% by mol to 2,000% by mol and preferably from 100% by mol to 1000% by mol with respect to a total of 100% by mol of all monomers in the polymerization reaction.

The polymerization reaction may be performed in the absence of a solvent or may be in the presence of a solvent. The polymerization reaction is generally performed in the presence of an organic solvent. Examples of the organic solvent may include toluene, xylene, mesitylene, tetrahydrofuran, 1,4-dioxane, dimethoxyethane, N,N-dimethylacetamide, and N,N-dimethylformamide. Generally, in order to inhibit side reactions, deoxygenated solvents are preferably used. One type of the organic solvents may be used singly, or two or more types of them may be used in combination.

The usage amount of the organic solvent is preferably an amount that gives a total concentration of all monomers in the polymerization reaction of 0.1% by weight to 90% by weight, more preferably 1% by weight to 50% by weight, and further preferably 2% by weight to 30% by weight.

The reaction temperature of the polymerization reaction is preferably from −100° C. to 200° C., more preferably from −80° C. to 150° C., and further preferably from 0° C. to 120° C. The reaction time is generally 1 hour or more and preferably from 2 hours to 500 hours.

In the polymerization reaction, in order to prevent polymerizable groups (e.g., $Z^1$ and $Z^2$) from remaining at the terminal of the polymer compound according to the present embodiment, a compound represented by Formula (1T) may be used as a terminator. This can obtain a polymer compound having an aryl group or a monovalent heterocyclic group (particularly a monovalent aromatic heterocyclic group) at its terminal.

$$Z^T\text{—}Ar^T \tag{1T}$$

In Formula (1T), $Ar^T$ represents an aryl group optionally having a substituent or a monovalent heterocyclic group (particularly a monovalent aromatic heterocyclic group) optionally having a substituent, whereas $Z^T$ represents a group selected from the substituent group A and the substituent group B. The aryl group or the monovalent heterocyclic group (particularly a monovalent aromatic heterocyclic group) in $Ar^T$ is the same as the "aryl group" and the "monovalent heterocyclic group" described as the above substituents. The group is preferably an aryl group, more preferably a phenyl group, a 1-naphthyl group, a 2-naphthyl group, a 1-anthracenyl group, a 2-anthracenyl group, a 9-anthracenyl group, or a 2-fluorenyl group, and further preferably a phenyl group, because the durability of a light-emitting device manufactured using the polymer compound according to the present embodiment is more excellent. These groups optionally have the above substituent.

An aftertreatment for the polymerization reaction can be performed by any known method. Examples of the method may include a method that removes water-soluble impurities by separation and a method that adds a reaction liquid after the polymerization reaction to a lower alcohol such as methanol and filters and dries a precipitated sediment. These methods may be performed singly or in combination.

When the purity of the polymer compound according to the present embodiment is low, it may be purified by such normal methods as recrystallization, reprecipitation, continuous extraction by a Soxhlet extraction apparatus, and column chromatography. When the polymer compound according to the present embodiment is used for a light-emitting device, its purity may affect the performance of the light-emitting device such as light-emitting characteristics. In view of this, a purifying treatment such as reprecipitation purification and separation by chromatography is preferably performed after the condensation polymerization (Compound)

The compound according to the present embodiment is the compound represented by Formula (5) useful for the manufacture of the polymer compound.

In Formula (5), d is preferably 1, because a monomer as a raw material is easily synthesized and the hole transportability and durability of a light-emitting device manufactured using the polymer compound according to the present embodiment are more excellent.

In Formula (5), e is preferably 0, because a monomer as a raw material is easily synthesized and the hole transportability and durability of a light-emitting device manufactured using the polymer compound according to the present embodiment are more excellent.

In Formula (5), when the groups represented by $Ar^9$, $Ar^{10}$, $Ar^{11}$, and $Ar^{12}$ have a substituent, the substituent is the same as the substituent of the groups represented by $Ar^1$, $Ar^2$, $Ar^3$, and $Ar^4$ in (1).

In Formula (5), the examples and preferable ranges of $Ar^{10}$ and $Ar^{11}$ are the same as those of $Ar^2$ and $Ar^4$ in Formula (1).

In Formula (5), the examples and preferable ranges of the groups represented by $Ar^9$ and $Ar^{11}$ are the same as those of the groups represented by $Ar^1$ and $Ar^3$ in Formula (1).

In Formula (5), as for the examples and preferable ranges of the groups represented by $R^D$, $R^E$, and $R^F$, those of the group represented by $R^D$ are the same as those of the group represented by $R^A$ in Formula (1), those of the group represented by $R^E$ are the same as those of the group represented by $R^B$, and those of the group represented by $R^F$ are the same as those of the group represented by $R^C$.

The following describes a method for manufacturing the compound represented by Formula (5) according to the present embodiment. A compound represented by Formula (5-1-2) as the compound defined by Formula (5) can be manufactured by Scheme 1, for example.

[Scheme1]

[Chemical Formula 49]

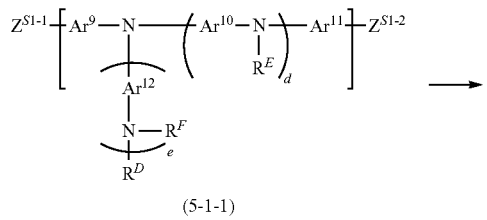

(5-1-1)

-continued

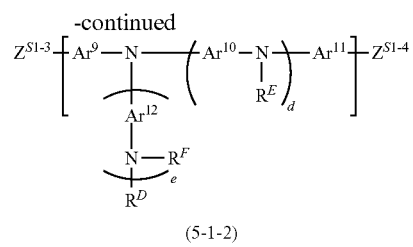

(5-1-2)

In Scheme 1, d, e, $Ar^9$, $Ar^{10}$, $Ar^{11}$, $Ar^{12}$, $R^D$, $R^E$, and $R^F$ are the same as defined in Formula (5). $Z^{S1-1}$ and $Z^{S1-2}$ each independently represent a group selected from the substituent group B. $Z^{S1-3}$ and $Z^{S1-4}$ each independently represent a group selected from the substituent group A.

In Scheme 1, the compound (hereinafter may be referred to as a compound (5-1-1)) represented by Formula (5-1-1) is subjected to a known reaction, thus obtaining the compound (hereinafter may be referred to as a compound (5-1-2)) represented by Formula (5-1-2).

In the compound (5-1-2), a compound whose $Z^{S1-3}$ and $Z^{S1-4}$ are represented by $B(OR^{101})_2$ ($R^{101}$ represents the same meaning as described above), for example, can be manufactured from the compound (5-1-1) by a method disclosed in J. Organomet. Chem., 2000, 611, 392, a method disclosed in Tetrahedron Lett., 1997, 38, 3447, a method disclosed in J. Org. Chem., 1995, 60, 7508, a method disclosed in Tetrahedron, 2001, 57, 9813, or the like. The compound (5-1-1) can be manufactured by a method disclosed in JP 2004-143419 A, WO 2005/049546, or the like.

The compound according to the present embodiment is the compound represented by Formula (6) useful for the manufacture of the polymer compound according to the present embodiment.

In Formula (6), f is preferably 0 or 1 and more preferably 1, because a monomer as a raw material is easily synthesized and the hole transportability and durability of a light-emitting device manufactured using the polymer compound according to the present embodiment are more excellent.

In Formula (6), g is preferably 0, because a monomer as a raw material is easily synthesized and the hole transportability and durability of a light-emitting device manufactured using the polymer compound according to the present embodiment are more excellent.

In Formula (6), when the groups represented by $Ar^{13}$, $Ar^{14}$, $Ar^{15}$, and $Ar^{16}$ have a substituent, the substituent is the same as the substituent of the groups represented by $Ar^1$, $Ar^2$, $Ar^3$, and $Ar^4$ in Formula (1).

In Formula (6), the examples and preferable ranges of $Ar^{14}$ and $Ar^{16}$ are the same as those of $Ar^2$ and $Ar^4$ in Formula (1).

In Formula (6), the examples and preferable ranges of the groups represented by $Ar^{13}$ and $Ar^{15}$ are the same as those of the groups represented by $Ar^1$ and $Ar^3$ in Formula (1).

In Formula (6), as for the examples and preferable ranges of the groups represented by $R^G$, $R^H$, and $R^I$, those of the group represented by $R^G$ are the same as those of the group represented by $R^A$ in Formula (1), those of the group represented by $R^H$ are the same as those of the group represented by $R^B$, and those of the group represented by $R^I$ are the same as those of the group represented by $R^C$.

(Polymer Compound Having Carbon Cluster)

The polymer compound according to the present embodiment, when having a monovalent crosslinking group, can be a polymer compound in which a carbon cluster and the monovalent crosslinking group are bonded to each other. Such a polymer compound can be synthesized by, for example, reacting the two by the Diels-Alder reaction or the like in a solvent and performing a purifying treatment. A light-emitting device manufactured using the thus obtained polymer compound according to the present embodiment is excellent in hole transportability and excellent in brightness life.

The "carbon cluster" means a molecule whose minimum structure comprises several to several thousand carbon atoms. Examples of the carbon cluster may include fullerenes having a spherical shell structure and carbon nanotubes and carbon nanohorns having a cylindrical shape. The carbon cluster preferably has a structure comprising a fullerene. The fullerene is preferably a $C_{60}$ fullerene, a $C_{70}$ fullerene, or a $C_{84}$ fullerene and more preferably a $C_{60}$ fullerene.

The polymer compound bonded to the carbon cluster according to the present embodiment is preferably a polymer compound comprising the constitutional unit represented by Formula (1) and the constitutional unit represented by Formula (2) and more preferably a polymer compound comprising the constitutional unit represented by Formula (1) and the constitutional unit represented by Formula (4).

When comprising the constitutional unit represented by Formula (2), n is preferably from 1 to 4, more preferably an integer of 1 to 3, and further preferably 2. When comprising the constitutional unit represented by Formula (4), m is preferably 1 or 2 and more preferably 2.

The monovalent crosslinking group that reacts with the carbon cluster may be any crosslinking group as long as the crosslinking group reacts with the carbon cluster. The monovalent crosslinking group that reacts with the carbon cluster is preferably, when the polymer compound and the carbon cluster are reacted by the Diels-Alder reaction, the group represented by Formula (X-1) and the group represented by Formula (X-2).

Examples of the constitutional unit in which the carbon cluster and the monovalent crosslinking group bonded to each other that can form the polymer compound bonded to the carbon cluster may include constitutional units represented by Formulae (6A-1), (6A-2), (6A-3), (6A-4), (6A-5), (6A-6), (6A-7), (6A-8), (6A-9), (6A-10), and (6A-11).

[Chemical Formula 50]

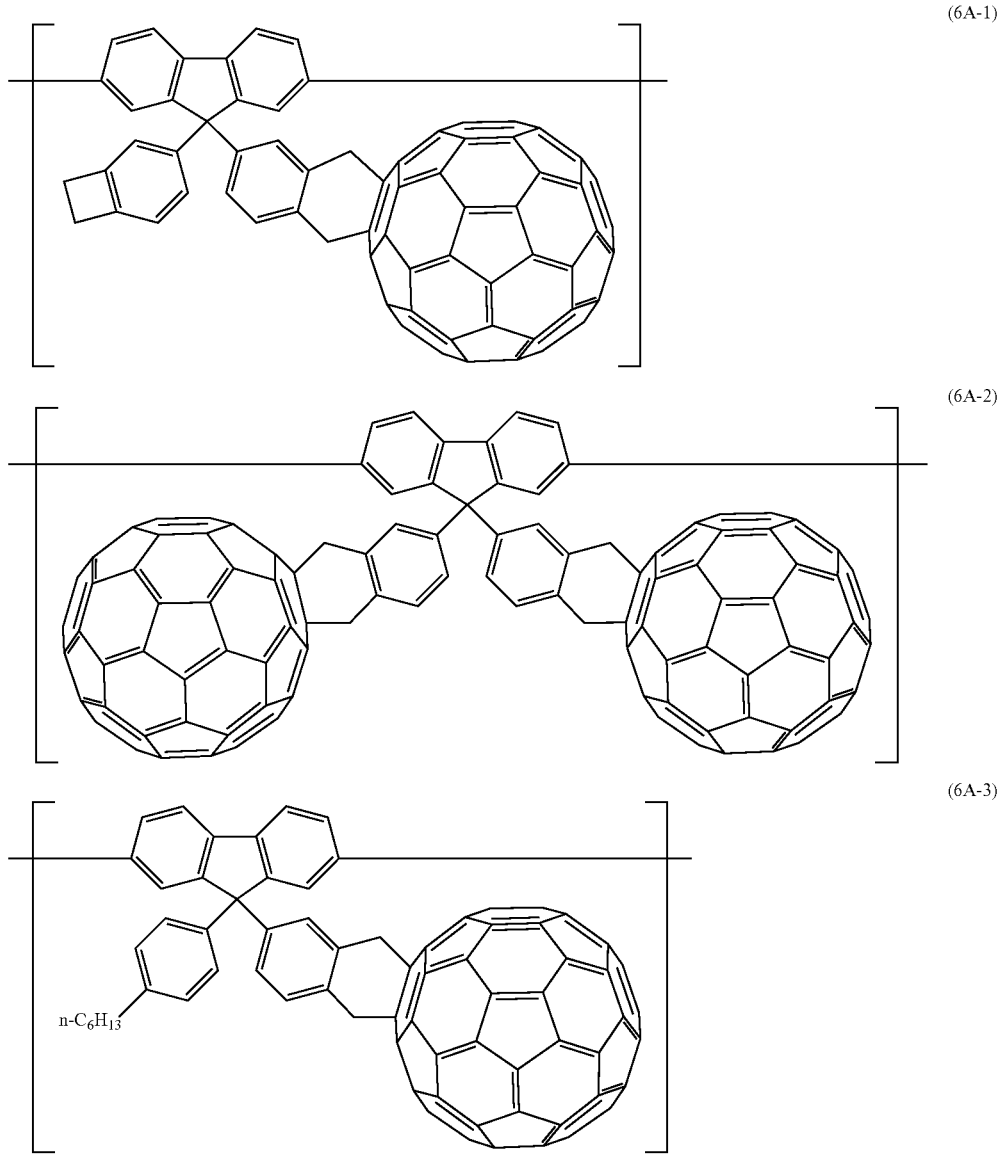

(6A-4)
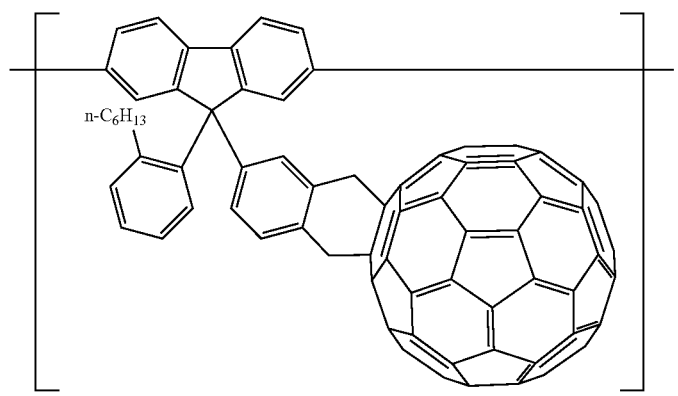
(6A-5)
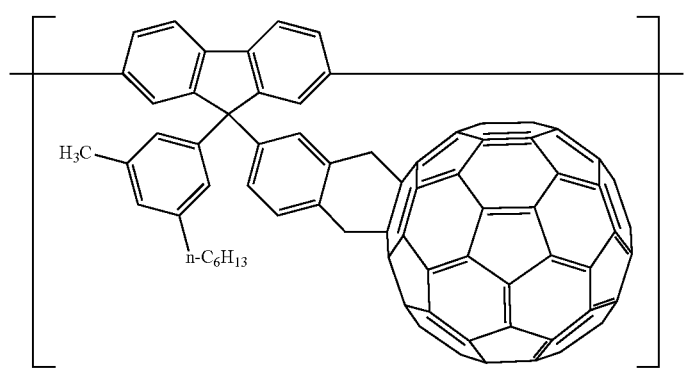
(6A-6)
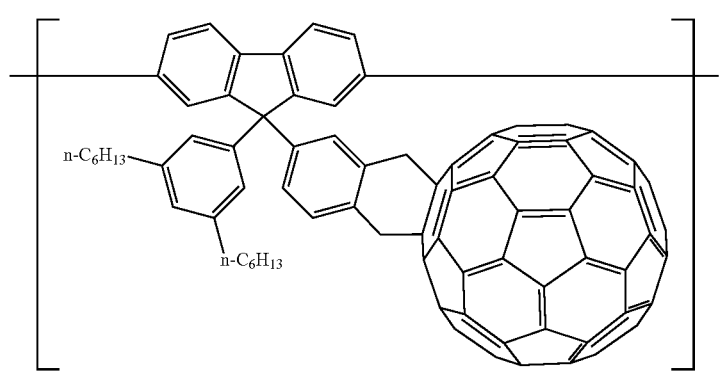
[Chemical Formula 51]
(6A-7)
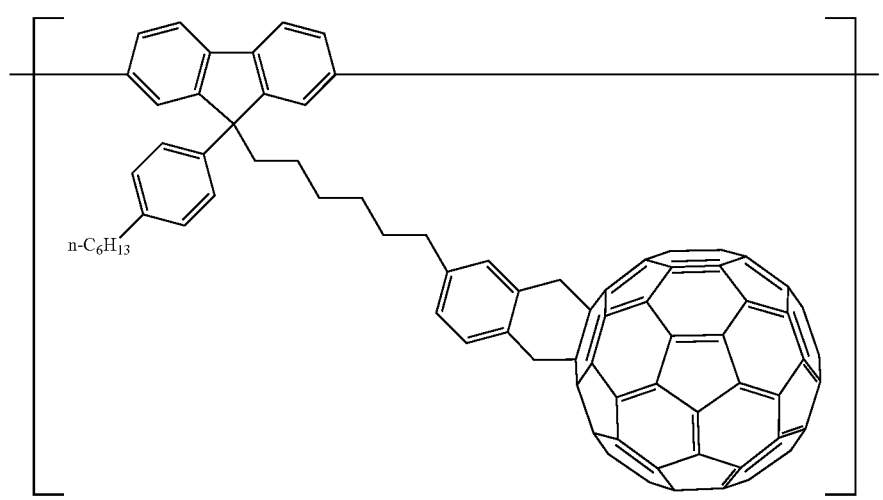

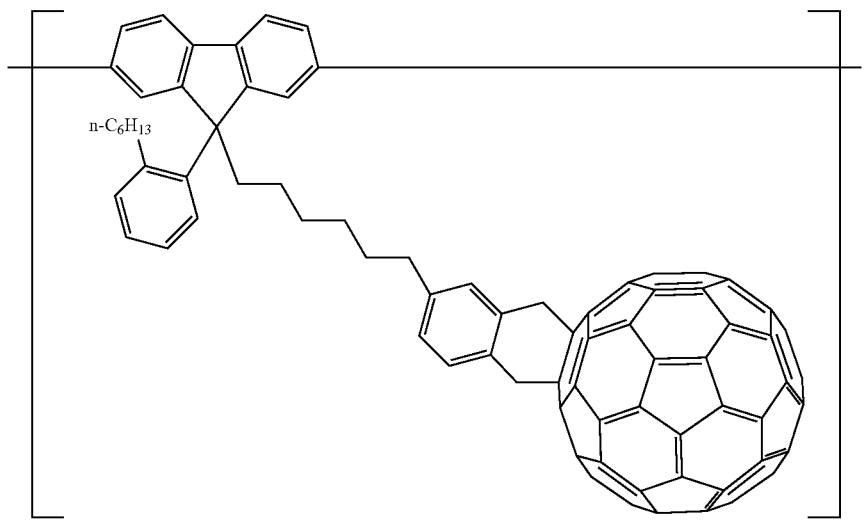
(6A-B)
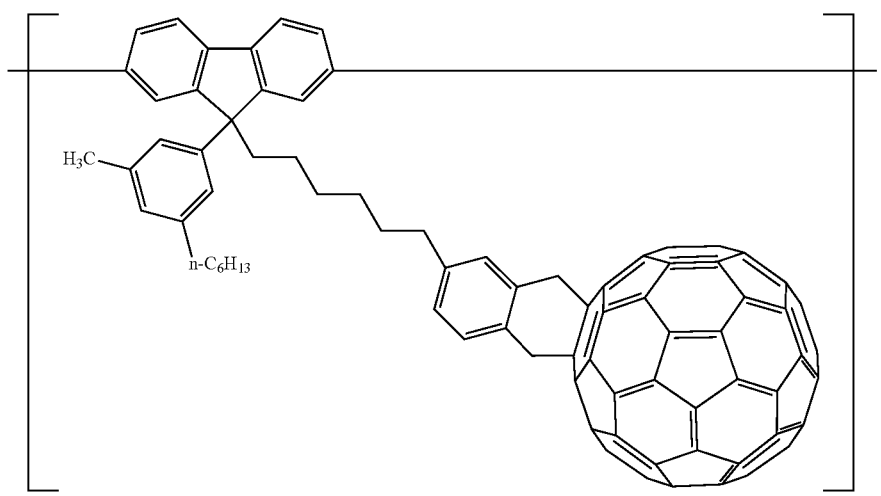
(6A-9)
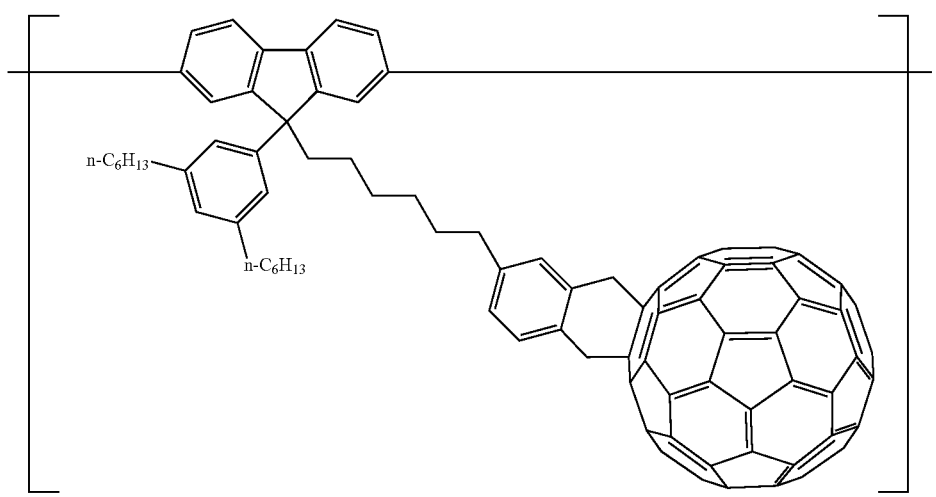
(6A-10)

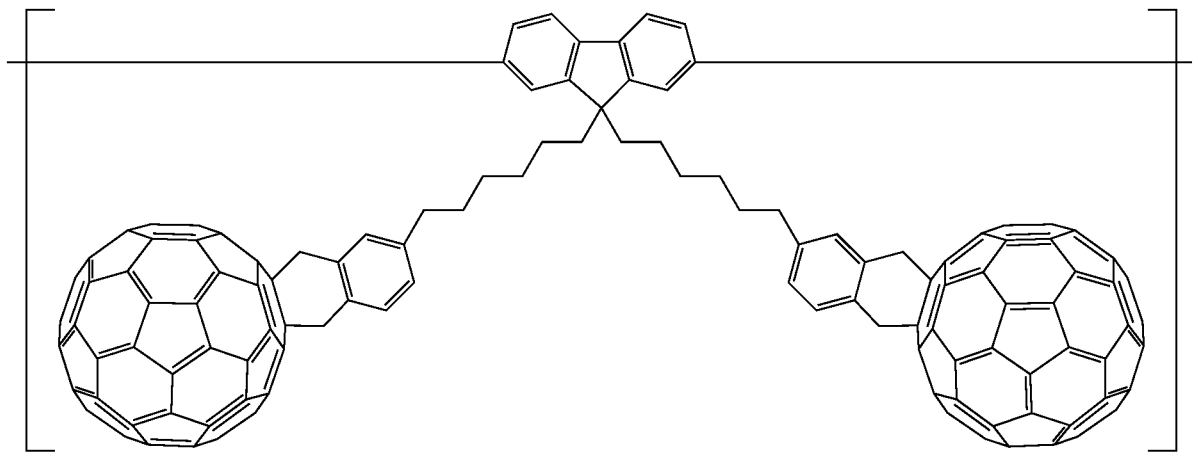

(6A-11)

(Composition)

The composition according to the present embodiment comprises the polymer compound and at least one type of material selected from the group consisting of a hole-transporting material, an electron-transporting material, and a light-emitting material.

Examples of the hole-transporting material may include polyvinyl carbazole and derivatives thereof, polysilane and derivatives thereof, polysiloxane derivatives having an aromatic amine residue on their side chain or main chain, pyrazoline derivatives, arylamine derivatives, stilbene derivatives, polyaniline and derivatives thereof, polythiophene and derivatives thereof, polypyrrole and derivatives thereof, poly(p-phenylenevinylene) and derivatives thereof, and poly(2,5-thienylenevinylene). Other examples of the hole-transporting material may include hole-transporting materials disclosed in JP S63-70257 A, JP S63-175860 A, JP H02-135359 A, JP H02-135361 A, JP H02-209988 A, JP H03-37992 A, and JP H03-152184 A.

The amount of the hole-transporting material is preferably from 1 part by weight to 500 parts by weight and more preferably from 5 parts by weight to 200 parts by weight with respect to 100 parts by weight of the polymer compound in the composition.

Examples of the electron-transporting material may include oxadiazole derivatives, anthraquinodimethane and derivatives thereof, benzoquinone and derivatives thereof, naphtoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoline and derivatives thereof, polyfluorene and derivatives thereof, anthracene and derivatives thereof, and copolymers of anthracene and fluorene. Other examples of the electron-transporting material may include electron-transporting materials disclosed in JP S63-70257 A, JP S63-175860 A, JP H02-135359 A, JP H02-135361 A, JP H02-209988 A, JP H03-37992 A, and JP H03-152184 A.

The amount of the electron-transporting material is preferably from 1 part by weight to 500 parts by weight and more preferably from 5 parts by weight to 200 parts by weight with respect to 100 parts by weight of the polymer compound in the composition.

Examples of the light-emitting material may include low molecular fluorescent light-emitting materials and phosphorescent light-emitting materials. Examples of the light-emitting material may include naphthalene derivatives; anthracene and derivatives thereof; copolymers of anthracene and fluorene; perylene and derivatives thereof; dyes such as polymethine dyes, xanthene dyes, coumarin dyes, and cyanine dyes; metal complexes having 8-hydroxyquinoline as a ligand; metal complexes having 8-hydroxyquinoline derivatives as a ligand; other fluorescent metal complexes; aromatic amines; tetraphenylcyclopentadiene and derivatives thereof; tetraphenylbutadiene and derivatives thereof; fluorescent materials of low molecular compounds such as stilbene-based compounds, silicon-containing aromatic compounds, oxazole-based compounds, furoxan-based compounds, thiazole-based compounds, tetraarylmethane-based compounds, thiadiazole-based compounds, pyrazole-based compounds, metacyclophane-based compounds, and acetylene-based compounds; metal complexes such as iridium complexes and platinum complexes; and triplet light-emitting complexes. Other examples of the light-emitting material may include light-emitting materials disclosed in JP S57-51781 A and JP S59-194393 A.

Examples of the triplet light-emitting complexes may include iridium complexes such as Ir(ppy)$_3$, Btp$_2$Ir(acac), FIrpic, COM-1, COM-2, COM-3, COM-4, COM-5, COM-6, COM-7, COM-8, and iridium complexes such as ADS066GE that is commercially available from American Dye Source Inc., which have iridium as a central metal, platinum complexes such as PtOEP, which have platinum as a central metal, and europium complexes such as Eu(TTA)$_3$-phen, which have europium as a central metal. These triplet light-emitting complexes are represented by the following Formulae.

[Chemical Formula 52]

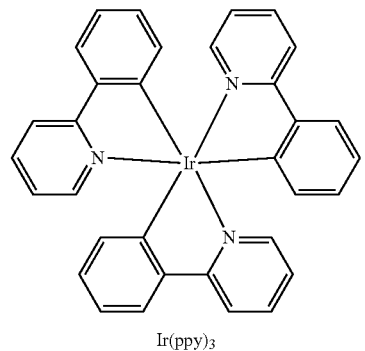

Ir(ppy)$_3$

-continued
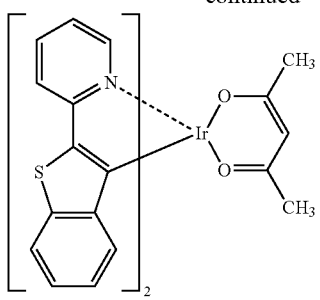
Btp₂Ir(acac)
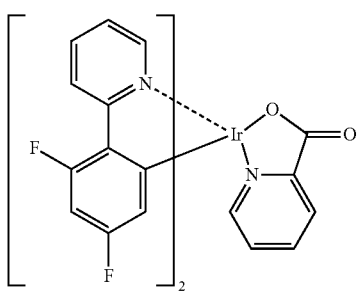
FIrpic
COM-1
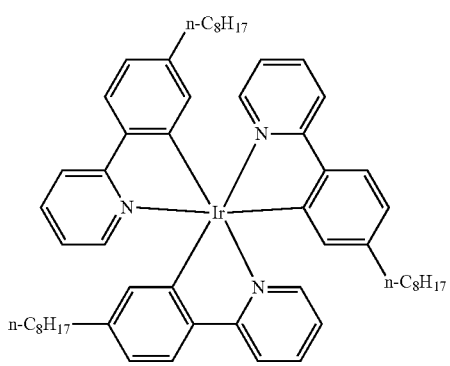
COM-2
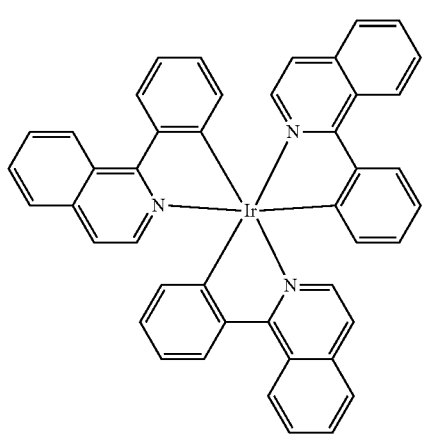
COM-3
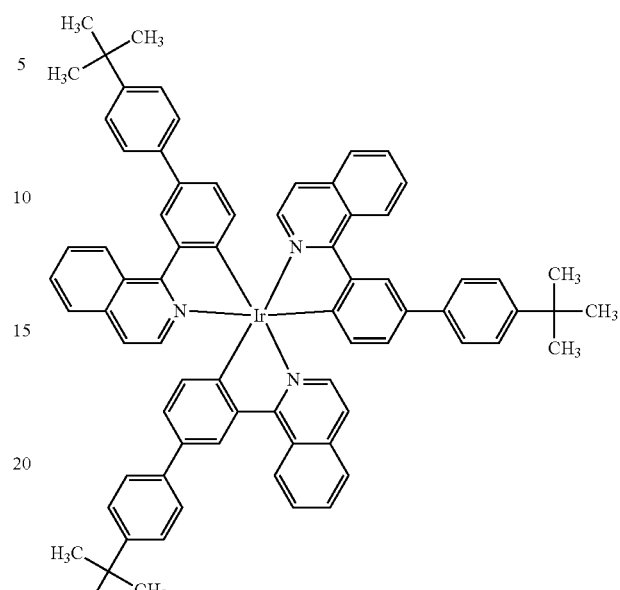
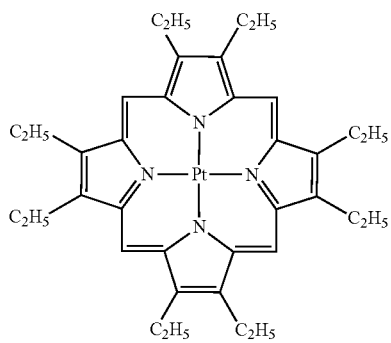
PtOEP
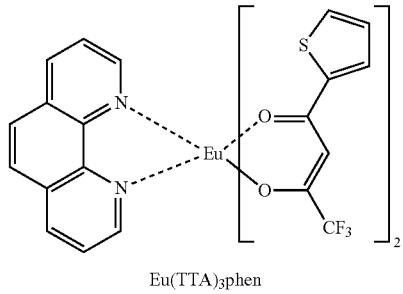
Eu(TTA)₃phen -continued

[Chemical Formula 53]

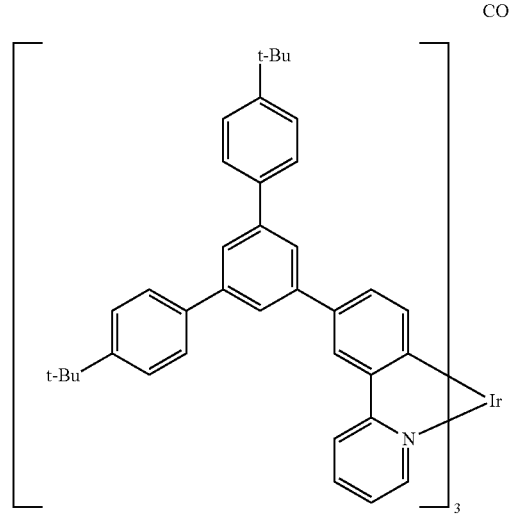

COM-4

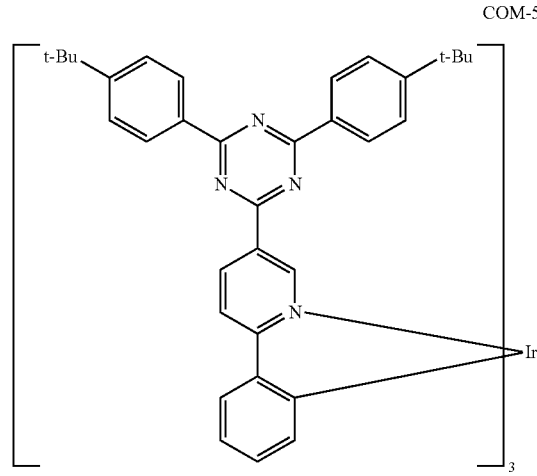

COM-5

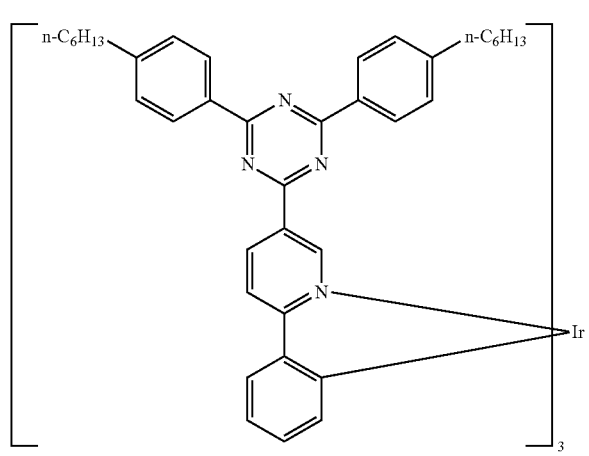

COM-6

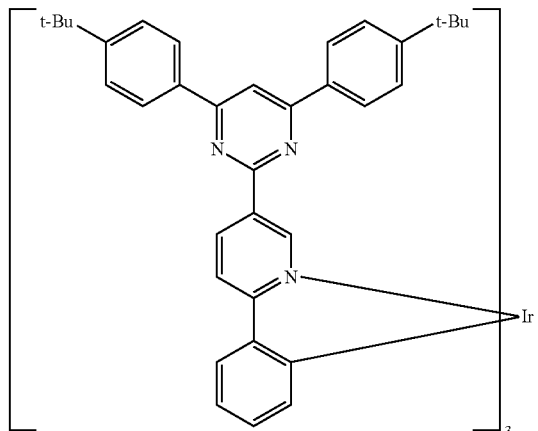

COM-7

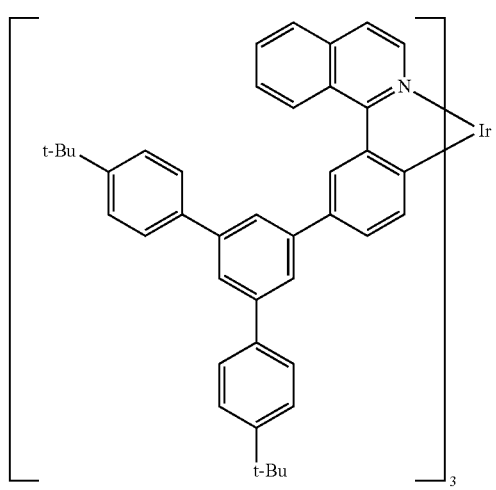

COM-8

The amount of the light-emitting material is preferably from 1 part by weight to 500 parts by weight and more preferably from 5 parts by weight to 200 parts by weight with respect to 100 parts by weight of the polymer compound in the composition.

(Liquid Composition)

The polymer compound according to the present embodiment may be a composition (hereinafter may be referred to as a liquid composition) dissolved or dispersed in a solvent, preferably an organic solvent.

Such a liquid composition is also referred to as ink or varnish. When using the liquid composition in order to form an organic film for use in a light-emitting device, the liquid composition is preferably a solution in which the polymer compound according to the present embodiment is dissolved.

The liquid composition optionally comprises, in addition to the polymer compound according to the present embodiment, at least one type of material selected from the group consisting of a hole-transporting material, an electron-transporting material, and a light-emitting material (which is the embodiment of the above composition). The liquid composition optionally comprises other substances as long as the effect of the present invention is not hindered. Examples of the other substances may include antioxidants, viscosity adjusters, surfactants, and crosslinking initiators.

The organic solvent for use in the liquid composition may be any organic solvent as long as it dissolves or disperses the polymer compound according to the present embodiment. Examples of the organic solvent may include the following organic solvents (hereinafter may be referred to as an "organic solvent group").

Aromatic hydrocarbon solvents: toluene, xylene (isomers and mixtures thereof), 1,2,3-trimethylbenzene, 1,2,4-trimethylbenzene, mesitylene (1,3,5-trimethylbenzene), ethylbenzene, propylbenzene, isopropylbenzene, butylbenzene, isobutylbenzene, 2-phenyl butane, tert-butylbenzene, pentylbenzene, neopentylbenzene, isopentylbenzene, hexylbenzene, cyclohexylbenzene, heptylbenzene, octylbenzene, 3-propyltoluene, 4-propyltoluene, 1-methyl-4-propylbenzene, 1,4-diethylbenzene, 1,4-dipropylbenzene, 1,4-di-tert-butylbenzene, indan, tetralin (1,2,3,4-tetrahydronaphthalene), or the like.

Aliphatic hydrocarbon solvents: pentane, hexane, cyclohexane, methylcyclohexane, heptane, octane, nonane, decane, decalin, or the like.

Aromatic ether solvents: anisole, ethoxybenzene, propoxybenzene, butyloxybenzene, pentyloxybenzene, cyclopentyloxybenzene, hexyloxybenzene, cyclohexyloxybenzene, heptyloxybenzene, octyloxybenzene, 2-methylanisole, 3-methylanisole, 4-methylanisole, 4-ethylanisole, 4-propylanisole, 4-butylanisole, 4-pentylanisole, 4-hexylanisole, diphenyl ether, 4-methylphenoxybenzene, 4-ethylphenoxybenzene, 4-propylphenoxybenzene, 4-butylphenoxybenzene, 4-pentylphenoxybenzene, 4-hexylphenoxybenzene, 4-phenoxytoluene, 3-phenoxytoluene, 1,3-dimethoxybenzene, 2,6-dimethylanisole, 2,5-dimethylanisole, 2,3-dimethylanisole, 3,5-dimethylanisole, or the like.

Aliphatic ether solvents: tetrahydrofuran, dioxane, dioxolane, or the like.

Ketone solvents: acetone, methyl ethyl ketone, methyl isobutyl ketone, cyclohexanone, acetophenone, or the like.

Ester solvents: ethyl acetate, butyl acetate, methyl benzoate, ethylcellosolve acetate, or the like.

Chloride solvents: methyl chloride, chloroform, 1,2-dichloroethane, 1,1,2-trichloroethane, chlorobenzene, o-dichlorobenzene, or the like.

Alcohol solvents: methanol, ethanol, propanol, isopropanol, cyclohexanol, phenol, or the like.

Polyalcohols and derivatives thereof: ethylene glycol, ethylene glycol monobutyl ether, ethylene glycol monoethyl ether, ethylene glycol monomethyl ether, dimethoxyethane, propylene glycol, diethoxyethane, triethylene glycol monoethyl ether, glycerin, 1,2-hexanediol, or the like.

Aprotic polar solvents: dimethylsulfoxide, N-methyl-2-pyrrolidone, N,N-dimethylformamide, N,N-dimethylacetamide, or the like.

One type of these organic solvents may be used singly, or two or more types of them may be used in combination as a mixed organic solvent.

When used as the mixed organic solvent, two or three or more types of organic solvents among the organic solvent group are combined. The mixed organic solvent may be formed by combining a plurality of types of organic solvents in the organic solvent group of the same system described above or may be formed by combining one or more types of organic solvents in the organic solvent group of different systems. The composition ratio thereof may be determined by considering the property of each organic solvent and the solubility of the polymer compound and the like.

Preferable examples of selecting and combining a plurality of types of ones from the organic solvent group of the same system may include a combination of a plurality of types of ones selected from aromatic hydrocarbon solvents and a combination of a plurality of types of ones selected from aromatic ether solvents.

Preferable examples of selecting and combining a plurality of types of ones from the organic solvent group of different systems may include the following combinations:

the aromatic hydrocarbon solvent and the aliphatic hydrocarbon solvent; the aromatic hydrocarbon solvent and the aromatic ether solvent; the aromatic hydrocarbon solvent and the aliphatic ether solvent; the aromatic hydrocarbon solvent and the aprotic polar solvent; and the aromatic ether solvent and the aprotic polar solvent and the like.

Water may be further added to a single organic solvent using the organic solvents described above singly or the mixed organic solvent.

Among these organic solvents, preferable is the single organic solvent or the mixed organic solvent comprising one or more types of organic solvents that have a structure comprising a benzene ring, have a melting point of 0° C. or less, and have a boiling point of 100° C. or more, because its viscosity and film formability are favorable. Among them, particularly preferable is the single organic solvent or the mixed organic solvent comprising one or more types of the aromatic hydrocarbon solvent and the aromatic ether solvent.

As the organic solvent, the single organic solvent may be used, or the mixed organic solvent may be used. As the organic solvent, the mixed organic solvent is preferably used, because film formability can be controlled. The organic solvent may be used after being purified through such treatments as washing, distillation, and contact to an adsorbent as needed.

Using the liquid composition can facilitate the manufacture of an organic film comprising the polymer compound according to the present embodiment. Specifically, the liquid composition is applied onto a substrate that optionally has any preferable certain component, and an organic solvent is distilled off through such treatments as heating, air blowing, and pressure reduction, thereby obtaining the organic film comprising the polymer compound according to the present embodiment. As for the distilling off of the organic solvent, its condition can be changed in accordance with the organic solvent used. Examples of the condition may include an ambient temperature (a heating treatment condition) of from 50° C. to 150° C. and a pressure-reduced atmosphere of about $10^{-3}$ Pa.

Examples of the process of coating may include coating methods such as spin coating method, casting method, microgravure method, gravure coating method, bar coating method, roll coating method, wire-bar coating method, dip coating method, slit coating method, capillary coating method, spray coating method, screen printing method, flexo printing method, offset printing method, inkjet printing method, and nozzle coating method.

A preferable viscosity of the liquid composition varies in accordance with the coating method selected; at 25° C., the viscosity is preferably from 0.5 mPa·s to 1,000 mPa·s and more preferably from 0.5 mPa·s to 500 mPa·s. When the liquid composition is discharged through a discharging device as in inkjet printing, in order to prevent clogging and curved flight during discharge, the viscosity at 25° C. is preferably from 0.5 mPa·s to 50 mPa·s and more preferably from 0.5 mPa·s to 20 mPa·s. The concentration of the polymer compound according to the present embodiment in the liquid composition is preferably, but not limited to, from 0.01% by weight to 10% by weight and more preferably from 0.1% by weight to 5% by weight.

(Organic Film)

The organic film according to the present embodiment comprises the polymer compound. The organic film according to the present embodiment can be easily manufactured from the liquid composition. A second organic film according to the present invention is an insolubilized organic film insolubilized by crosslinking the polymer compound according to the present embodiment and can be generally obtained by crosslinking and curing it through external stimuli through such treatments as heating and light irradiation. The insolubilized organic film is advantageous for the stacking of a light-emitting device, because of being difficult to be dissolved in solvents such as organic solvents.

Examples of the type of the organic film according to the present embodiment may include light-emitting films, conductive films, and organic semiconductor films. Examples of the conductive film may include electron-transporting films and hole-transporting films. When used as the conductive film of a light-emitting device, particularly the hole-transporting film (hole transport layer), the organic film according to the present embodiment is excellent in the hole transportability of the light-emitting device, because the organic film comprises the polymer compound according to the present embodiment.

The heating temperature in order to crosslink the polymer compound according to the present embodiment is generally, but not limited to, within the range of room temperature to 300° C., and its upper limit is preferably 250° C., more preferably 190° C., and particularly preferably 170° C., because of the easiness of film formation. Its lower limit is preferably 50° C., more preferably 70° C., and particularly preferably 100° C., in view of the stability of the film at room temperature.

The wavelength of light for use in light irradiation in order to crosslink the polymer compound according to the present embodiment is not limited. Generally used for the light for use in the light irradiation is ultraviolet light, near-ultraviolet light, and visible light. Ultraviolet light and near-ultraviolet light are preferable.

The light-emitting film has a luminescent quantum yield of preferably 30% or more, more preferably 50% or more, further preferably 60% or more, and particularly preferably 70% or more, because the brightness and light emission start voltage of a light-emitting device can be favorable.

The conductive film has a surface resistance of 1 kΩ/□ or less, more preferably 100Ω/□ or less, and further preferably 10Ω/□ or less. Doping Lewis acids, ionic compounds, or the like into the conductive film can increase its electric conductivity.

The organic semiconductor film preferably has either high electron mobility or high hole mobility, that is, high charge mobility. The charge mobility is preferably $10^{-5}$ cm$^2$/V/s or more, more preferably $10^{-3}$ cm$^2$/V/s or more, and further preferably $10^{-1}$ cm$^2$/V/s or more.

An organic transistor can be manufactured using the organic semiconductor film. Specifically, the organic semiconductor film is formed on a Si substrate on which an insulating film such as $SiO_2$ and a gate electrode are formed, and a source electrode and a drain electrode are formed with Au or the like, thus forming the organic transistor.

(Organic Transistor)

The organic transistor according to the present embodiment is an organic transistor comprising the polymer compound according to the present embodiment. The following describes a field-effect transistor as an embodiment of the organic transistor.

The polymer compound according to the present embodiment has high charge transportability (particularly hole transportability), and it can be suitably used as the material of a polymer field-effect transistor, particularly the material of an organic semiconductor layer (active layer). The structure of the polymer field-effect transistor generally needs to comprise a source electrode and a drain electrode that are arranged in contact with the organic semiconductor layer (active layer) made of a polymer compound and a gate electrode that is arranged through an insulating layer being in contact with the organic semiconductor layer (active layer).

The polymer field-effect transistor is generally formed on a supporting substrate. Examples of the supporting substrate may include glass substrates, flexible film substrates, and plastic substrates.

The polymer field-effect transistor can be manufactured by such known methods as a method disclosed in JP H05-110069 A.

In forming the organic semiconductor layer (active layer), using the above liquid composition is advantageous and preferable in manufacture. Examples of the process of forming the organic semiconductor layer using the liquid composition (particularly a solution in which the polymer compound according to the present embodiment is dissolved in a solvent) may include coating methods such as spin coating method, casting method, microgravure method, gravure coating method, bar coating method, roll coating method, wirebar coating method, dip coating method, slit coating method, capillary coating method, spray coating method, screen printing method, flexo printing method, offset printing method, inkjet printing method, and nozzle coating method.

After manufacturing the polymer field-effect transistor, the polymer field-effect transistor is preferably sealed with a sealant so as to be shielded from an external environment. This can shield the polymer field-effect transistor from the atmosphere and reduce degradation in the characteristics of the polymer field-effect transistor.

Examples of the method of sealing may include a method covering with an ultraviolet (UV) curing resin, a thermosetting resin, an inorganic SiONx film, or the like and a method laminating a glass plate or a film with a UV curing resin, a thermosetting resin, or the like. To effectively perform shielding from the atmosphere, the process before the sealing after manufacturing the polymer field-effect transistor is preferably performed without being exposed to the atmosphere (in a dried nitrogen gas atmosphere or in a vacuum, for example).

(Organic Photoelectric Conversion Device)

The organic photoelectric conversion device according to the present embodiment (e.g., a solar cell) is an organic photovoltaic cell comprising the polymer compound according to the present embodiment.

The polymer compound according to the present embodiment can be suitably used as a material of organic photoelectric conversion devices, particularly as a material of an organic semiconductor layer of a Schottky barrier device utilizing an interface between an organic semiconductor and a metal and as a material of an organic semiconductor layer of a pn heterojunction device utilizing an interface between an organic semiconductor and an inorganic semiconductor or between organic semiconductors.

The polymer compound according to the present embodiment can be suitably used as an electron-donor polymer and an electron-acceptor polymer in a bulk heterojunction device with an increased donor/acceptor contact area and as an electron-donor conjugated polymer (a dispersion support) of organic photoelectric conversion devices utilizing a composite system of a polymer compound and a low molecular compound, for example, bulk heterojunction organic photoelectric conversion devices in which a fullerene derivative is dispersed as an electron acceptor.

As for the structure of the organic photoelectric conversion device, the pn heterojunction device, for example, needs to use an ohmic contact electrode; the ohmic contact electrode needs to be arranged on an n-type semiconductor layer stacked on a p-type semiconductor layer formed on ITO, for example.

The organic photoelectric conversion device is generally formed on a supporting substrate. Examples of the supporting substrate may include glass substrates, flexible film substrates, and plastic substrates.

The organic photoelectric conversion device can be manufactured by such known methods as a method disclosed in Synth. Met., 102, 982 (1999) or a method disclosed in Science, 270, 1789 (1995).

(Light-Emitting Device)

Described next is the light-emitting device according to the present embodiment.

The light-emitting device according to the present embodiment is a light-emitting device having the organic film according to the present embodiment. The light-emitting device according to the present embodiment has, for example, an anode, a cathode, and an organic layer placed between the anode and the cathode, in which the organic layer comprises the polymer compound or the composition according to the present embodiment. The organic layer, that is, the organic film according to the present embodiment comprises an embodiment (organic film) that comprises the polymer compound or the composition according to the present embodiment as it is and an embodiment (insolubilized organic film) that is insolubilized against organic solvents through intramolecular or intermolecular crosslinking of the polymer compound according to the present embodiment within the organic film (composition).

Examples of the organic layer may include a light-emitting layer, a hole transport layer, a hole injection layer, an electron transport layer, and an electron injection layer. The light-emitting layer means a layer having a function of emitting light. The hole transport layer means a layer having a function of transporting holes. The electron transport layer means a layer having a function of transporting electrons. The electron transport layer and the hole transport layer are collectively referred to as a charge transport layer, whereas the electron injection layer and the hole injection layer are collectively referred to as a charge injection layer. The organic layer may include only one layer of the light-emitting layer, in other words, the single layer comprises the functions of the respective layers or may be a multi-layer structure comprising layers selected from the group consisting of the light-emitting layer, the hole transport layer, the hole injection layer, the electron transport layer, and the electron injection layer.

The organic layer comprising the polymer compound according to the present embodiment is preferably one or more types of layers selected from the group consisting of the light-emitting layer, the hole transport layer, the hole injection layer, the electron transport layer, and the electron injection layer. It is more preferable that the organic layer is the light-emitting layer or the hole transport layer.

When the organic layer comprising the polymer compound according to the present embodiment is the light-emitting layer, the light-emitting layer optionally comprises, in addition to a light-emitting material, a hole-transporting material, an electron-transporting material, and additives for improving a balance of the durability and hole transportability of the light-emitting device. The light-emitting material means a material that emits fluorescence or phosphorescence.

When the organic layer comprising the polymer compound according to the present embodiment comprises the polymer compound according to the present embodiment and the hole-transporting material, the amount of the hole-transporting material is generally from 1 part by weight to 500 parts by weight and preferably from 5 parts by weight to 200 parts by weight with respect to 100 parts by weight of the polymer compound according to the present embodiment.

When the organic layer comprising the polymer compound according to the present embodiment comprises the polymer compound according to the present embodiment and the electron-transporting material, the content of the electron-transporting material is generally from 1 part by weight to 500 parts by weight and preferably from 5 parts by weight to 200 parts by weight with respect to 100 parts by weight of the polymer compound according to the present embodiment.

When the organic layer comprising the polymer compound according to the present embodiment comprises the polymer compound according to the present embodiment and the light-emitting material, the amount of the light-emitting material is generally from 1 part by weight to 500 parts by weight and preferably from 5 parts by weight to 200 parts by weight with respect to 100 parts by weight of the polymer compound according to the present embodiment.

For the hole-transporting material, the electron-transporting material, and the light-emitting material, known low molecular weight compounds, triplet light-emitting complexes, and high molecular weight compounds can be used.

Examples of the high molecular weight compound may include polymers and copolymers (hereinafter referred to as "(co)polymers") having a fluorenediyl group as a constitutional unit, (co)polymers having an arylene group as a constitutional unit, (co)polymers having an arylene vinyl group as a constitutional unit, and (co)polymers having a divalent aromatic amine residue as a constitutional unit disclosed in WO 99/13692, WO 99/48160, GB 2340304 A, WO 00/53656, WO 01/19834, WO 00/55927, GB 2348316, WO 00/46321, WO 00/06665, WO 99/54943, WO 99/54385, U.S. Pat. No. 5,777,070, WO 98/06773, WO 97/05184, WO 00/35987, WO 00/53655, WO 01/34722, WO 99/24526, WO 00/22027, WO 00/22026, WO 98/27136, U.S. Pat. No. 573,636, WO 98/21262, U.S. Pat. No. 5,741,921, WO 97/09394, WO 96/29356, WO 96/10617, EP 0707020, WO 95/07955, JP 2001-181618 A, JP 2001-123156 A, JP 2001-3045 A, JP 2000-351967 A, JP 2000-303066 A, JP 2000-299189 A, JP 2000-252065 A, JP 2000-136379 A, JP 2000-104057 A, JP 2000-80167 A, JP H10-324870 A, JP H10-114891 A, JP H09-111233 A, and JP H09-45478 A.

Examples of the low molecular weight compound may include naphthalene derivatives; anthracene and derivatives thereof; perylene and derivatives thereof; dyes such as polymethine dyes, xanthene dyes, coumarin dyes, and cyanine dyes; metal complexes of 8-hydroxyquinoline and derivatives thereof; aromatic amines; tetraphenylcyclopentadiene and derivatives thereof; tetraphenylbutadiene and derivatives thereof; and specifically, compounds disclosed in JP 557-51781 A and JP S59-194393 A.

Examples of the triplet light-emitting complex may include the above triplet light-emitting complexes.

The optimum thickness of the light-emitting layer varies by the material used and needs to be selected so as to give appropriate values of drive voltage and light-emitting efficiency; the thickness of the light-emitting layer is generally from 1 nm to 1 µm, preferably from 2 nm to 500 nm, more preferably from 5 nm to 200 nm, and further preferably from 50 nm to 150 nm.

Examples of the method for forming the light-emitting layer may include methods using solutions. Examples of the method of formation using solutions may include coating methods such as spin coating method, casting method, microgravure coating method, gravure coating method, bar coating method, roll coating method, wire-bar coating method, dip coating method, spray coating method, screen printing method, flexo printing method, offset printing method, inkjet printing method, capillary coating method, and nozzle coating method. Among these methods, preferable are printing methods such as screen printing method, flexo printing method, offset printing method, and inkjet printing method, because pattern formation and application in different colors are easily performed.

Examples of the light-emitting device according to the present embodiment may include a light-emitting device that arranges the electron transport layer between the cathode and the light-emitting layer, a light-emitting device that arranges the hole transport layer between the anode and the light-emitting layer, and a light-emitting device that arranges the electron transport layer between the cathode and the light-emitting layer and arranges the hole transport layer between the anode and the light-emitting layer. In the light-emitting device according to the present embodiment, the polymer compound according to the present embodiment is preferably comprised in the hole transport layer.

Examples of the structure of the light-emitting device may include the following from a) to d) structures. The symbol "/" means that the layers written before and after it are adjacent to each other. "Anode/light-emitting layer" means that the anode and the light-emitting layer are adjacent to each other, for example. The same holds for the following:
a) Anode/light-emitting layer/cathode
b) Anode/hole transport layer/light-emitting layer/cathode
c) Anode/light-emitting layer/electron transport layer/cathode
d) Anode/hole transport layer/light-emitting layer/electron transport layer/cathode For each of the structures, the hole transport layer may be arranged between the light-emitting layer and the anode adjacent to the light-emitting layer. Examples of such a structure of the light-emitting layer may include the following from a') to d') structures:
a') Anode/hole transport layer/light-emitting layer/cathode
b') Anode/hole transport layer/hole transport layer/light-emitting layer/cathode
C') Anode/hole transport layer/light-emitting layer/electron transport layer/cathode
d') Anode/hole transport layer/hole transport layer/light-emitting layer/electron transport layer/cathode When the light-emitting device according to the present embodiment comprises the hole transport layer, the hole transport layer generally comprises the polymer compound according to the present embodiment. Examples of the other hole-transporting materials (high molecular weight compounds and low molecular weight compounds) may include polyvinylcarbazole and derivatives thereof, polysilane and derivatives thereof, polysiloxane derivatives having an aromatic amine residue on their side chain or main chain, pyrazoline derivatives, arylamine derivatives, stilbene derivatives, triphenyldiamine derivatives, polyaniline and derivatives thereof, polythiophene and derivatives thereof, polypyrrole and derivatives thereof, poly(p-phenylenevinylene) and derivatives thereof, poly(2,5-thienylenevinylene) and derivatives thereof, and compounds disclosed in JP S63-70257 A, JP S63-175860 A, JP H02-135359 A, JP H02-135361 A, JP H02-209988 A, JP H03-37992 A, and JP H03-152184 A.

Among these compounds, the high molecular weight compound is preferably polyvinylcarbazole and derivatives thereof, polysilane and derivatives thereof, polysiloxane derivatives having an aromatic amine residue on their side chain or main chain, polyaniline and derivatives thereof, polythiophene and derivatives thereof, poly(p-phenylenevinylene) and derivatives thereof, and poly(2,5-thienylenevinylene) and derivatives thereof and more preferably polyvinylcarbazole and derivatives thereof, polysilane and derivatives thereof, and polysiloxane derivatives having an aromatic amine residue on their side chain or main chain.

Among these compounds, the low molecular weight compound is preferably pyrazoline derivatives, arylamine derivatives, stilbene derivatives, and triphenyldiamine derivatives. These low molecular weight compounds are preferably dispersed in a polymer binder.

The polymer binder is preferably a compound that does not extremely inhibit charge transport and does not have high absorbance for visible light; examples thereof may include poly(N-vinylcarbazole), polyaniline and derivatives thereof, polythiophene and derivatives thereof, poly(p-phenylenevinylene) and derivatives thereof, poly(2,5-thienylenevinylene) and derivatives thereof, polycarbonate, polyacrylate, polymethylacrylate, polymethylmethacrylate, polystyrene, polyvinylchloride, and polysiloxane.

Polyvinylcarbazole and derivatives thereof can be obtained by the cationic polymerization or the radical polymerization of a vinyl monomer, for example.

Examples of polysilane and derivatives thereof may include compounds disclosed in Chem. Rev., vol. 89, p. 1359 (1989) and GB 2300196 A. As for also the method of synthesis, methods disclosed in them can be used. The Kipping method is particularly suitably used.

Because polysiloxane and derivatives thereof have very little hole transportability in their siloxane skeleton structure, preferable are compounds having a structure of the above low molecular weight hole-transporting materials on their side chain or main chain, and more preferable are compounds having a hole-transporting aromatic amine residue on their side chain or main chain.

Examples of the method for forming the hole transport layer may include a method using a mixed solution with a polymer binder when a low molecular weight compound is used and a method using a solution when a high molecular weight compound comprising the polymer compound according to the present embodiment is used.

The solvent for use in the method of formation using a solution is preferably a solvent that can dissolve or uniformly disperse the hole-transporting material. Examples of the solvent may include the solvents described in the heading "liquid composition."

Examples of the method of formation using a solution may include coating methods such as spin coating method, casting method, microgravure coating method, gravure coating method, bar coating method, roll coating method, wire-bar coating method, dip coating method, spray coating method, screen printing method, flexo printing method, offset printing method, inkjet printing method, capillary coating method, and nozzle coating method.

The optimum thickness of the hole transport layer varies by the material used and needs to be selected so as to give appropriate values of drive voltage and light-emitting efficiency; the thickness thereof is generally from 1 nm to 1 µm, preferably from 2 nm to 500 nm, and more preferably from 5 nm to 200 nm.

When the light-emitting layer according to the present embodiment comprises the electron transport layer, the electron transport layer generally comprises the electron-transporting material (high molecular weight compounds and low molecular weight compounds). The electron-transporting material may be any known material. Examples of the electron-transporting material may include oxadiazole derivatives, anthraquinodimethane and derivatives thereof, benzoquinone and derivatives thereof, naphtoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, and compounds disclosed in JP S63-70257 A, JP S63-175860 A, JP H02-135359 A, JP H02-135361 A, JP H02-209988 A, JP H03-37992 A, and JP H03-152184 A; preferably oxadiazole derivatives, benzoquinone and derivatives thereof, anthraquinone and derivatives thereof, metal complexes of 8-hydroxyquinoline and derivatives thereof, polyquinoline and derivatives thereof, polyquinoxaline and derivatives thereof, and polyfluorene and derivatives thereof; and more preferably 2-(4-biphenylyl)-5-(4-tert-butylphenyl)-1,3,4-oxadiazole, benzoquinone, anthraquinone, tris(8-quinolinol) aluminum, and polyquinoline.

Examples of the method for forming the electron transport layer may include when a low molecular weight compound is used, vacuum evaporation using a powdery material and a method of formation using a material in a solution or fused state, and when a high molecular weight compound is used, a method of formation using a material in a solution or fused state. The method of formation using a material in a solution or fused state may use any of the above polymer binders in combination.

The solvent for use in the film formation from a solution is preferably any solvent that dissolves or uniformly disperses the electron-transporting material and/or the polymer binder. Examples of the solvent may include the solvents described in the heading "liquid composition."

Examples of the method of formation using a material in a solution or fused state may include coating methods such as spin coating method, casting method, microgravure coating method, gravure coating method, bar coating method, roll coating method, wire-bar coating method, dip coating method, spray coating method, screen printing method, flexo printing method, offset printing method, inkjet printing method, capillary coating method, and nozzle coating method.

The optimum thickness of the electron transport layer varies by the material used and needs to be selected so as to give appropriate values of drive voltage and light-emitting efficiency; the thickness thereof is generally from 1 nm to 1 µm, preferably from 2 nm to 500 nm, and more preferably from 5 nm to 200 nm.

The hole injection layer and the electron injection layer have a function of improving charge injection efficiency from the electrodes in the charge transfer layers arranged adjacent to the electrodes and have the effect of reducing the drive voltage of the light-emitting device.

For the purpose of improving adhesion with the electrodes and improving charge injection from the electrodes, the charge injection layers or an insulating layer (generally having an average thickness of 0.5 nm to 4.0 nm, and the same applies to the following) may be arranged adjacent to the electrodes. For the purpose of improving adhesion between adjacent layers and preventing the materials of layers from mixing, a thin buffer layer may be disposed between the charge transport layers and the light-emitting layer.

The order and the number of the layers to be stacked and the thickness of the layers need to be adjusted considering light-emitting efficiency and device life.

In the present embodiment, examples of the light-emitting device having the charge injection layer (electron injection layer or hole injection layer) may include a light-emitting device that arranges the charge injection layer adjacent to the cathode and a light-emitting device that arranges the charge injection layer adjacent to the anode. Examples of the layered structure of such a light-emitting device may include the following from e) to p) structures:

e) Anode/charge injection layer/light-emitting layer/cathode
f) Anode/light-emitting layer/charge injection layer/cathode
g) Anode/charge injection layer/light-emitting layer/charge injection layer/cathode
h) Anode/charge injection layer/hole transport layer/light-emitting layer/cathode
i) Anode/hole transport layer/light-emitting layer/charge injection layer/cathode
j) Anode/charge injection layer/hole transport layer/light-emitting layer/charge injection layer/cathode
k) Anode/charge injection layer/light-emitting layer/electron transport layer/cathode
l) Anode/light-emitting layer/electron transport layer/charge injection layer/cathode
m) Anode/charge injection layer/light-emitting layer/electron transport layer/charge injection layer/cathode
n) Anode/charge injection layer/hole transport layer/light-emitting layer/electron transport layer/cathode
o) Anode/hole transport layer/light-emitting layer/electron transport layer/charge injection layer/cathode
p) Anode/charge injection layer/hole transport layer/light-emitting layer/electron transport layer/charge injection layer/cathode Also exemplified for each of these structures is a structure that arranges the hole transport layer adjacent to the light-emitting layer between the light-emitting layer and the anode.

The electron injection layer may be a layer comprising an conductive polymer, a layer that is arranged between the anode and the hole transport layer and comprises a material having ionization potential of a value intermediate between those of the anode material and the hole-transporting material comprised in the hole transport layer, and a layer that is placed between the cathode and the electron transport layer and comprises a material having electron affinity of a value intermediate between those of the cathode material and the electron-transporting material comprised in the electron transport layer.

When the charge injection layer comprises the conductive polymer, the electric conductivity of the conductive polymer is preferably from $1 \times 10^{-5}$ S/cm to $1 \times 10^{3}$ S/cm, and in order to reduce a leakage current of the light-emitting device, the electric conductivity is more preferably from $1 \times 10^{-5}$ S/cm to $1 \times 10^{2}$ S/cm, and further preferably from $1 \times 10^{-5}$ S/cm to $1 \times 10^{1}$ S/cm. Generally, in order to adjust the electric conductivity of the conductive polymer to be within such ranges, an appropriate amount of ions are doped into the conductive polymer.

The type of the ions to be doped is an anion for the hole injection layer and a cation for the electron injection layer. Examples of the anion may include a polystyrenesulfonic ion, an alkylbenzenesulfonic ion, and a camphor sulfonic ion. Examples of the cation may include a lithium ion, a sodium ion, a potassium ion, and a tetrabutylammonium ion.

The material for use in the charge injection layer needs to be selected in relation to the materials of the electrodes and adjacent layers. Examples of the material for use in the charge injection layer may include polyaniline and derivatives thereof, polythiophene and derivatives thereof, polypyrrole and derivatives thereof, polyphenylenevinylene and derivatives thereof, polythienylenevinylene and derivatives thereof, polyquinoline and derivatives thereof, polyquinoxaline and derivatives thereof, conductive polymers such as polymers having an aromatic amine residue on their main chain or side chain, metal phthalocyanine (such as copper phthalocyanine), and carbon.

Examples of the insulating layer may include metal fluorides, metal oxides, and organic insulating materials. Examples of the light-emitting device having the insulating layer may include a light-emitting device that arranges the insulating layer adjacent to the cathode and a light-emitting device that arranges the insulating layer adjacent to the anode.

Examples of the layered structure of such a light-emitting device may include the following from q) to ab) structures:
q) Anode/insulating layer/light-emitting layer/cathode
r) Anode/light-emitting layer/insulating layer/cathode
s) Anode/insulating layer/light-emitting layer/insulating layer/cathode
t) Anode/insulating layer/hole transport layer/light-emitting layer/cathode
u) Anode/hole transport layer/light-emitting layer/insulating layer/cathode
v) Anode/insulating layer/hole transport layer/light-emitting layer/insulating layer/cathode
w) Anode/insulating layer/light-emitting layer/electron transport layer/cathode
x) Anode/light-emitting layer/electron transport layer/insulating layer/cathode
y) Anode/insulating layer/light-emitting layer/electron transport layer/insulating layer/cathode
z) Anode/insulating layer/hole transport layer/light-emitting layer/electron transport layer/cathode
aa) Anode/hole transport layer/light-emitting layer/electron transport layer/insulating layer/cathode
ab) Anode/insulating layer/hole transport layer/light-emitting layer/electron transport layer/insulating layer/cathode Also exemplified for each of these structures is a structure that arranges the hole transport layer adjacent to the light-emitting layer between the light-emitting layer and the anode.

The substrate forming the light-emitting device according to the present embodiment needs to be any substrate that forms an electrode and does not chemically change when forming the organic layers; examples of the material of the substrate may include glass, plastic, polymer films, and silicon. For an opaque substrate, an electrode that is provided opposite the substrate is generally transparent or translucent.

At least either one of the anode and the cathode of the light-emitting device according to the present embodiment is generally transparent or translucent. It is preferable that the anode is transparent or translucent.

Examples of the material of the anode may include conductive metal oxide films and translucent metal films; specific examples thereof may include films formed by using an conductive compound such as indium oxide, zinc oxide, and tin oxide and indium tin oxide (ITO) and indium zinc oxide (IZO), which are composites of the above oxides and films formed of NESA, gold, platinum, silver, copper, or the like. Preferable are films formed of ITO, IZO, and tin oxide. Examples of the method of formation may include vacuum evaporation method, sputtering method, ion plating method, and plating method. The anode may be a transparent conductive film formed of an organic material such as polyaniline and derivatives thereof and polythiophene and derivatives thereof. The anode may have a layered structure comprising two or more layers.

The thickness of the anode can be selected considering light transmittance and electric conductivity. The thickness of the anode is, for example, from 10 nm to 10 µm, preferably from 20 nm to 1 µm, and more preferably from 30 nm to 500 nm.

To facilitate charge injection, a layer comprising phthalocyanine derivatives, conductive polymers, carbon, or the like and an insulating layer comprising metal oxides, metal fluorides, organic insulating materials, or the like may be provided adjacent to the anode.

The material of the cathode is preferably a material having a small work function; examples thereof may include metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; alloys of two or more types of the metals; alloys of one or more types of the metals and one or more types of gold, silver, platinum, copper, manganese, titanium, cobalt, nickel, tungsten, and tin; graphite and graphite intercalation compounds. Examples of the alloy may include magnesium-silver alloys, magnesium-indium alloys, magnesium-aluminum alloys, indium-silver alloys, lithium-aluminum alloys, lithium-magnesium alloys, lithium-indium alloys, and calcium-aluminum alloys. The cathode may have a layered structure comprising two or more layers.

The thickness of the cathode needs to be adjusted considering electric conductivity and durability and is generally from 10 nm to 10 µm, preferably from 20 nm to 1 µm, and more preferably from 50 nm to 500 nm.

Examples of the method for forming the cathode may include vacuum evaporation method, sputtering method, and laminating method that thermocompression-bonds a metal film. Between the cathode and the organic layer (that is, any layer comprising the polymer compound according to the present embodiment), may be provided a layer made of conductive polymer or a layer made of a metal oxide, a metal fluoride, an organic insulating material, or the like whose average thickness of 2 nm or less. After forming the cathode, a protective layer that protects the light-emitting device may be provided. To use the light-emitting device stably for a long term, the protective layer and/or a protective cover is preferably provided in order to protect the light-emitting device from an external environment.

The material of the protective layer may be high molecular weight compounds, metal oxides, metal fluorides, and metal borides. The protective cover may be metal plates, glass plates, and plastic plates whose surface is subjected to a low water permeability treatment. The protective cover is preferably bonded to the substrate on which the light-emitting device is provided with a thermosetting resin or a photocurable resin, thus sealing the light-emitting device. Space is maintained between the light-emitting device and the protective cover using a spacer, thus easily preventing the device from being damaged. If inert gas such as nitrogen gas and argon gas is enclosed in the space, oxidation of the cathode can be prevented. By placing a desiccating agent such as barium oxide within the space, damage to the light-emitting device caused by moisture adsorbed during the manufacturing process or a minute amount of moisture passing through the cured resin can be reduced. Preferably one or more of the above measures is taken.

FIG. 1 is a schematic sectional view of a light-emitting device (a light-emitting device having the (p) structure) according to a first embodiment of the present invention.

This light-emitting device 100 illustrated in FIG. 1 comprises a substrate 10, an anode 11, a hole injection layer 12, a hole transport layer 13, a light-emitting layer 14, an electron transport layer 15, an electron injection layer 16, and a cathode 17 formed on the substrate 10. The anode 11 is provided on the substrate 10 adjacent to the substrate 10. Stacked on the anode 11 opposite the substrate 10 are the hole injection layer 12, the hole transport layer 13, the light-emitting layer 14, the electron transport layer 15, the electron injection layer 16, and the cathode 17 in this order. The hole transport layer 13 comprises the polymer compound according to the present embodiment.

Figure 2:
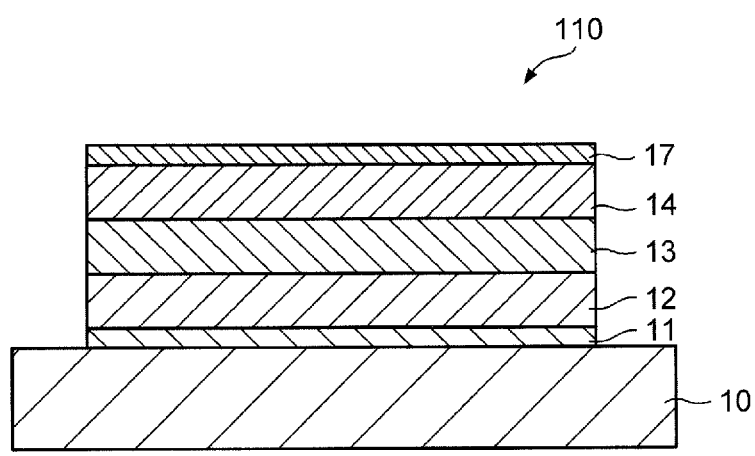
FIG. 2 is a schematic sectional view illustrating a light-emitting device according to a second embodiment of the present invention.

FIG. 2 is a schematic sectional view of a light-emitting device (a light-emitting device having the (h) structure) according to a second embodiment of the present invention. This light-emitting device 110 illustrated in FIG. 2 comprises the substrate 10, the anode 11, the hole injection layer 12, the hole transport layer 13, the light-emitting layer 14, and the cathode 17 formed on the substrate 10. The anode 11 is arranged on the substrate 10 adjacent to the substrate 10. Stacked on the anode 11 opposite the substrate 10 are the hole injection layer 12, the hole transport layer 13, the light-emitting layer 14, and the cathode 17 in this order. The hole transport layer 13 comprises the polymer compound according to the present embodiment.

The light-emitting device comprising the polymer compound according to the present embodiment can be suitably used for planar light sources (e.g., illumination) such as curved surface light sources and flat light sources; and display devices such as segment display devices, dot matrix display devices (e.g., a dot matrix flat display), and liquid crystal display devices (e.g., a backlight of a liquid crystal display device). The polymer compound according to the present embodiment is, in addition to being suitable for the materials for use in the manufacture of the above devices, also useful as dye materials for lasers, materials for organic solar cells, organic semiconductor materials for organic transistors, materials for conductive films, conductive film materials such as organic semiconductor films, light-emitting film materials that emit fluorescence, and materials for polymer field-effect transistors.

To obtain planar light emission using the light-emitting device according to the present embodiment, an anode and a cathode that are planar in shape need to be arranged so that they overlap each other. To obtain light emission with a certain pattern, there is a method in which a mask having a window with a certain pattern is placed on the surface of the planar light-emitting device or a method in which either one of the anode and the cathode or both of them are formed in a certain pattern shape. A pattern is formed by either of these methods, and some electrodes are arranged so as to be independently turned on and off, thus obtaining a segment display device that can display numbers, letters, simple symbols, or the like.

To obtain a dot matrix display device, both the anode and the cathode need to be formed in a stripe shape and arranged orthogonal to each other. A method in which a plurality of types of polymer compounds having different luminescent colors are applied or a method in which color filters or fluorescence conversion filter are used enables partials color display and multi-color display. The dot matrix display device can be passively driven or may be actively driven in combination with TFTs or the like. These display devices can be used as display devices of computers, TV sets, mobile terminals, mobile phones, car navigation systems, and viewfinders of video cameras.

Figure 3:
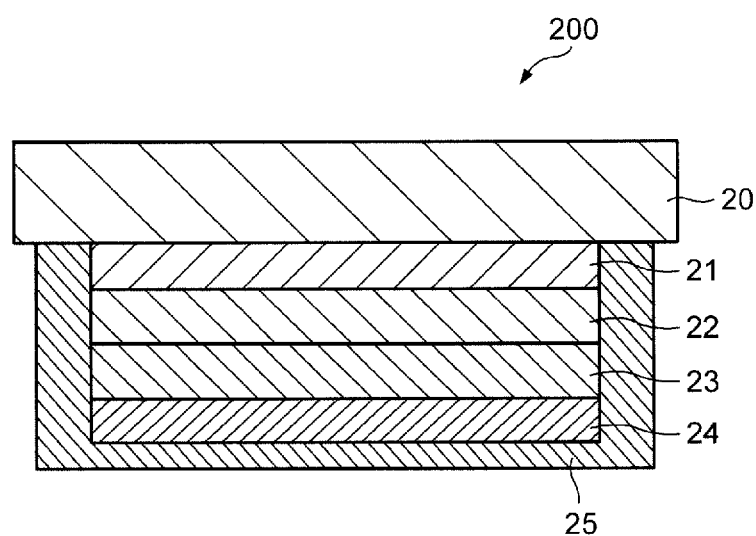
FIG. 3 is a schematic sectional view illustrating an embodiment of a planar light source according to the present invention.

FIG. 3 is a schematic sectional view illustrating an embodiment of a planar light source according to the present invention. The planar light source 200 illustrated in FIG. 3 comprises a substrate 20, an anode 21, a hole injection layer 22, a light-emitting layer 23, a cathode 24, and a protective layer 25. The anode 21 is arranged on the substrate 20 adjacent to the substrate 20. Stacked on the anode 21 opposite the substrate 20 are the hole injection layer 22, the light-emitting layer 23, and the cathode 24 in this order. The protective layer 25 is formed so as to cover all the anode 21, the hole injection layer 22, the light-emitting layer 23, and the cathode 24 formed on the substrate 20 and is in contact with the substrate 20 on its ends. The light-emitting layer 23 comprises the polymer compound according to the present embodiment.

In the planar light source 200 illustrated in FIG. 3, a plurality of types of light-emitting layers other than the light-emitting layer 23 whose luminescent colors are different from that of the light-emitting layer 23 are further arranged on the substrate 20. A red light-emitting material, a blue light-emitting material, and a green light-emitting material are comprised in the respective light-emitting layers, which are independently controlled to be driven, thus obtaining a color display device.

EXAMPLES

The following describes the present invention specifically with reference to examples. The present invention is not limited to the following examples.

In the following examples, a polystyrene-equivalent number average molecular weight and a polystyrene-equivalent weight average molecular weight of polymer compounds were determined using gel permeation chromatography (GPC) (manufactured by Shimadzu Corporation, product name: LC-10Avp).

The following describes measurement conditions related to an analysis method used in the examples.

Measurement Conditions

A polymer compound to be measured is dissolved in tetrahydrofuran so as to have a concentration of about 0.05% by weight, and 10 μL thereof was injected into the GPC. Tetrahydrofuran as a mobile phase of the GPC was passed through at a flow rate of 2.0 mL/min. PLgel MIXED-B (manufactured by Polymer Laboratories Ltd.) was used as a column. A differential refractive index detector (manufactured by Shimadzu Corporation, product name: RID-10A) was used as a detector.

NMR measurement was performed using NMR (manufactured by Varian Inc., product name: INOVA300) for a measurement sample in an amount of 5 mg to 20 mg dissolved in about 0.5 mL of an organic solvent.

C, H, N, elementary analysis was performed using Sumigraph NHC-22F (manufactured by Sumika Chemical Analysis Service) for a measurement sample in an amount of 3 mg to 5 mg collected and weighed by a microbalance.

LC-MS measurement was performed as follows. A measurement sample was dissolved in an appropriate organic solvent (chloroform, tetrahydrofuran, ethyl acetate, toluene, or the like) so as to have a concentration of 1 mg/mL to 10 mg/mL and was measured and analyzed using LC-MS (manufactured by Agilent Technologies, Inc., product name: 1100LCMSD). Ion exchanged water, acetonitrile, tetrahydrofuran, or a mixed solution thereof was used as the mobile phase of LC-MS, and acetic acid was added as needed. L-column 2 ODS (3 μm) (manufactured by Chemicals Evaluation and Research Institute, Japan, inner diameter: 4.6 mm; length: 250 mm; particle diameter: 3 μm) was used as the column.

Described next is the evaluation of hole transportability. The evaluation of hole transportability can be performed by manufacturing an evaluation device of the hole transportability (may be referred to as a hole-only device (HOD)) with the cathode material of the light-emitting device changed into a material having a large work function (e.g., gold, silver, or platinum) and measuring its voltage-current characteristics. This is because a current (hereinafter may be referred to as a "hole current") caused by holes can be measured, because the hole-transporting device to be evaluated inhibits electron injection from the cathode.

Examples of the structure of the hole-transporting device to be evaluated may include the following from HOD 1 to HOD 4. In the present examples, the evaluation of hole transportability was performed using the HOD 4 with gold used as the cathode material.

HOD 1) Anode/hole transport layer/cathode
HOD 2) Anode/light-emitting layer/cathode
HOD 3) Anode/hole transport layer/light-emitting layer/cathode
HOD 4) Anode/hole injection layer/hole transport layer/light-emitting layer/cathode Synthesis Example 1

Synthesis of Compound 2

Using a compound 1, a compound 2 was synthesized as follows.

A 500 ml four-necked flask was charged with the compound 1 (46.84 g) (which can be synthesized by a method described in WO 2004/049546, for example), bis(pinacolato)diboron (30.03 g), and potassium acetate (30.28 g), and then the gas within the flask was replaced with nitrogen gas. Thereto were added 1,4-dioxane (167 mL) and palladium chloride(diphenylphosphinoferrocene)dichloromethane adduct ($PdCl_2(dppf)CH_2Cl_2$) (2.52 g), and the mixture was stirred at 105° C. for 3 hours. The resultant solution was cooled to room temperature, hexane (330 mL) was then added thereto, and the solution was filtered with a funnel precoated with Celite. The filtrate was concentrated under reduced pressure. The resultant concentrate was dissolved in hexane, and then activated carbon was added thereto. The mixture was stirred for 1 hour while being heated at 40° C. The resultant mixture was cooled to room temperature and was filtered with a funnel precoated with Celite. The filtrate was concentrated under reduced pressure to obtain a solid, and the resultant solid was recrystallized with a mixed solvent of toluene and acetonitrile to obtain 39.7 g of the compound 2 as a white solid.

LC-MS (APCI, positive): $[M+H]^+$ 1006.

Example 1

Synthesis of Polymer Compound A

The synthesis of a polymer (a polymer compound A) having a constitutional unit represented by Formula (K-1) and a constitutional unit represented by Formula (K-2) with a molar ratio of 92.5:7.5 (a theoretical value based on the charged raw materials) was performed as follows.

[Chemical Formula 54]

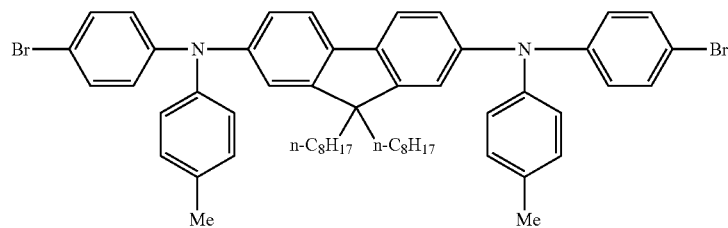
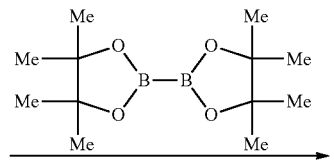

1

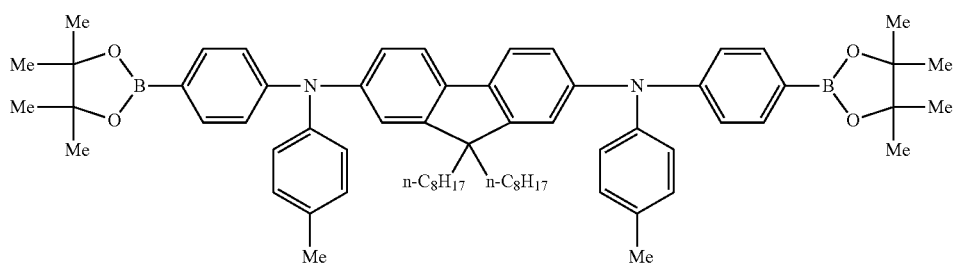

2

[Chemical Formula 55]

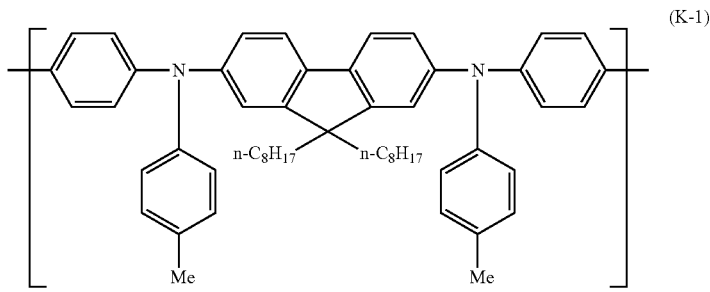
(K-1)

[Chemical Formula 56]

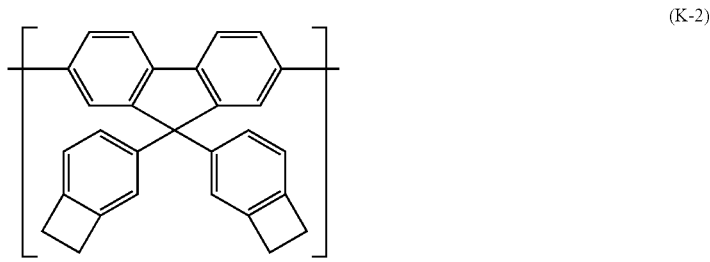
(K-2)

In an argon gas atmosphere, mixed were the compound 2 (2.010 g, 2.00 mmol) synthesized in Synthesis Example 1, the compound 1 (1.549 g, 1.70 mmol), a compound (0.158 g, 0.30 mmol) represented by Formula (M-2-BR), and toluene (40 mL), and the mixture was heated to 15° C.

[Chemical Formula 57]

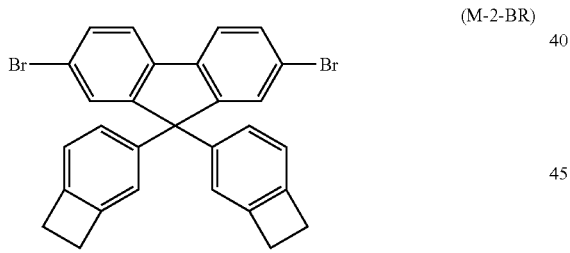
(M-2-BR)

After that, a 20% by weight aqueous solution of tetraethylammonium hydroxide (6.9 g) was added dropwise thereto, dichlorobis(tris(o-methoxyphenyl))phosphinepalladium (1.76 mg) was added thereto, and the mixture was refluxed for 3 hours. After the reaction, phenyl boronic acid (24.4 mg) and toluene (8 mL) were added thereto, and the mixture was refluxed for further 3 hours. An aqueous solution of sodium diethyldithiocarbamate was then added thereto, and the mixture was stirred at 80° C. for 2 hours. The resultant mixture was cooled, was charged with toluene, and was washed with water twice, with a 3% by weight aqueous acetic acid solution twice, and with water twice. The resultant solution was added dropwise to methanol and was filtered to obtain a precipitate. The precipitate was dissolved in toluene and was purified by passing it through an alumina column and a silica gel column in this order. The resultant solution was added dropwise to methanol and stirred, and the resultant precipitate was filtered and dried to obtain 2.2 g of the polymer compound A. A polystyrene-equivalent number average molecular weight of the polymer compound A was $0.31 \times 10^5$, whereas a polystyrene-equivalent weight average molecular weight thereof was $2.48 \times 10^5$. A C, H, N elementary analysis of the polymer compound A revealed that the C content, the H content, and the N content were 88.2% by weight, 8.23% by weight, and 3.58% by weight, respectively.

Example 2

Synthesis of Polymer Compound B

The synthesis of a polymer (a polymer compound B) having the constitutional unit represented by Formula (K-1) and a constitutional unit represented by Formula (K-3) with a molar ratio of 92.5:7.5 (a theoretical value based on the charged raw materials) was performed as follows.

[Chemical Formula 58]

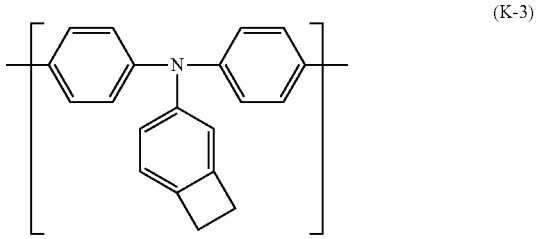
(K-3)

In an argon gas atmosphere, mixed were the compound 2 (2.010 g, 2.00 mmol) synthesized in Synthesis Example 1, the compound 1 (1.549 g, 1.70 mmol), a compound (0.129 g, 0.30 mmol) represented by Formula (M-3-BR), and toluene (40 mL), and the mixture was heated to 105° C.

[Chemical Formula 59]

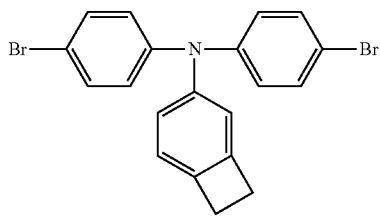

(M-3-BR)

After that, a 20% by weight aqueous solution of tetraethylammonium hydroxide (6.9 g) was added dropwise thereto, dichlorobis(tris(o-methoxyphenyl))phosphinepalladium (1.76 mg) was added thereto, and the mixture was refluxed for 3 hours. After the reaction, phenyl boronic acid (24.4 mg) and toluene (8 mL) were added thereto, and the mixture was refluxed for further 3 hours. An aqueous solution of sodium diethyldithiocarbamate was then added thereto, and the mixture was stirred at 80° C. for 2 hours. The resultant mixture was cooled, was charged with toluene, and was washed with water twice, with a 3% by weight aqueous acetic acid solution twice, and with water twice. The resultant solution was added dropwise to methanol and was filtered to obtain a precipitate. The precipitate was dissolved in toluene and was purified by passing it through an alumina column and a silica gel column in this order. The resultant solution was added dropwise to methanol and stirred, and the resultant precipitate was filtered and dried to obtain 2.2 g of the polymer compound B. A polystyrene-equivalent number average molecular weight of the polymer compound B was $0.11 \times 10^5$, whereas a polystyrene-equivalent weight average molecular weight thereof was $1.59 \times 10^5$.

Example 3

Synthesis of Polymer Compound C

The synthesis of a polymer (a polymer compound C) having the constitutional unit represented by Formula (K-1), the constitutional unit represented by Formula (K-2), and a constitutional unit represented by Formula (K-4) with a molar ratio of 90:5:5 (a theoretical value based on the charged raw materials) was performed as follows.

[Chemical Formula 60]

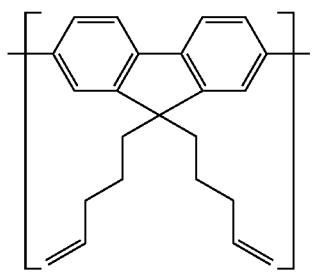

(K-4)

In an argon gas atmosphere, mixed were the compound 2 (2.010 g, 2.00 mmol) synthesized in Synthesis Example 1, the compound 1 (1.457 g, 1.60 mmol), the compound (0.106 g, 0.20 mmol) represented by Formula (M-2-BR), a compound (0.092 g, 0.20 mmol) represented by Formula (M-4-BR), and toluene (40 mL), and the mixture was heated to 105° C.

[Chemical Formula 61]

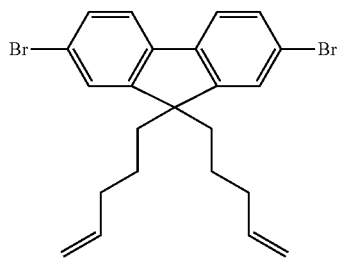

(M-4-BR)

After that, a 20% by weight aqueous solution of tetraethylammonium hydroxide (6.9 g) was added dropwise thereto, dichlorobis(tris(o-methoxyphenyl))phosphinepalladium (1.76 mg) was added thereto, and the mixture was refluxed for 3 hours. After the reaction, phenyl boronic acid (24.4 mg) and toluene (8 mL) were added thereto, and the mixture was refluxed for further 3 hours. An aqueous solution of sodium diethyldithiocarbamate was then added thereto, and the mixture was stirred at 80° C. for 2 hours. The resultant mixture was cooled, was charged with toluene, and was washed with water twice, with a 3% by weight aqueous acetic acid solution twice, and with water twice. The resultant solution was added dropwise to methanol and was filtered to obtain a precipitate. The precipitate was dissolved in toluene and was purified by passing it through an alumina column and a silica gel column in this order. The resultant solution was added dropwise to methanol and stirred, and the resultant precipitate was filtered and dried to obtain 2.0 g of the polymer compound C. A polystyrene-equivalent number average molecular weight of the polymer compound C was $0.33 \times 10^5$, whereas a polystyrene-equivalent weight average molecular weight thereof was $3.40 \times 10^5$.

Example 4

Synthesis of Polymer Compound D

The synthesis of a polymer (a polymer compound D) having the constitutional unit represented by Formula (K-1), a constitutional unit represented by Formula (K-5), and the constitutional unit represented by Formula (K-3) with a molar ratio of 50:42.5:7.5 (a theoretical value based on the charged raw materials) was performed as follows.

[Chemical Formula 62]

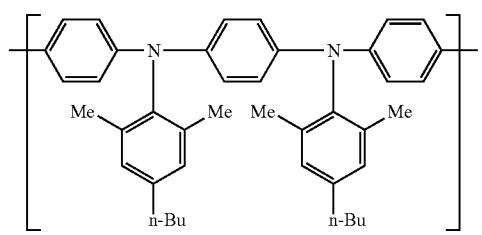

(K-5)

In an argon gas atmosphere, mixed were the compound 2 (2.010 g, 2.00 mmol) synthesized in Synthesis Example 1, a compound (1.256 g, 1.70 mmol) represented by Formula (M-5-BR), the compound (0.129 g, 0.30 mmol) represented by Formula (M-3-BR), and toluene (40 mL), and the mixture was heated to 105° C.

[Chemical Formula 63]

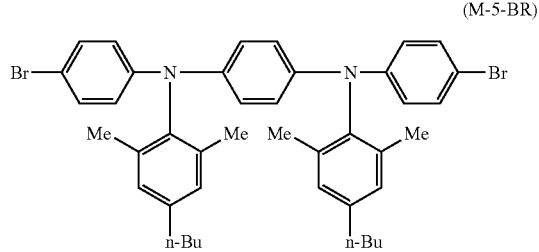

(M-5-BR)

After that, a 20% by weight aqueous solution of tetraethylammonium hydroxide (6.9 g) was added dropwise thereto, dichlorobis(tris(o-methoxyphenyl))phosphinepalladium (1.76 mg) was added thereto, and the mixture was refluxed for 3 hours. After the reaction, phenyl boronic acid (24.4 mg) and toluene (8 mL) were added thereto, and the mixture was refluxed for further 3 hours. An aqueous solution of sodium diethyldithiocarbamate was then added thereto, and the mixture was stirred at 80° C. for 2 hours. The resultant mixture was cooled, was charged with toluene, and was washed with water twice, with a 3% by weight aqueous acetic acid solution twice, and with water twice. The resultant solution was added dropwise to methanol and was filtered to obtain a precipitate. The precipitate was dissolved in toluene and was purified by passing it through an alumina column and a silica gel column in this order. The resultant solution was added dropwise to methanol and stirred, and the resultant precipitate was filtered and dried to obtain 2.0 g of the polymer compound D. A polystyrene-equivalent number average molecular weight of the polymer compound D was $0.15 \times 10^5$, whereas a polystyrene-equivalent weight average molecular weight thereof was $1.38 \times 10^5$.

Example 5

Preparation and Evaluation of Hole-Only Device 1 Using Polymer Compound A

A hole-only device 1 as an device that can pass only holes was prepared. A hole current amount of the electronic device comprising the compound according to the present invention, the composition comprising the compound, and the organic film comprising the same was evaluated.

(1-1: Formation of First Organic Layer)

A glass substrate having an ITO film as an anode thereon was cleaned with UV ozone. A first organic layer forming composition was applied onto the substrate by spin coating method to obtain an organic film with a thickness of 35 nm. As the first organic layer forming composition, Plexcore (AQ-1200) as an organic conductive material manufactured by Plextronics, Inc. was used.

The substrate having the organic film was heated at 170° C. for 15 minutes to dry the organic film and was then naturally cooled to room temperature to obtain a first organic layer.

(1-2: Formation of Second Organic Layer)

The polymer compound A as the polymer compound according to the present invention and xylene were mixed so as to give a ratio of the polymer compound A of 1.8% by weight to obtain a second organic layer forming composition.

The second organic layer forming composition was applied onto the first organic layer obtained in (1-1) to obtain an organic film with a thickness of 80 nm. The substrate having the organic film was heated at 180° C. for 60 minutes in a nitrogen gas atmosphere to insolubilize the organic film against organic solvents and was then naturally cooled to room temperature to obtain a second organic layer.

(1-3: Formation of Cathode)

A cathode as a gold layer with a thickness of 50 nm was formed by vacuum evaporation on the substrate having the anode, the first organic layer, and the second organic layer obtained in (1-2). The evaporation process of the gold was started when the degree of vacuum reached $1 \times 10^4$ (Pa) or less.

(1-4: Sealing)

The substrate having a layered structure comprising the substrate, the anode, the first organic layer, the second organic layer, and the cathode obtained in the processes up to (1-3) was taken out of the vacuum evaporation apparatus and was sealed with sealing glass and a two-liquid mixed epoxy resin (PX681C manufactured by Robnor Resins Ltd.) in a nitrogen gas atmosphere to obtain the hole-only device 1.

The first organic layer has a function of receiving holes from the anode and transporting them to the second organic layer with a voltage applied to the hole-only device 1, whereas the second organic layer has a function of receiving holes from the first organic layer and transporting them to the cathode with a voltage applied to the hole-only device 1.

(2: Evaluation)

Voltages of −1 V to +20 V were applied to the hole-only device 1 using a DC voltage/current generator, and a current density [mA/cm²] passing through the hole-only device 1 when the field intensity was 500 kV/cm was measured. The resulting current density was 95.4 mA/cm². The result is listed in Table 1. In this evaluation, when the field intensity of 500 kV/cm was applied to the hole-only device 1, light emission caused by current excitation was not observed, which revealed that an electronic current passing through the hole-only device 1 was infinitesimal with respect to the hole current.

Example 6

Manufacture and Evaluation of Hole-Only Device 2 Using Polymer Compound B

A hole-only device 2 was manufactured and evaluated in the same manner as Example 5 except that the polymer compound B was used as the compound constituting the second organic layer. The resulting current density passing through the hole-only device 2 when the field intensity was 500 kV/cm was 103.2 mA/cm². The result is listed in Table 1. In this evaluation, when the field intensity of 500 kV/cm was applied to the hole-only device 2, light emission caused by current excitation was not observed, which revealed that an electronic current passing through the hole-only device 2 was infinitesimal with respect to the hole current.

Example 7

Manufacture and Evaluation of Hole-Only Device 3 Using Polymer Compound C

A hole-only device 3 was manufactured and evaluated in the same manner as Example 5 except that the polymer compound C was used as the compound constituting the second organic layer. The resulting current density passing through the hole-only device 3 when the field intensity was 500 kV/cm was 165.5 mA/cm². The result is listed in Table 1. In this evaluation, when the field intensity of 500 kV/cm was applied to the hole-only device 3, light emission caused by current excitation was not observed, which revealed that an electronic current passing through the hole-only device 3 was infinitesimal with respect to the hole current.

Example 8

Manufacture and Evaluation of Hole-Only Device 4 Using Polymer Compound D

A hole-only device 4 was manufactured and evaluated in the same manner as Example 5 except that the polymer compound D was used as the compound constituting the second organic layer. The resulting current density passing through the hole-only device 4 when the field intensity was 500 kV/cm was 114.4 mA/cm$^2$. The result is listed in Table 1. In this evaluation, when the field intensity of 500 kV/cm was applied to the hole-only device 4, light emission caused by current excitation was not observed, which revealed that an electronic current passing through the hole-only device 4 was infinitesimal with respect to the hole current.

Example 9

Synthesis of Polymer Compound E

The synthesis of a polymer (a polymer compound E) having the constitutional unit represented by Formula (K-1), a constitutional unit represented by Formula (K-8), the constitutional unit represented by Formula (K-2), and the constitutional unit represented by Formula (K-4) with a molar ratio of 50:40:5:5 (a theoretical value based on the charged raw materials) was performed as follows.

[Chemical Formula 64]

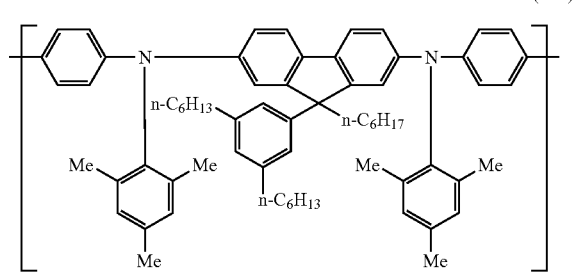

(K-8)

In an argon gas atmosphere, mixed were the compound 2 (2.044 g, 2.03 mmol) synthesized in Synthesis Example 1, a compound (1.766 g, 1.60 mmol) represented by Formula (M-8-BR), the compound (0.106 g, 0.20 mmol) represented by Formula (M-2-BR), the compound (0.092 g, 0.20 mmol) represented by Formula (M-4-BR), and toluene (36 mL), and the mixture was heated to 105° C.

[Chemical Formula 65]

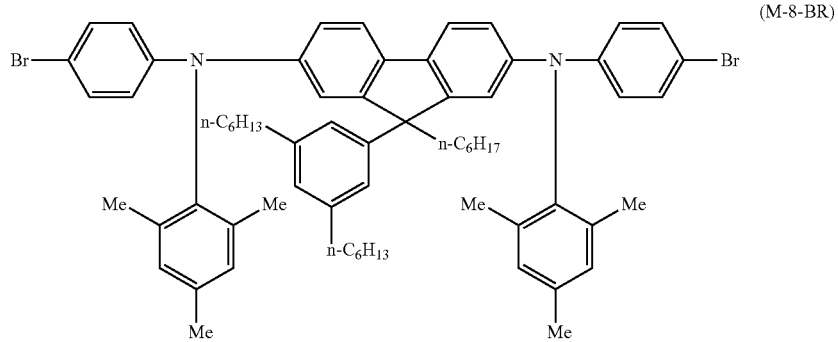

(M-8-BR)

After that, a 20% by weight aqueous solution of tetraethylammonium hydroxide (6.9 g) was added dropwise thereto, dichlorobis(tris(o-methoxyphenyl))phosphinepalladium (3.84 mg) was added thereto, and the mixture was refluxed for 3 hours. After the reaction, phenyl boronic acid (24.5 mg) and toluene (8 mL) were added thereto, and the mixture was refluxed for further 12 hours. An aqueous solution of sodium diethyldithiocarbamate was then added thereto, and the mixture was stirred at 80° C. for 2 hours. The resultant mixture was cooled, was charged with toluene, and was washed with water twice, with a 3% by weight aqueous acetic acid solution twice, and with water twice. The resultant solution was added dropwise to methanol and was filtered to obtain a precipitate.

The precipitate was dissolved in toluene and was purified by passing it through an alumina column and a silica gel column in this order. The resultant solution was added dropwise to methanol and stirred, and the resultant precipitate was filtered and dried to obtain 2.2 g of the polymer compound E. A polystyrene-equivalent number average molecular weight of the polymer compound E was 0.30×10$^5$, whereas a polystyrene-equivalent weight average molecular weight thereof was 1.99×10$^5$.

Example 10

Synthesis of Polymer Compound F

The synthesis of a polymer (a polymer compound F) having the constitutional unit represented by Formula (K-1), a constitutional unit represented by Formula (K-9), the constitutional unit represented by Formula (K-2), and the constitutional unit represented by Formula (K-4) with a molar ratio of 50:40:5:5 (a theoretical value based on the charged raw materials) was performed as follows.

[Chemical Formula 66]

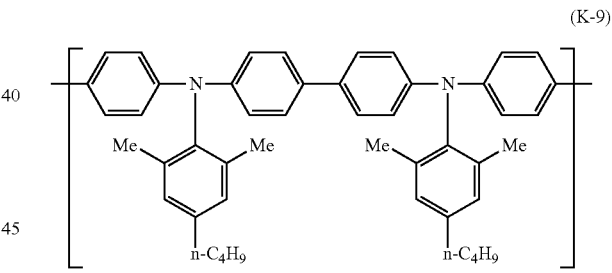

(K-9)

In an argon gas atmosphere, mixed were the compound 2 (2.060 g, 2.05 mmol) synthesized in Synthesis Example 1, a compound (1.304 g, 1.60 mmol) represented by Formula (M-9-BR), the compound (0.106 g, 0.20 mmol) represented by Formula (M-2-BR), the compound (0.092 g, 0.20 mmol) represented by Formula (M-4-BR), and toluene (43 mL), and the mixture was heated to 105° C.

[Chemical Formula 67]

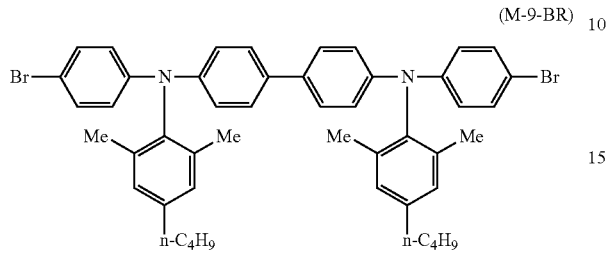

(M-9-BR)

After that, a 20% by weight aqueous solution of tetraethylammonium hydroxide (6.9 g) was added dropwise thereto, dichlorobis(tris(o-methoxyphenyl))phosphinepalladium (8.78 mg) was added thereto, and the mixture was refluxed for 3 hours. After the reaction, phenyl boronic acid (24.5 mg) and toluene (7 mL) were added thereto, and the mixture was refluxed for further 12 hours. An aqueous solution of sodium diethyldithiocarbamate was then added thereto, and the mixture was stirred at 80° C. for 2 hours. The resultant mixture was cooled, was charged with toluene, and was washed with water twice, with a 3% by weight aqueous acetic acid solution twice, and with water twice. The resultant solution was added dropwise to methanol and was filtered to obtain a precipitate.

The precipitate was dissolved in toluene and was purified by passing it through an alumina column and a silica gel column in this order. The resultant solution was added dropwise to methanol and stirred, and the resultant precipitate was filtered and dried to obtain 2.3 g of the polymer compound F. A polystyrene-equivalent number average molecular weight of the polymer compound F was $0.26 \times 10^5$, whereas a polystyrene-equivalent weight average molecular weight thereof was $2.16 \times 10^5$.

Example 11

Manufacture and Evaluation of Hole-Only Device 5 Using Polymer Compound F

A hole-only device 5 was manufactured and evaluated in the same manner as Example 5 except that the polymer compound F was used as the compound constituting the second organic layer. The resulting current density passing through the hole-only device 5 when the field intensity was 500 kV/cm was 73.8 mA/cm$^2$. The result is listed in Table 1. In this evaluation, when the field intensity of 500 kV/cm was applied to the hole-only device 5, light emission caused by current excitation was not observed, which revealed that an electronic current passing through the hole-only device 5 was infinitesimal with respect to the hole current.

Comparative Example 1

Synthesis of Polymer Compound AA

The synthesis of a polymer (a polymer compound AA) having the constitutional unit represented by Formula (K-1), the constitutional unit represented by Formula (K-2), and a constitutional unit represented by Formula (K-6) with a molar ratio of 42.5:7.5:50 (a theoretical value based on the charged raw materials) was performed as follows.

[Chemical Formula 68]

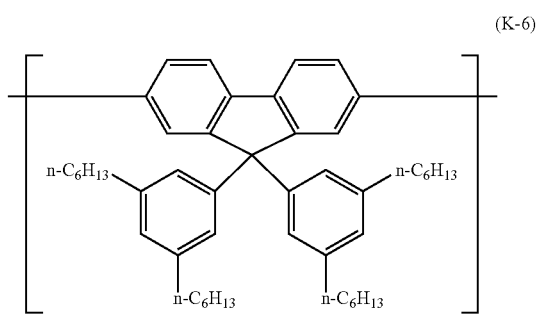

(K-6)

In an argon gas atmosphere, mixed were the compound 1 (1.549 g, 1.70 mmol), the compound (0.158 g, 0.30 mmol) represented by Formula (M-2-BR), a compound (1.814 g, 2.00 mmol) represented by Formula (M-6-E), and toluene (40 mL), and the mixture was heated to 105° C. After that, a 20% by weight aqueous solution of tetraethylammonium hydroxide (6.9 g) was added dropwise thereto, dichlorobis(tris(o-methoxyphenyl))phosphinepalladium (1.76 mg) was added thereto, and the mixture was refluxed for 3 hours.

[Chemical Formula 69]

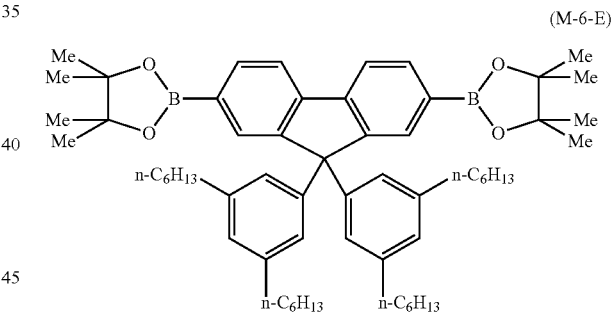

(M-6-E)

After the reaction, phenyl boronic acid (24.4 mg) and toluene (8 mL) were added thereto, and the mixture was refluxed for further 3 hours. An aqueous solution of sodium diethyldithiocarbamate was then added thereto, and the mixture was stirred at 80° C. for 2 hours. The resultant mixture was cooled, was charged with toluene, and was washed with water twice, with a 3% by weight aqueous acetic acid solution twice, and with water twice. The resultant solution was added dropwise to methanol and was filtered to obtain a precipitate.

The precipitate was dissolved in toluene and was purified by passing it through an alumina column and a silica gel column in this order. The resultant solution was added dropwise to methanol and stirred, and the resultant precipitate was filtered and dried to obtain 2.2 g of the polymer compound AA. A polystyrene-equivalent number average molecular weight of the polymer compound AA was $0.54 \times 10^5$, whereas a polystyrene-equivalent weight average molecular weight thereof was $3.11 \times 10^5$.

Comparative Example 2

Manufacture and Evaluation of Hole-Only Device 101 Using Polymer Compound AA A hole-only device 101 was manufactured and evaluated in the same manner as Example 5 except that the polymer compound AA was used as the compound constituting the second organic layer. The resulting current density passing through the hole-only device 101 when the field intensity was 500 kV/cm was 9.4 mA/cm$^2$. The result is listed in Table 1. In this evaluation, when the field intensity of 500 kV/cm was applied to the hole-only device 101, light emission caused by current excitation was not observed, which revealed that an electronic current passing through the hole-only device 101 was infinitesimal with respect to the hole current.

Comparative Example 3

Synthesis of Polymer Compound BB

The synthesis of a polymer (a polymer compound BB) having the constitutional unit represented by Formula (K-1), the constitutional unit represented by Formula (K-2), the constitutional unit represented by Formula (K-6), and a constitutional unit represented by Formula (K-7) with a molar ratio of 30:7.5:50:12.5 (a theoretical value based on the charged raw materials) was performed as follows.

[Chemical Formula 70]

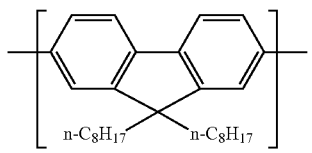

(K-7)

In an argon gas atmosphere, mixed were the compound 1 (1.093 g, 1.20 mmol), the compound (0.158 g, 0.30 mmol) represented by Formula (M-2-BR), the compound (1.814 g, 2.00 mmol) represented by Formula (M-6-E), a compound (0.274 g, 0.50 mmol) represented by Formula (M-7-BR), and toluene (40 mL), and the mixture was heated to 105° C.

[Chemical Formula 71]

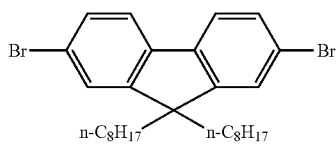

(M-7-Br)

After that, a 20% by weight aqueous solution of tetraethylammonium hydroxide (6.9 g) was added dropwise thereto, dichlorobis(tris(o-methoxyphenyl))phosphinepalladium (1.76 mg) was added thereto, and the mixture was refluxed for 3 hours. After the reaction, phenyl boronic acid (24.4 mg) and toluene (8 mL) were added thereto, and the mixture was refluxed for further 3 hours. An aqueous solution of sodium diethyldithiocarbamate was then added thereto, and the mixture was stirred at 80° C. for 2 hours. The resultant mixture was cooled, was charged with toluene, and was washed with water twice, with a 3% by weight aqueous acetic acid solution twice, and with water twice. The resultant solution was added dropwise to methanol and was filtered to obtain a precipitate.

The precipitate was dissolved in toluene and was purified by passing it through an alumina column and a silica gel column in this order. The resultant solution was added dropwise to methanol and stirred, and the resultant precipitate was filtered and dried to obtain 2.1 g of the polymer compound BB. A polystyrene-equivalent number average molecular weight of the polymer compound BB was 0.55×10$^5$, whereas a polystyrene-equivalent weight average molecular weight thereof was 2.63×10$^5$.

Comparative Example 4

Manufacture and Evaluation of Hole-Only Device 102 Using Polymer Compound BB A hole-only device 102 was manufactured and evaluated in the same manner as Example 5 except that the polymer compound BB was used as the compound constituting the second organic layer. The resulting current density passing through the hole-only device 102 when the field intensity was 500 kV/cm was 5.7 mA/cm$^2$. The result is listed in Table 1. In this evaluation, when the field intensity of 500 kV/cm was applied to the hole-only device 102, light emission caused by current excitation was not observed, which revealed that an electronic current passing through the hole-only device 102 was infinitesimal with respect to the hole current.

Comparative Example 5

Synthesis of Polymer Compound CC

The synthesis of a polymer (a polymer compound CC) having the constitutional unit represented by Formula (K-1), the constitutional unit represented by Formula (K-6), and the constitutional unit represented by Formula (K-3) with a molar ratio of 42.5:50:7.5 (a theoretical value based on the charged raw materials) was performed as follows.

In an argon gas atmosphere, mixed were the compound 1 (3.255 g, 3.57 mmol), the compound (3.813 g, 4.21 mmol) represented by Formula (M-6-E), the compound (0.271 g, 0.63 mmol) represented by Formula (M-3-BR), and toluene (55 mL), and the mixture was heated to 105° C. After that, a 20% by weight aqueous solution of tetraethylammonium hydroxide (13.8 g) was added dropwise thereto, palladium acetate (1.40 mg, 6.31 mmol) and tris(o-methoxyphenyl)phosphine (8.80 mg, 25.2 µmol) were added thereto, and the mixture was refluxed for 6 hours. After the reaction, phenyl boronic acid (51.3 mg) was added thereto, and the mixture was refluxed for further 12 hours. An aqueous solution of sodium diethyldithiocarbamate was then added thereto, and the mixture was stirred at 80° C. for 2 hours. The resultant mixture was cooled, was charged with toluene, and was washed with water twice, with a 3% by weight aqueous acetic acid solution twice, and with water twice. The resultant solution was added dropwise to methanol and was filtered to obtain a precipitate.

The precipitate was dissolved in toluene and was purified by passing it through an alumina column and a silica gel column in this order. The resultant solution was added dropwise to methanol and stirred, and the resultant precipitate was filtered and dried to obtain 4.8 g of the polymer compound CC. A polystyrene-equivalent number average molecular weight of the polymer compound CC was 2.82×10$^5$, whereas a polystyrene-equivalent weight average molecular weight thereof was 0.60×10$^5$.

Comparative Example 6

Synthesis of Polymer Compound DD

The synthesis of a polymer (a polymer compound DD) having the constitutional unit represented by Formula (K-1), the constitutional unit represented by Formula (K-6), the constitutional unit represented by Formula (K-2), and the constitutional unit represented by Formula (K-4) with a molar ratio of 50:40:5:5 (a theoretical value based on the charged raw materials) was performed as follows.

In an argon gas atmosphere, mixed were the compound 1 (4.099 g, 4.50 mmol), the compound (3.224 g, 3.56 mmol) represented by Formula (M-6-E), a compound (0.280 g, 0.45 mmol) represented by Formula (M-2-E), a compound (0.250 g, 0.45 mmol) represented by Formula (M-4-E), and toluene (120 mL), and the mixture was heated to 105° C.

[Chemical Formula 72]

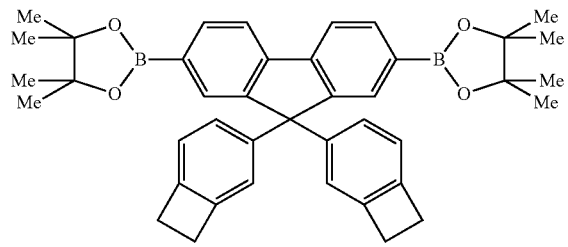

(M-2-E)

[Chemical Formula 73]

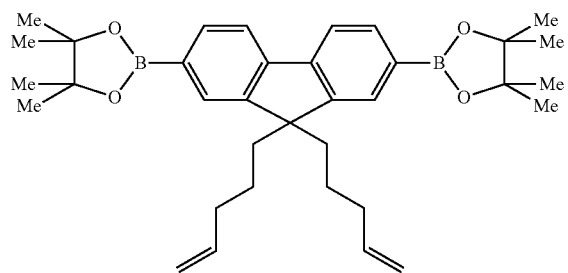

(M-4-E)

After that, a 20% by weight aqueous solution of tetraethylammonium hydroxide (15 g) was added dropwise thereto, dichlorobis(tris(o-methoxyphenyl))phosphinepalladium (4.0 mg) was added thereto, and the mixture was refluxed for 4 hours. After the reaction, phenyl boronic acid (55.0 mg) was added thereto, and the mixture was refluxed for further 12 hours. An aqueous solution of sodium diethyldithiocarbamate was then added thereto, and the mixture was stirred at 80° C. for 2 hours. The resultant mixture was cooled, was charged with toluene, and was washed with water twice, with a 3% by weight aqueous acetic acid solution twice, and with water twice. The resultant solution was added dropwise to methanol and was filtered to obtain a precipitate.

The precipitate was dissolved in toluene and was purified by passing it through an alumina column and a silica gel column in this order. The resultant solution was added dropwise to methanol and stirred, and the resultant precipitate was filtered and dried to obtain 4.9 g of the polymer compound DD. A polystyrene-equivalent number average molecular weight of the polymer compound DD was $0.40 \times 10^5$, whereas a polystyrene-equivalent weight average molecular weight thereof was $1.45 \times 10^5$.

Comparative Example 7

Synthesis of Polymer Compound EE

The synthesis of a polymer (a polymer compound EE) having a constitutional unit represented by Formula (K-10), the constitutional unit represented by Formula (K-7), and the constitutional unit represented by Formula (K-2) with a molar ratio of 50:25:25 (a theoretical value based on the charged raw materials) was performed as follows.

[Chemical Formula 74]

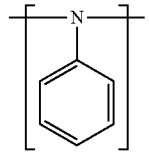

(K-10)

Charged were tris(dibenzylideneaetone)dipalladium complex (0.073 g, 0.08 mmol), tri-tert-butylphosphine tetrafluoro borate (0.093 g, 0.32 mmol), tert-butoxy sodium (1.54 g, 16.0 mmol), the compound (1.14 g, 2.0 mmol) represented by Formula (M-7-BR), and the compound (1.06 g, 2.00 mmol) represented by Formula (M-2-BR), and then in the system was sufficiently replaced with nitrogen gas, and then aniline (0.38 g, 4.00 mmol) and toluene (45 mL) were added thereto, and the mixture was heated to 105° C. and stirred for 8 hours. The reaction liquid was left to be cooled and was added dropwise to an aqueous ethanol solution (ethanol 250 mL+water 40 mL), filtered, and dried to obtain a precipitate.

Charged were the resultant precipitate, tris(dibenzylideneaetone)dipalladium complex (0.038 g, 0.04 mmol), tri-tert-butylphosphine tetrafluoro borate (0.047 g, 0.16 mmol), and tert-butoxy sodium (0.61 g, 6.40 mmol), and then in the system was sufficiently replaced with nitrogen gas. A toluene solution (11 mL) of N,N-diphenylamine (0.68 g, 4.00 mmol) and a toluene solution (33 mL) of bromobenzene (0.13 g, 0.80 mmol) were added thereto, and the mixture was heated to 105° C. and stirred for 6 hours. The reaction liquid was left to be cooled, added dropwise to an aqueous ethanol solution (ethanol 240 mL+water 40 mL), filtered, and dried to obtain a precipitate.

The resultant precipitate was dissolved in toluene and was reprecipitated in acetone, and then the precipitated polymer was filtered. The resultant polymer was dissolved in toluene, washed with dilute hydrochloric acid, and reprecipitated with ammonia-containing ethanol, and then the polymer was filtered. The filtered polymer was dissolved in toluene and was purified twice by silica gel chromatography, and then the solution was added dropwise to an aqueous ethanol solution, filtered, and dried to obtain 0.85 g of the polymer compound EE. A polystyrene-equivalent number average molecular weight of the polymer compound EE was $0.16 \times 10^5$, whereas a polystyrene-equivalent weight average molecular weight thereof was $0.39 \times 10^5$.

Comparative Example 8

Manufacture and Evaluation of Hole-Only Device 103 Using Polymer Compound CC A hole-only device 103 was manufactured and evaluated in the same manner as Example 5 except that the polymer compound CC was used as the compound constituting the second organic layer. The resulting current density passing through the hole-only device 103 when the field intensity was 500 kV/cm was 2.0 mA/cm². The result is listed in Table 1. In this evaluation, when the field intensity of 500 kV/cm was applied to the hole-only device 103, light emission caused by current excitation was not observed, which revealed that an electronic current passing through the hole-only device 103 was infinitesimal with respect to the hole current.

Comparative Example 9

Manufacture and Evaluation of Hole-Only Device 104 Using Polymer Compound DD

A hole-only device 104 was manufactured and evaluated in the same manner as Example 5 except that the polymer compound DD was used as the compound constituting the second organic layer. The resulting current density passing through the hole-only device 104 when the field intensity was 500 kV/cm was 38.1 mA/cm². The result is listed in Table 1. In this evaluation, when the field intensity of 500 kV/cm was applied to the hole-only device 104, light emission caused by current excitation was not observed, which revealed that an electronic current passing through the hole-only device 104 was infinitesimal with respect to the hole current.

Comparative Example 10

Manufacture and Evaluation of Hole-Only Device 105 Using Polymer Compound EE

A hole-only device 105 was manufactured and evaluated in the same manner as Example 5 except that the polymer compound EE was used as the compound constituting the second organic layer. The resulting current density passing through the hole-only device 105 when the field intensity was 500 kV/cm was 5.0 mA/cm². The result is listed in Table 1. In this evaluation, when the field intensity of 500 kV/cm was applied to the hole-only device 105, light emission caused by current excitation was not observed, which revealed that an electronic current passing through the hole-only device 105 was infinitesimal with respect to the hole current.

TABLE 1

| | Device | Polymer compound | Current density at a field intensity of 500 kV/cm [mA/cm²] |
|---|---|---|---|
| Example 5 | Hole-only device 1 | A | 95.4 |
| Example 6 | Hole-only device 2 | B | 103.2 |
| Example 7 | Hole-only device 3 | C | 165.5 |
| Example 8 | Hole-only device 4 | D | 114.4 |
| Example 11 | Hole-only device 5 | F | 73.8 |
| Comparative Example 2 | Hole-only device 101 | AA | 9.4 |
| Comparative Example 4 | Hole-only device 102 | BB | 5.7 |
| Comparative Example 8 | Hole-only device 103 | CC | 2.0 |
| Comparative Example 9 | Hole-only device 104 | DD | 38.1 |
| Comparative Example 10 | Hole-only device 105 | EE | 5.0 |

EXPLANATIONS OF LETTERS OR NUMERALS

10 Substrate
11 Anode
12 Hole injection layer
13 Hole transport layer
14 Light-emitting layer
15 Electron transport layer
16 Electron injection layer
17 Cathode
20 Substrate
21 Anode
22 Hole injection layer
23 Light-emitting layer
24 Cathode
25 Protective layer
100, 110 Light-emitting device
200 Planar light source

The invention claimed is:

1. A polymer compound comprising:
a structural unit represented by Formula (1) in an amount of 51% by mol or more with respect to the total amount of all structural units; and
a structural unit represented by Formula (2):

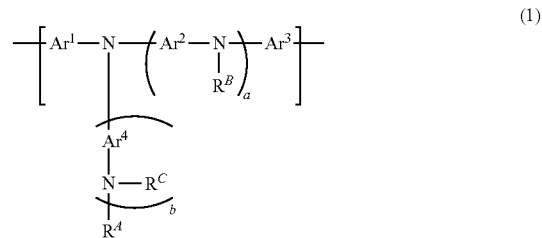

wherein in Formula (1),
a represents an integer of from 1 to 3, b represents 0 or 1,
$Ar^1$ and $Ar^3$ each independently represents an arylene group optionally having a substituent or a divalent heterocyclic group optionally having a substituent; $Ar^2$ and $Ar^4$ each independently represents an arylene group optionally having a substituent, a divalent heterocyclic group optionally having a substituent, or a divalent group made by linking two or more groups that are selected from the group consisting of an arylene group optionally having a substituent and a divalent heterocyclic group optionally having a substituent and may be the same as or different from each other; each of $Ar^1$, $Ar^2$, $Ar^3$, and $Ar^4$ may be linked to another group bonding to a nitrogen atom to which the $Ar^1$, $Ar^2$, $Ar^3$, and $Ar^4$ is bonded, thereby forming a ring structure; when $Ar^2$ is plurally present, they may be the same as or different from each other, and
$R^A$, $R^B$, and $R^C$ each independently represents a hydrogen atom, an alkyl group optionally having a substituent, an aryl group optionally having a substituent, or a monovalent heterocyclic group optionally having a substituent; when $R^B$ is plurally present, they may be the same as or different from each other,

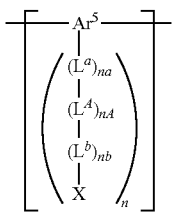

(2)

wherein in Formula (2),
na represents an integer of from 0 to 3, nb represents an integer of from 0 to 12, nA represents 0 or 1, n represents an integer of from 1 to 4,
$Ar^5$ represents a (2+n)-valent aromatic hydrocarbon group optionally having a substituent or a (2+n)-valent heterocyclic group optionally having a substituent,
$L^a$ and $L^b$ each independently represents an alkylene group, or a phenylene group optionally having a substituent; when $L^a$ is plurally present, they may be the same as or different from each other, when $L^b$ is plurally present, they may be the same as or different from each other,
$L^A$ represents an oxygen atom or a sulfur atom; when $L^A$ is plurally present, they may be the same as or different from each other, and
X represents a monovalent crosslinking group; when X is plurally present, they may be the same as or different from each other,
wherein the polymer compound comprises a plurality of monovalent crosslinking groups represented by X, the monovalent crosslinking groups comprising at least one monovalent crosslinking group represented by Formula (X-1) and at least one monovalent crosslinking group represented by Formula (X-2):

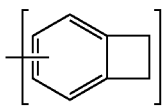

(X-1)

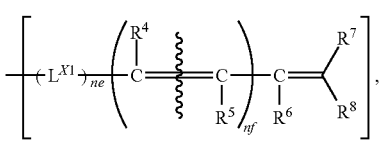

(X-2)

wherein in Formula (X-2)
ne and nf each independently represents 0 or 1,
$L^{x1}$ represents an oxygen atom, a sulfur atom, a carbonyl group, or a group represented by —O—CO—, and
$R^4$, $R^5$, $R^6$, $R^7$, and $R^8$ each independently represents a hydrogen atom, an alkyl group optionally having a substituent, an alkoxy group optionally having a substituent, an alkylthio group optionally having a substituent, an aryl group optionally having a substituent, an aryloxy group optionally having a substituent, an arylthio group optionally having a substituent, a monovalent heterocyclic group optionally having a substituent, an amino group optionally having a substituent, a silyl group optionally having a substituent, an acyl group optionally having a substituent, an acyloxy group optionally having a substituent, a halogen atom, a cyano group, or a nitro group.

2. The polymer compound according to claim 1, wherein the structural unit represented by Formula (2) is a structural unit represented by Formula (4):

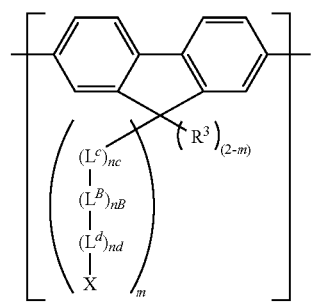

(4)

wherein in Formula (4)
nc represents an integer of from 0 to 3, nd represents an integer of from 0 to 12, nB represents 0 or 1, m represents 1 or 2,
$L^c$ and $L^d$ each independently represents an alkylene group optionally having a substituent, or a phenylene group optionally having a substituent; when $L^c$ is plurally present, they may be the same as or different from each other; when $L^d$ is plurally present, they may be the same as or different from each other,
$L^B$ represents an oxygen atom or a sulfur atom; when $L^B$ is plurally present, they may be the same as or different from each other,
X represents a monovalent crosslinking group; when X is plurally present, they may be the same as or different from each other, and
$R^3$ represents a hydrogen atom, an alkyl group optionally having a substituent, an alkoxy group optionally having a substituent, an aryl group optionally having a substituent, an aryloxy group optionally having a substituent, a monovalent heterocyclic group optionally having a substituent, or a monovalent heterocyclic oxy group; when $R^3$ is plurally present, they may be the same as or different from each other.

3. The polymer compound according to claim 1, wherein X is a monovalent crosslinking group optionally having a substituent represented by Formula (X-1)

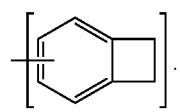

(X-1)

4. The polymer compound according to claim 1, wherein $Ar^2$ represents a 2,7-fluorenediyl group optionally having a substituent, a naphthalenediyl group optionally having a substituent, a phenanthrenediyl group optionally having a substituent, a dihydrophenanthrenediyl group optionally having a substituent, an anthracenediyl group optionally having a substituent, a pyrenediyl group optionally having a substituent, or a perylenediyl group optionally having a substituent.

5. A method for producing the polymer compound according to claim 1, the method comprising:
performing a polymerization reaction of a monomer composition comprising a first monomer represented by Formula (5) and a second monomer represented by Formula (6), thereby obtaining the polymer compound:

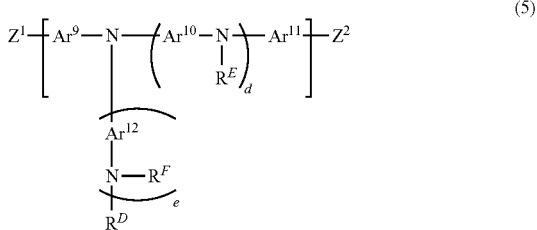

(5)

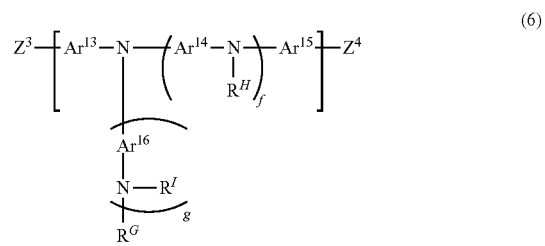

(6)

wherein in Formula (5),
d represents an integer of 1 to 3, e represents 0 or 1,
$Ar^9$ and $Ar^{11}$ each independently represents an arylene group optionally having a substituent or a divalent heterocyclic group optionally having a substituent, $Ar^{10}$ and $Ar^{12}$ each independently represents an arylene group optionally having a substituent, a divalent heterocyclic group optionally having a substituent, or a divalent group made by linking two or more groups that are selected from the group consisting of arylene groups optionally having a substituent and divalent heterocyclic groups optionally having a substituent and may be the same as or different from each other; each of $Ar^9$, $Ar^{10}$, $Ar^{11}$, and $Ar^{12}$ may be linked to another group bonding to a nitrogen atom to which the $Ar^9$, $Ar^{10}$, $Ar^{11}$, and $Ar^{12}$ is bonded, thereby forming a ring structure; when $Ar^{10}$ is plurally present, they may be the same as or different from each other,
$R^D$, $R^E$, and $R^F$ each independently represents a hydrogen atom, an alkyl group optionally having a substituent, an aryl group optionally having a substituent, or a monovalent heterocyclic group optionally having a substituent; when R' is a plurally present, they may be the same as or different from each other, and
$Z^1$ and $Z^2$ each independently represents a group selected from a substituent group A,
wherein the substituent group A is selected from the group consisting of:
a group represented by —B(OR$^{101}$)$_2$, wherein $R^{101}$ represents a hydrogen atom or an alkyl group optionally having a substituent, $R^{101}$ may form a ring by bonding to each other together with an oxygen atom bonded to $R^{101}$, and a plurality of $R^{101}$ may be the same as or different from each other,
a group represented by —BF$_4$Q$^1$ wherein $Q^1$ represents a monovalent cation selected from the group consisting of Li$^+$, Na$^+$, K$^+$, Rb$^+$, and Cs$^+$,
a group represented by —MgY$^1$ wherein $Y^1$ represents a chlorine atom, a bromine atom, or an iodine atom,
a group represented by —ZnY$^2$ wherein $Y^2$ represents a chlorine atom, a bromine atom, or an iodine atom, and
a group represented by —Sn(R$^{122}$)$_3$ wherein $R^{102}$ represents a hydrogen atom or an alkyl group, $R^{102}$ may form a ring by bonding to each other together with a tin atom bonded to $R^{102}$, a plurality of $R^{102}$ may be the same as or different from each other, wherein in Formula (6)
f represents an integer of from 0 to 3, g represents 0 or 1,
$Ar^{13}$ and $Ar^{15}$ each independently represents an arylene group optionally having a substituent or a divalent heterocyclic group optionally having a substituent, $Ar^{14}$ and $Ar^{16}$ each independently represents an arylene group optionally having a substituent, a divalent heterocyclic group optionally having a substituent, or
a divalent group made by linking two or more groups that are selected from the group consisting of arylene groups optionally having a substituent and divalent heterocyclic groups optionally having a substituent and may be the same as or different from each other; each of $Ar^{13}$, $Ar^{14}$, $Ar^{15}$, and $Ar^{16}$ may be linked to another group bonding to a nitrogen atom to which the $Ar^{13}$, $Ar^{14}$, $Ar^{15}$, and $Ar^{16}$ is bonded, thereby forming a ring structure; when $Ar^{14}$ is plurally present, they may be the same as or different from each other,
$R^G$, $R^H$, and $R^I$ each independently represents a hydrogen atom, an alkyl group optionally having a substituent, an aryl group optionally having a substituent, or an monovalent heterocyclic group optionally having a substituent; when $R^H$ is a plurally present, they may be the same as or different from each other, and
$Z^3$ and $Z^4$ each independently represent a group selected from a substituent group B,
wherein the substituent group B is selected from the group consisting of:
a chlorine atom, a bromine atom, an iodine atom, and a group represented by —O—S(=O)$_2$R$^{103}$ wherein $R^{103}$ represents an alkyl group optionally having a substituent or an aryl group optionally having a substituent.

6. A composition comprising:
the polymer compound according to claim 1, and
at least one type of material selected from the group consisting of a hole transport material, an electron transport material and a light-emitting material.

7. A composition comprising the polymer compound according to claim 1, and a solvent.

8. The composition according to claim 6, further comprising a solvent.

9. An organic film comprising the polymer compound according to claim 1.

10. An organic film comprising the composition according to claim 6.

11. An insolubilized organic film, wherein the organic thin film according to claim 9 is insolubilized against an organic solvent.

12. An insolubilized organic film, wherein the organic thin film according to claim 10 is insolubilized against an organic solvent.

13. A light-emitting element comprising the organic film according to claim 9.

14. A light-emitting element comprising the insolubilized organic film according to claim 11.

15. A planar light source comprising the light-emitting element according to claim 13.

16. A display device comprising the light-emitting element according to claim 13.

17. The polymer compound according to claim 1, wherein the polymer compound comprises at least two structural units represented by Formula (2), and the at least two structural units comprise:
- at least one structural unit represented by Formula (2), wherein the monovalent crosslinking group represented by X comprises at least one monovalent crosslinking group represented by Formula (X-1); and
- at least one structural unit represented by Formula (2), wherein the monovalent crosslinking group represented by X comprises at least one monovalent crosslinking group represented by Formula (X-2).

\* \* \* \* \*